United States Patent
Kim et al.

(10) Patent No.: US 9,525,141 B2
(45) Date of Patent: Dec. 20, 2016

(54) ORGANIC LIGHT EMITTING DEVICE

(71) Applicant: SAMSUNG DISPLAY CO., LTD., Yongin, Gyeonggi-Do (KR)

(72) Inventors: Dong-Hyun Kim, Yongin (KR); Mi-Kyung Kim, Yongin (KR); Se-Hun Kim, Yongin (KR); Hwan-Hee Cho, Yongin (KR); Chang-Woong Chu, Yongin (KR); Kwan-Hee Lee, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/327,106

(22) Filed: Jul. 9, 2014

(65) Prior Publication Data
US 2015/0060796 A1   Mar. 5, 2015

(30) Foreign Application Priority Data
Aug. 27, 2013   (KR) .................. 10-2013-0102023

(51) Int. Cl.
H01L 51/00    (2006.01)
H01L 51/50    (2006.01)

(52) U.S. Cl.
CPC ......... H01L 51/006 (2013.01); H01L 51/0061 (2013.01); H01L 51/0072 (2013.01);
(Continued)

(58) Field of Classification Search
None
See application file for complete search history.

(56) References Cited

U.S. PATENT DOCUMENTS

2009/0160323 A1   6/2009 Nomura et al.
2010/0219404 A1   9/2010 Endo et al.
(Continued)

FOREIGN PATENT DOCUMENTS

KR   10-2010-0070350 A   6/2010
KR   10-2010-0099250 A   9/2010
(Continued)

Primary Examiner — Erik Kielin
(74) Attorney, Agent, or Firm — Lee & Morse, P.C.

(57) ABSTRACT

Provided is an organic light-emitting device, including a first electrode; a second electrode facing the first electrode; an emission layer (EML) disposed between the first electrode and the second electrode; a hole transporting region between the first electrode and the EML; and an electron transporting region between the EML and the second electrode. The hole transporting region includes an amine-based compound represented by one of Formulae 1A and 1C:

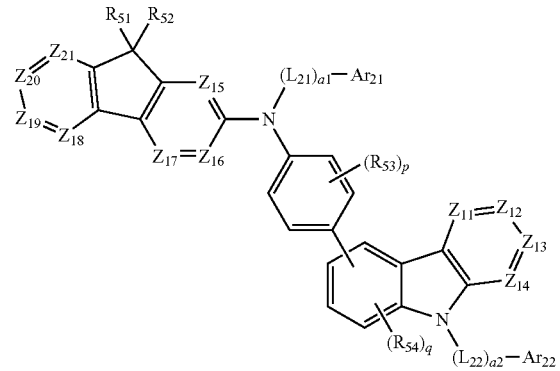

<Formula 1A>

(Continued)

-continued

<Formula 1C>

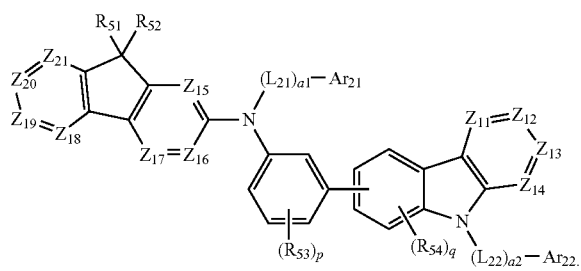

<Formula 10D>

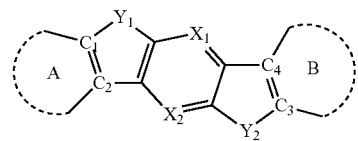

<Formula 10E>

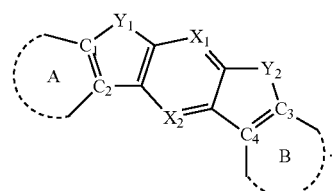

The EML includes an organic metal complex and a compound represented by one of Formulae formula 2, 10A, 10B, 10C, 10D, and 10E:

<Formula 2>

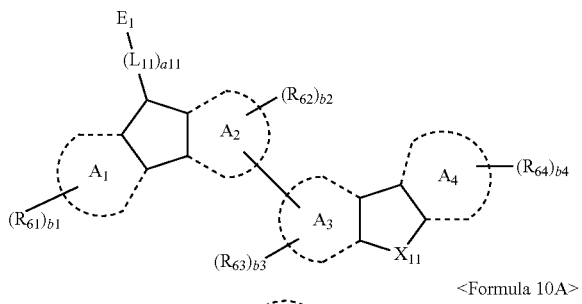

20 Claims, 1 Drawing Sheet

<Formula 10A>

(52) U.S. Cl.
CPC ...... *H01L 51/0073* (2013.01); *H01L 51/0085* (2013.01); *H01L 51/0087* (2013.01); *H01L 51/5056* (2013.01); *H01L 51/5072* (2013.01)

(56) References Cited

U.S. PATENT DOCUMENTS

| 2012/0043531 | A1* | 2/2012 | Jung | H01L 51/006 257/40 |
|---|---|---|---|---|
| 2012/0080670 | A1* | 4/2012 | Park | C07D 209/82 257/40 |
| 2012/0235123 | A1 | 9/2012 | Lee et al. | |
| 2014/0183466 | A1 | 7/2014 | Lee et al. | |
| 2014/0183495 | A1 | 7/2014 | Lee et al. | |
| 2014/0299856 | A1* | 10/2014 | Kitamura et al. | 257/40 |

FOREIGN PATENT DOCUMENTS

| KR | 10-2011-0015836 A | 2/2011 |
|---|---|---|
| KR | 10-2012-0030009 A | 3/2012 |
| KR | 10-2014-0085110 A | 7/2014 |
| KR | 10-2014-0085111 A | 7/2014 |
| WO | WO 2011/019156 A1 * | 2/2011 |
| WO | WO-2012/036482 A1 | 3/2012 |
| WO | WO 2013/047601 A1 * | 4/2013 |

* cited by examiner

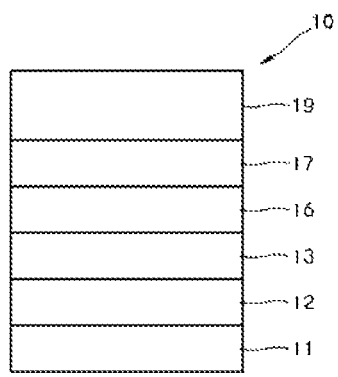

ORGANIC LIGHT EMITTING DEVICE

CROSS-REFERENCE TO RELATED APPLICATION

Korean Patent Application No. 10-2013-0102023, filed Aug. 27, 2013, in the Korean Intellectual Property Office, and entitled: "Organic Light Emitting Device," is incorporated by reference herein in its entirety.

BACKGROUND

1. Field

Embodiments relate to an organic light-emitting device.

2. Description of the Related Art

Organic light-emitting devices are self-emitting devices that may have a wide viewing angle, excellent contrast, quick response, high brightness, and excellent driving voltage, and can provide multicolored images.

SUMMARY

Embodiments may be realized by providing an organic light-emitting device, including a first electrode; a second electrode facing the first electrode; an emission layer (EML) disposed between the first electrode and the second electrode; a hole transporting region between the first electrode and the EML; and an electron transporting region between the EML and the second electrode. The hole transporting region includes an amine-based compound represented by one of Formulae 1A and 1C:

<Formula 1A>

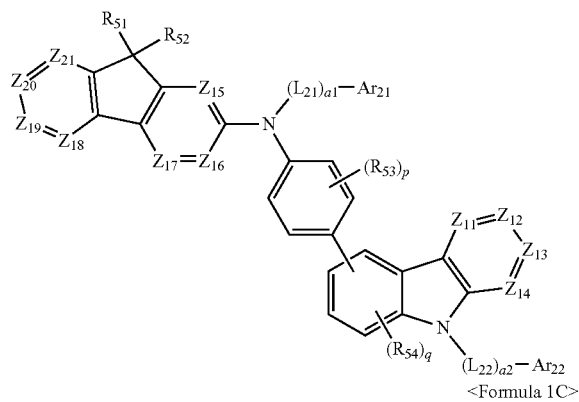

<Formula 1C>

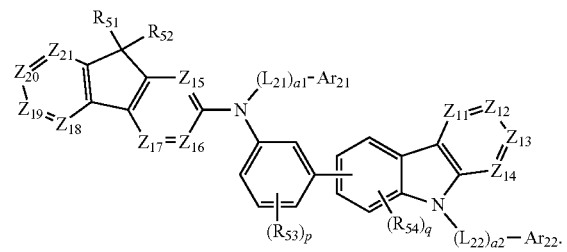

The EML includes an organic metal complex and a compound represented by one of Formulae Formula 2, 10A, 10B, 10C, 10D, and 10E:

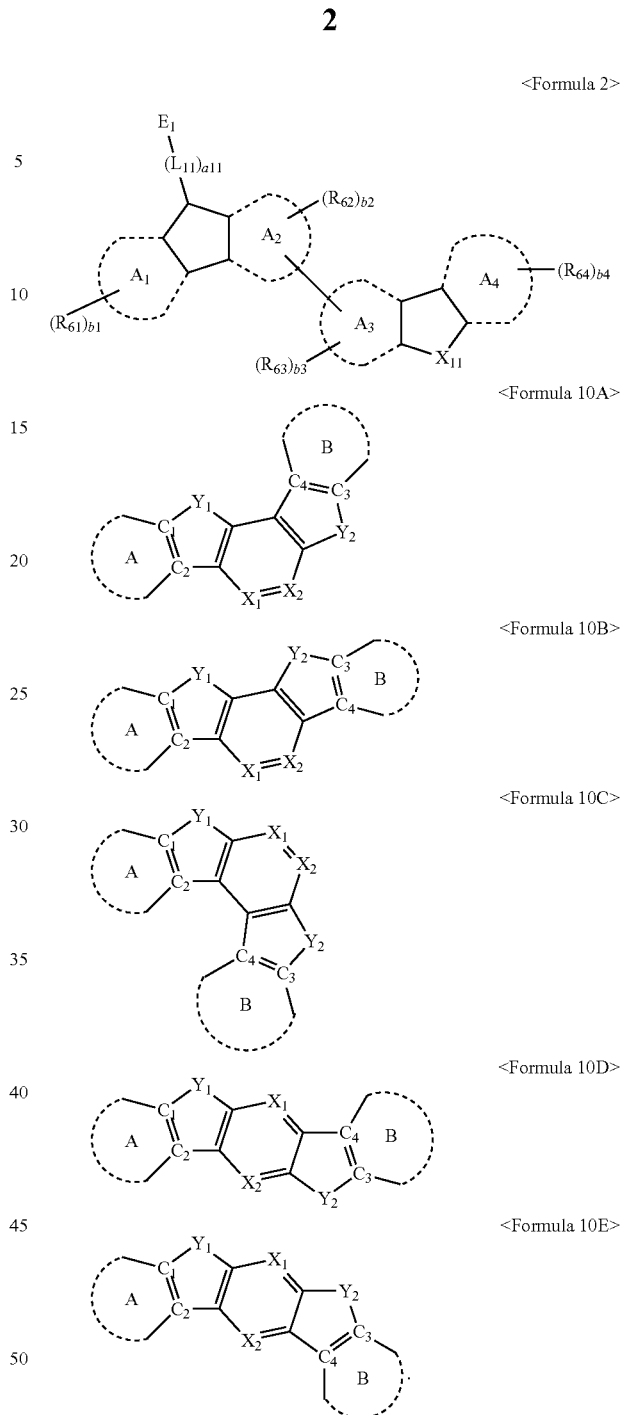

$Z_{11}$ is N or $C(R_{11})$, $Z_{12}$ is N or $C(R_{12})$, $Z_{13}$ is N or $C(R_{13})$, $Z_{14}$ is N or $C(R_{14})$, $Z_{15}$ is N or $C(R_{15})$, $Z_{16}$ is N or $C(R_{16})$, $Z_{17}$ is N or $C(R_{17})$, $Z_{18}$ is N or $C(R_{18})$, $Z_{19}$ is N or $C(R_{19})$, $Z_{20}$ is N or $C(R_{20})$, and $Z_{21}$ is N or $C(R_{21})$;

$A_1$, $A_2$, $A_3$, and $A_4$ are each independently selected from benzene, naphthalene, pyridine, pyrimidine, quinoline, isoquinoline, 2,6-naphthyridine, 1,8-naphthyridine, 1,5-naphthyridine, 1,6-naphthyridine, 1,7-naphtharidine, 2,7-naphthyridine, quinoxaline, phthalazine, quinazoline, and cinnoline;

ring A and ring B are each independently selected from
i) a $C_6$-$C_{20}$ aromatic ring and a $C_2$-$C_{20}$ heteroaromatic ring; and ii) a $C_6$-$C_{20}$ aromatic ring and a $C_2$-$C_{20}$ heteroaromatic ring, each substituted with at least one of a deuterium atom, a halogen atom, a $C_1$-$C_{60}$ alkyl group, a $C_6$-$C_{60}$ aryl group, a $C_2$-$C_{60}$ heteroaryl group, and —N($Q_1$)($Q_2$), wherein $Q_1$ and $Q_2$ are each independently a $C_1$-$C_{60}$ alkyl group, a $C_6$-$C_{60}$ aryl group, or a $C_2$-$C_{60}$ heteroaryl group;

$C_1$ to $C_4$ each independently represent a carbon forming ring A or ring B;

$X_1$ is $CR_1$ or N;

$X_2$ is $CR_2$ or N;

$R_1$ and $R_2$ are each independently selected from a hydrogen, a deuterium, a halogen atom, a $C_1$-$C_{60}$ alkyl group, a $C_6$-$C_{60}$ aryl group, a $C_2$-$C_{60}$ heteroaryl group, and —N($Q_1$)($Q_2$), wherein $Q_1$ and $Q_2$ are each independently a $C_1$-$C_{60}$ alkyl group, a $C_6$-$C_{60}$ aryl group, or a $C_2$-$C_{60}$ heteroaryl group, wherein $R_1$ and $R_2$ are optionally linked to each other to form a saturated or unsaturated $C_6$-$C_{20}$ ring;

$Y_1$ is N-$(L_1)_{n1}$-$Ar_{11}$;

$Y_2$ is N-$(L_2)_{n2}$-$Ar_{12}$, O, S, C($R_{31}$)($R_{32}$), or Si($R_{33}$)($R_{34}$);

$X_{11}$ is O, S, C($R_{41}$)($R_{42}$), Si($R_{41}$)($R_{42}$), P($R_{41}$), B($R_{41}$), or P(=O)($R_{41}$);

$E_1$ is a substituted or unsubstituted electron transporting-cyclic group including at least one N as a ring-forming atom;

$L_1$, $L_2$, $L_{11}$, $L_{21}$, and $L_{22}$ are each independently selected from a $C_3$-$C_{10}$ cycloalkylene group, a $C_2$-$C_{10}$ heterocycloalkylene group, a $C_3$-$C_{10}$ cycloalkenylen group, a $C_2$-$C_{10}$ heterocycloalkenylene group, a $C_6$-$C_{60}$ arylene group, and a $C_2$-$C_{60}$ heteroarylene group; and a $C_3$-$C_{10}$ cycloalkylene group, a $C_2$-$C_{10}$ heterocycloalkylene group, a $C_3$-$C_{10}$ cycloalkenylene group, a $C_2$-$C_{10}$ heterocycloalkenylene group, a $C_6$-$C_{60}$ arylene group, and a $C_2$-$C_{60}$ heteroarylene group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group;

a1, a2, and a11 are each independently an integer selected from 0 to 5;

$Ar_{11}$, $Ar_{12}$, $Ar_{21}$, and $Ar_{22}$ are each independently selected from a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, and a $C_2$-$C_{60}$ heteroaryl group; and a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, and a $C_2$-$C_{60}$ heteroaryl group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group;

$R_{51}$ to $R_{54}$, $R_{11}$ to $R_{21}$, $R_{61}$ to $R_{64}$, $R_{41}$, $R_{42}$, and $R_{31}$ to $R_{34}$ are each independently selected from a hydrogen, a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, and a $C_2$-$C_{60}$ heteroaryl group;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, and a $C_2$-$C_{60}$ heteroaryl group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group; and —N($Q_{11}$)($Q_{12}$), —Si($Q_{13}$)($Q_{14}$)($Q_{15}$), and —B($Q_{16}$)($Q_{17}$), wherein $Q_{11}$ to $Q_{17}$ are each independently a $C_1$-$C_{60}$ alkyl group, a $C_1$-$C_{60}$ alkoxy group, a $C_6$-$C_{60}$ aryl group, or a $C_2$-$C_{60}$ heteroaryl group;

p, b1, b2, b3, and b4 are each independently an integer selected from 1 to 4;

q us an integer of 1 or 2; and n1 and n2 are each independently an integer selected from 0 to 3.

BRIEF DESCRIPTION OF THE DRAWINGS

Features will become apparent to those of skill in the art by describing in detail exemplary embodiments with reference to the attached drawings in which:

FIG. 1 illustrates a schematic view of an organic light-emitting device according to an embodiment.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. As used herein, the term "and/or" includes any and all combinations of one or more of the associated listed items. Expressions such as "at least one of," when preceding a list of elements, modify the entire list of elements and do not modify the individual elements of the list.

According to an embodiment, as shown in FIG. 1, an organic light-emitting device 10 has a structure of a substrate 11, a first electrode 12, a hole transporting region 13, an emission layer (EML) 15, an electron transporting region 17, and a second electrode 19 that are sequentially stacked.

The substrate 11 may be a substrate used in a general organic light-emitting device, and may be a glass substrate or a transparent plastic substrate having excellent mechanical strength, thermal stability, transparency, surface smoothness, ease of handling, and waterproofness.

The substrate 11 of the organic light-emitting device 10 shown in FIG. 1 is illustrated disposed under the first electrode 12. However, in an embodiment, the substrate 11 may be disposed on the second electrode 19.

The first electrode 12 may be formed by applying a first electrode material on the substrate 11 by deposition or sputtering. When the first electrode 12 is an anode, the first electrode material may be selected from materials having a high work function so that holes may be easily injected. The first electrode 12 may be a reflective electrode or a transparent electrode. Examples of the first electrode material may include indium-tin oxide (ITO), indium-zinc-oxide (IZO), tin oxide ($SnO_2$), and zinc oxide (ZnO). Also, when magnesium (Mg), aluminum (Al), aluminum-lithium (Al—Li), calcium (Ca), magnesium-indium (Mg—In), or magnesium-silver (Mg—Ag) is used as the first electrode material, the first electrode 12 may be formed as a reflective electrode.

The first electrode 12 may have a single-layered structure or a multi-layered structure including at least two layers. For example, the first electrode 12 may have a three-layered structure, e.g., ITO/Ag/ITO.

The first electrode 12 may be a hole injection electrode (anode).

The second electrode 19 is disposed to face the first electrode 12. The second electrode 19 may be a cathode, which is an electron injection electrode. The second electrode material 19 may be formed of a material having a low work function which may be selected from a metal, an alloy, an electrically conductive compound, and a mixture thereof. The second electrode 19 may be a transparent electrode. For example, a thin film may be formed using lithium (Li), magnesium (Mg), aluminum (Al), aluminum-lithium (Al—Li), calcium (Ca), magnesium-indium (Mg—In), or magnesium-silver (Mg—Ag) to obtain a transparent electrode. Alternatively, in order to obtain a top-emission type of organic light-emitting device, the second electrode 19 may be formed as a transparent electrode using ITO or IZO.

The EML 15 is disposed between the first electrode 12 and the second electrode 19. A hole transporting region 13 may be disposed between the first electrode (for example, the anode) and the EML 15. An electron transporting region 17 may be disposed between the EML 15 and the second electrode 19 (for example, the cathode).

In the organic light-emitting device 10, holes injected from the first electrode 12 pass through the hole transporting region 13 and move to the EML 15, and electrons injected from the second electrode 19 pass through the electron transporting region 17 and move to the EML 15. The holes and electrons are recombined with each other in the EML 15 to generate excitons. Then, the excitons are transitioned from an excited state to a ground state, thereby generating light.

The hole transporting region 13 includes an amine-based compound represented by one of Formulae 1A and 1C, and the EML 15 includes an organic metal complex and a compound represented by one of Formulae 2, 10A, 10B, 10C, 10D, and 10E:

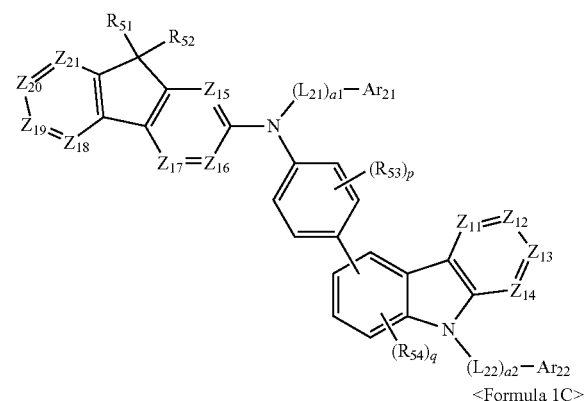

<Formula 1A>

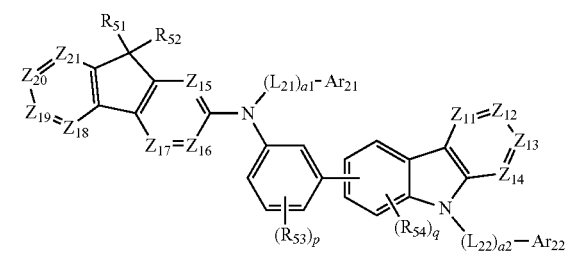

<Formula 1C>

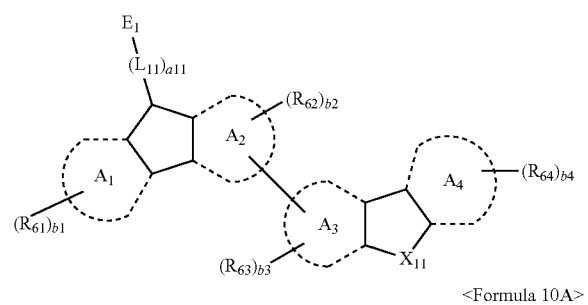

<Formula 2>

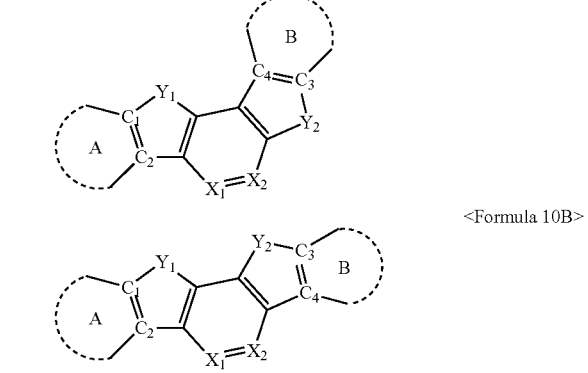

<Formula 10A>

<Formula 10B>

-continued

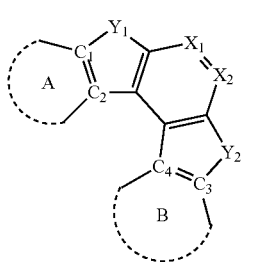
<Formula 10C>

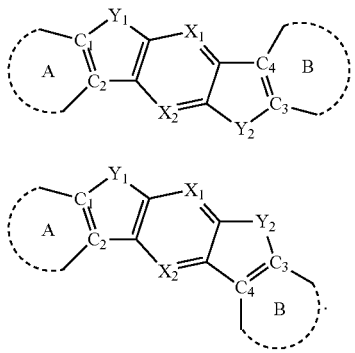
<Formula 10D>

<Formula 10E>

In Formulae 1A and 1C, $Z_{11}$ is N or $C(R_{11})$, $Z_{12}$ is N or $C(R_{12})$, $Z_{13}$ is N or $C(R_{13})$, $Z_{14}$ is N or $C(R_{14})$, $Z_{15}$ is N or $C(R_{15})$, $Z_{16}$ is N or $C(R_{16})$, $Z_{17}$ is N or $C(R_{17})$, $Z_{18}$ is N or $C(R_{18})$, $Z_{19}$ is N or $C(R_{19})$, $Z_{20}$ is N or $C(R_{20})$, and $Z_{21}$ is N or $C(R_{21})$.

In some embodiments, in Formulae 1A and 1C, $Z_{11}$ may be $C(R_{11})$, $Z_{12}$ may be $C(R_{12})$, $Z_{13}$ may be $C(R_{13})$, $Z_{14}$ may be $C(R_{14})$, $Z_{15}$ may be $C(R_{15})$, $Z_{16}$ may be $C(R_{16})$, $Z_{17}$ may be $C(R_{17})$, $Z_{18}$ may be $C(R_{18})$, $Z_{19}$ may be $C(R_{19})$, $Z_{20}$ may be $C(R_{20})$, and $Z_{21}$ may be $C(R_{21})$.

In Formula 2, $A_1$, $A_2$, $A_3$, and $A_4$ may each independently be selected from benzene, naphthalene, pyridine, pyrimidine, quinoline, isoquinoline, 2,6-naphthyridine, 1,8-naphthyridine, 1,5-naphthyridine, 1,6-naphthyridine, 1,7-naphtharidine, 2,7-naphthyridine, quinoxaline, phthalazine, quinazoline, and cinnoline.

In some embodiments, in Formula 2, $A_1$, $A_2$, $A_3$, and $A_4$ may each independently be benzene or naphthalene.

In some embodiments, in Formula 2, $A_1$ may be naphthalene or benzene, and $A_2$, $A_3$, and $A_4$ may be benzene, but $A_1$, $A_2$, $A_3$, and $A_4$ are not limited thereto.

In Formula 2, $X_{11}$ may be O, S, $C(R_{41})(R_{42})$, $Si(R_{41})(R_{42})$, $P(R_{41})$, $B(R_{41})$, or $P(=O)(R_{41})$. $R_{41}$ and $R_{42}$ may each independently be selected from:

a hydrogen, a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, and a $C_2$-$C_{60}$ heteroaryl group;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, and a $C_2C_{60}$ heteroaryl group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group; and —$N(Q_{11})(Q_{12})$, —$Si(Q_{13})(Q_{14})(Q_{15})$, and —$B(Q_{16})(Q_{17})$ (here, $Q_{11}$ to $Q_{17}$ are each independently a $C_1$-$C_{60}$ alkyl group, a $C_1$-$C_{60}$ alkoxy group, a $C_6$-$C_{60}$ aryl group, or a $C_2$-$C_{60}$ heteroaryl group).

In some embodiments, in Formula 2, $X_{11}$ may be O, S, $C(R_{41})(R_{42})$, or $Si(R_{41})(R_{42})$, and $R_{41}$ and $R_{42}$ may be optionally linked to each other to form a saturated or unsaturated ring.

In Formula 2, $E_1$ may be a substituted or unsubstituted electron transporting-cyclic group including at least one nitrogen (N) as a ring-forming atom.

In some embodiments, in Formula 2, $E_1$ may be selected from a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, a isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzoimidazolyl group, a thiazolyl group, an isothiazolyl group, a benzothiazolyl group, an isoxazolyl group, an oxazolyl group, a triazolyl group, a tetrazolyl group, an oxadiazolyl group, and a triazinyl group; and a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzoimidazolyl group, a thiazolyl group, an isothiazolyl group, a benzothiazolyl group, an isoxazolyl group, an oxazolyl group, a triazolyl group, a tetrazolyl group, an oxadiazolyl group, and a triazinyl group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, —Si($Q_{21}$)($Q_{22}$)($Q_{23}$), and a $C_6$-$C_{60}$ aryl group substituted with at least one —Si($Q_{21}$)($Q_{22}$)($Q_{23}$) (here, $Q_{21}$ to $Q_{23}$ are each independently selected from a hydrogen, a $C_1$-$C_{20}$ alkyl group, a $C_1$-$C_{20}$ alkoxy group, a $C_6$-$C_{20}$ aryl group, and a $C_2$-$C_{20}$ heteroaryl group).

In some embodiments, in Formula 2, $E_1$ may be selected from Formulae 11-1 to 11-17:

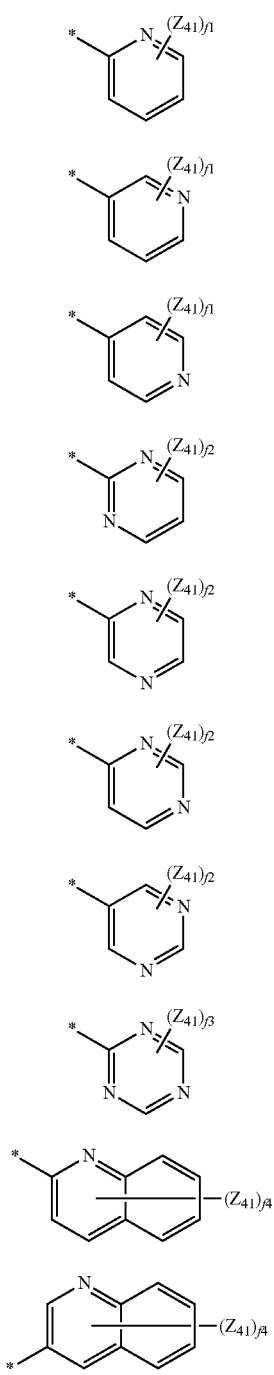

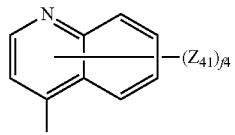
Formula 11-11

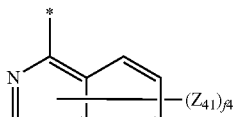
Formula 11-12

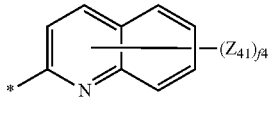
Formula 11-13

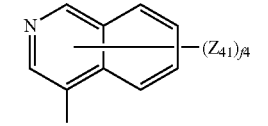
Formula 11-14

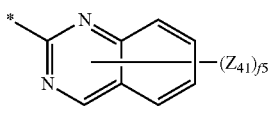
Formula 11-15

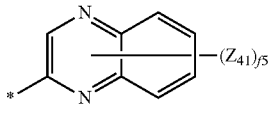
Formula 11-16

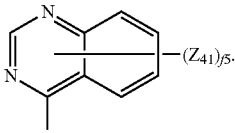
Formula 11-17

In Formulae 11-1 to 11-21, $Z_{41}$ and $Z_{42}$ are each independently selected from a hydrogen, a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a phenyl group, a naphthyl group, an anthracenyl group, a pyrenyl group, a phenanthrenyl group, a fluorenyl group, a carbazolyl group, a benzocarbazolyl group, a dibenzocarbazolyl group, a pyridinyl group, a pyrimidinyl group, a pyrazinyl group, a pyridazinyl group, a triazinyl group, a quinolinyl group, an isoquinolinyl group, a quinoxalinyl group, a quinazolinyl group, a cinnolinyl group, a quinazolinyl group, —Si($Q_{21}$)($Q_{22}$)($Q_{23}$), and a phenyl group substituted with at least one —Si($Q_{21}$)($Q_{22}$)($Q_{23}$) (here, $Q_{21}$ to $Q_{23}$ are each independently selected from a hydrogen, a $C_1$-$C_{20}$ alkyl group, a $C_1$-$C_{20}$ alkoxy group, a phenyl group, and a naphthyl group);

f1 is an integer of 1 to 4;
f2 is an integer of 1 to 3;

f3 is an integer of 1 or 2;

f4 is an integer of 1 to 6; and f5 is an integer of 1 to 5.

In Formulae 10A to 10E, ring A and ring B are each independently selected from i) benzene, naphthalene, antrhacene, pyridine, pyrimidine, pyrazine, quinoline, and isoquinoline; and ii) benzene, naphthalene, antrhacene, pyridine, pyrimidine, pyrazine, quinoline, and isoquinoline, each substituted with at least one of a deuterium atom, a methyl group, an ethyl group, a t-butyl group, an octyl group, a phenyl group, a naphthyl group, a pyridyl group, a pyrimidyl group, and —N(Ph)$_3$.

In $Y_1$ and $Y_2$ of Formulae 10A to 10E, $Ar_{11}$ and $Ar_{12}$ may each independently be selected from Formulae H1 to H81:

H1
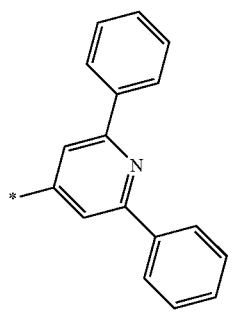

H2
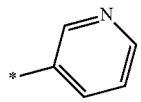

H3
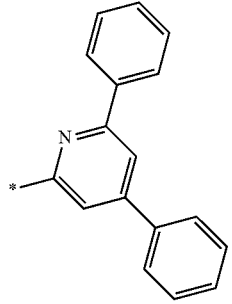

H4
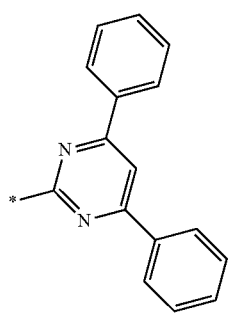

H5
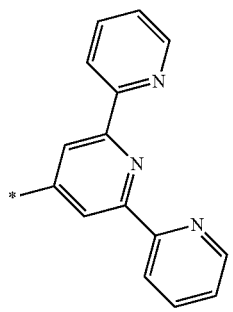

H6
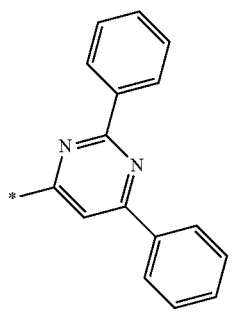

H7
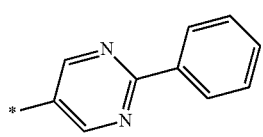

H8
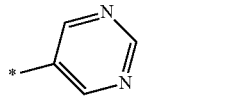

H9
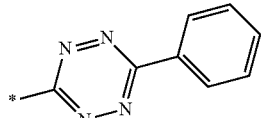

H10
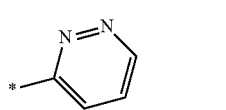

H11
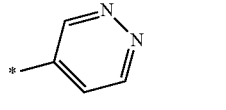

H12
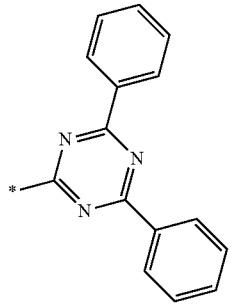

-continued
H13 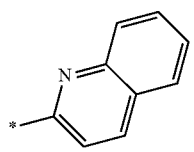
H14 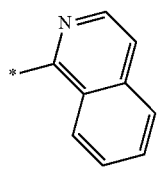
H15 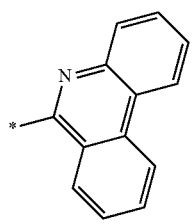
H16 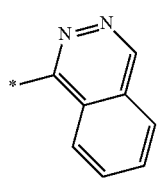
H17 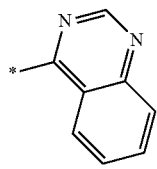
H18 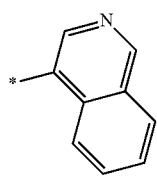
H19 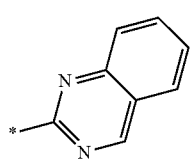
H20 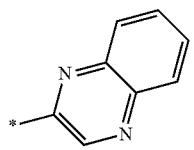
H21 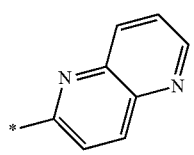
-continued
H22 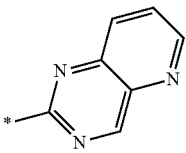
H23 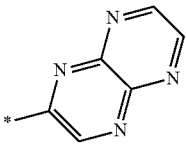
H24 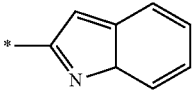
H25 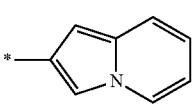
H26 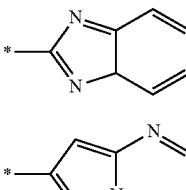
H27 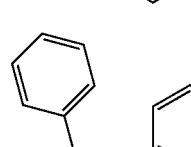
H28 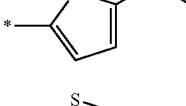
H29 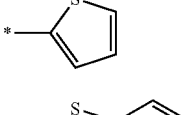
H30 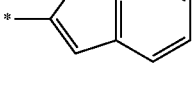
H31 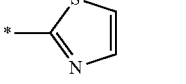
H32 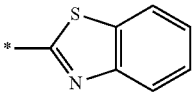
H33 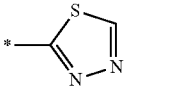
H34 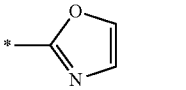

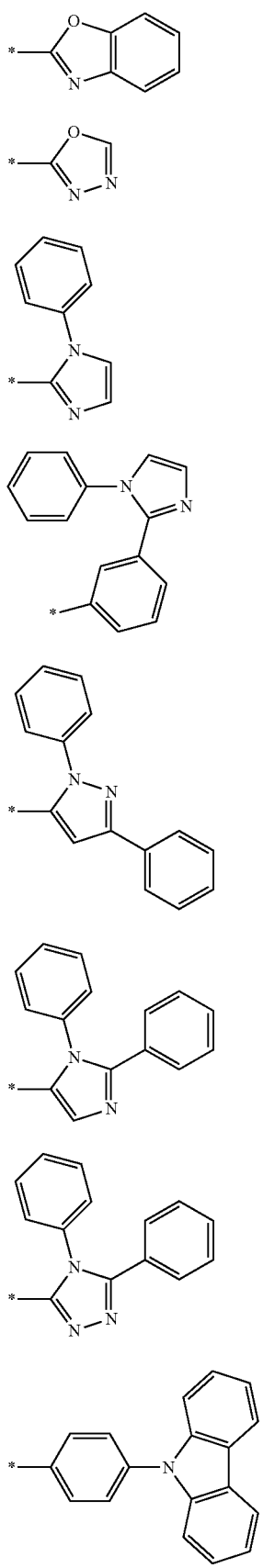
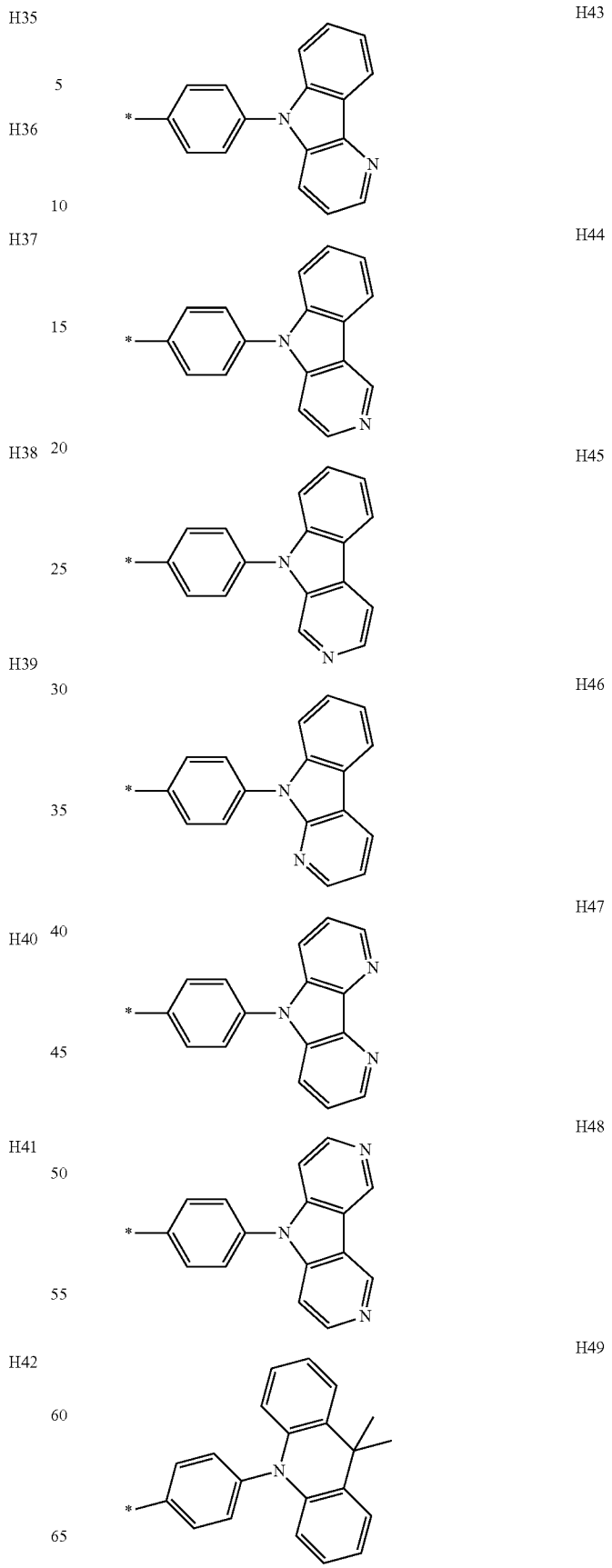

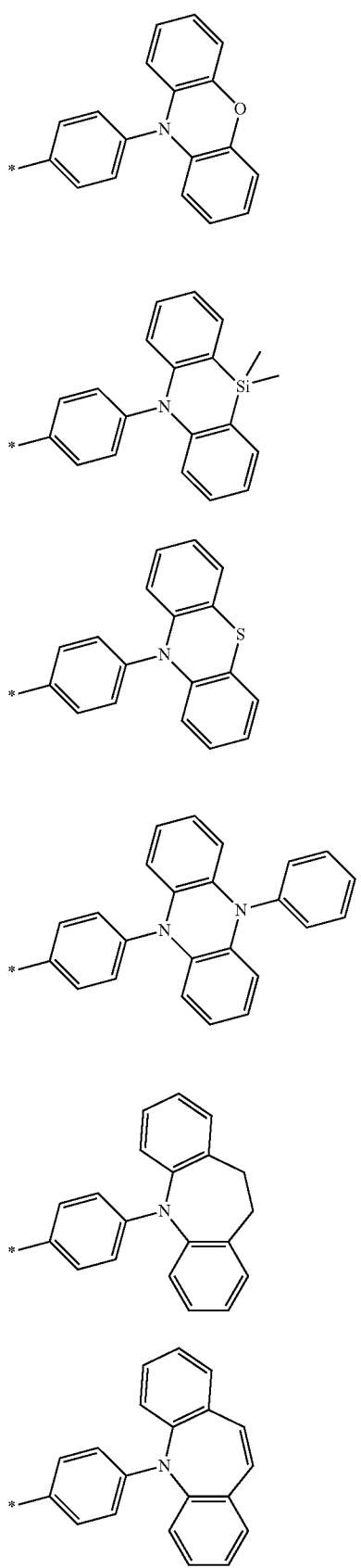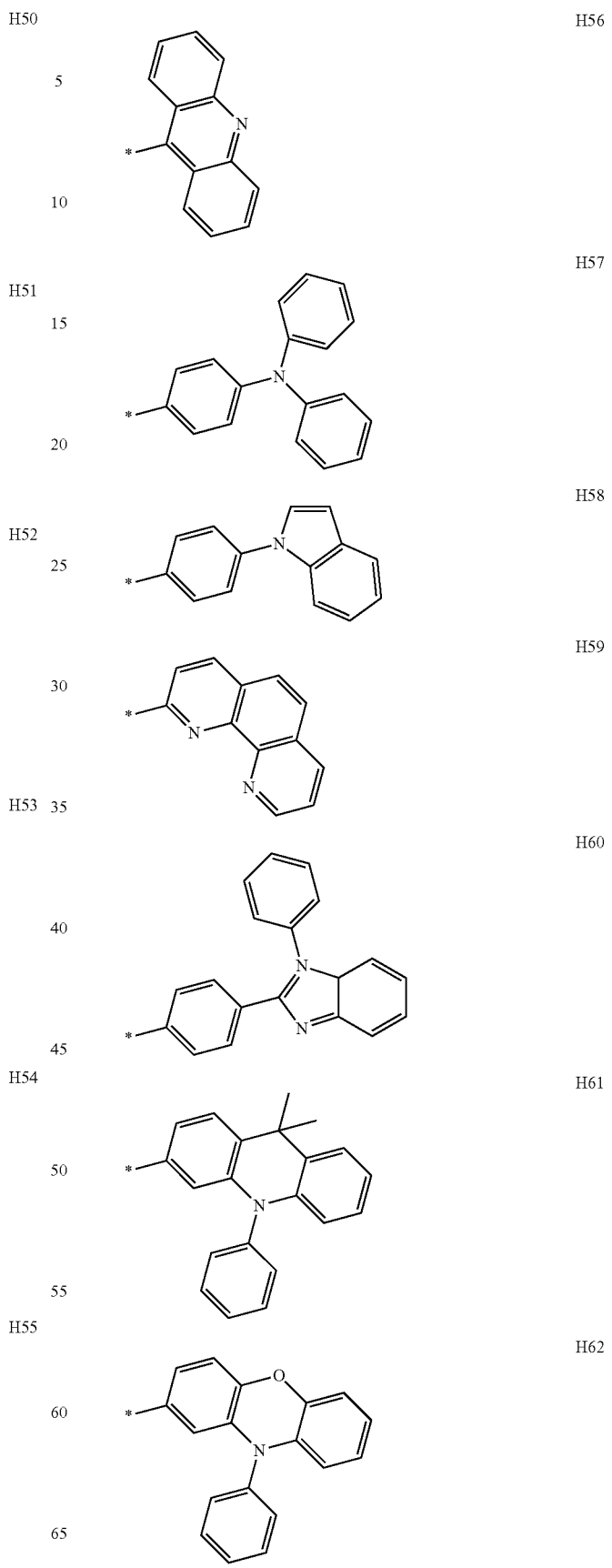

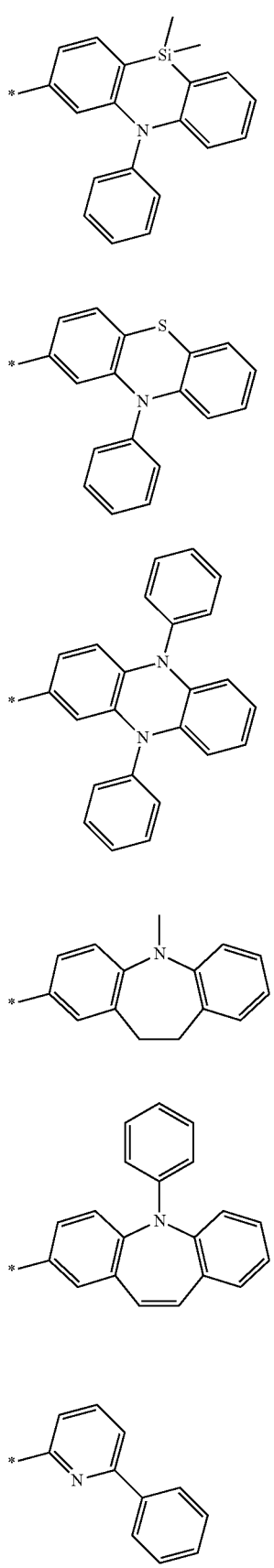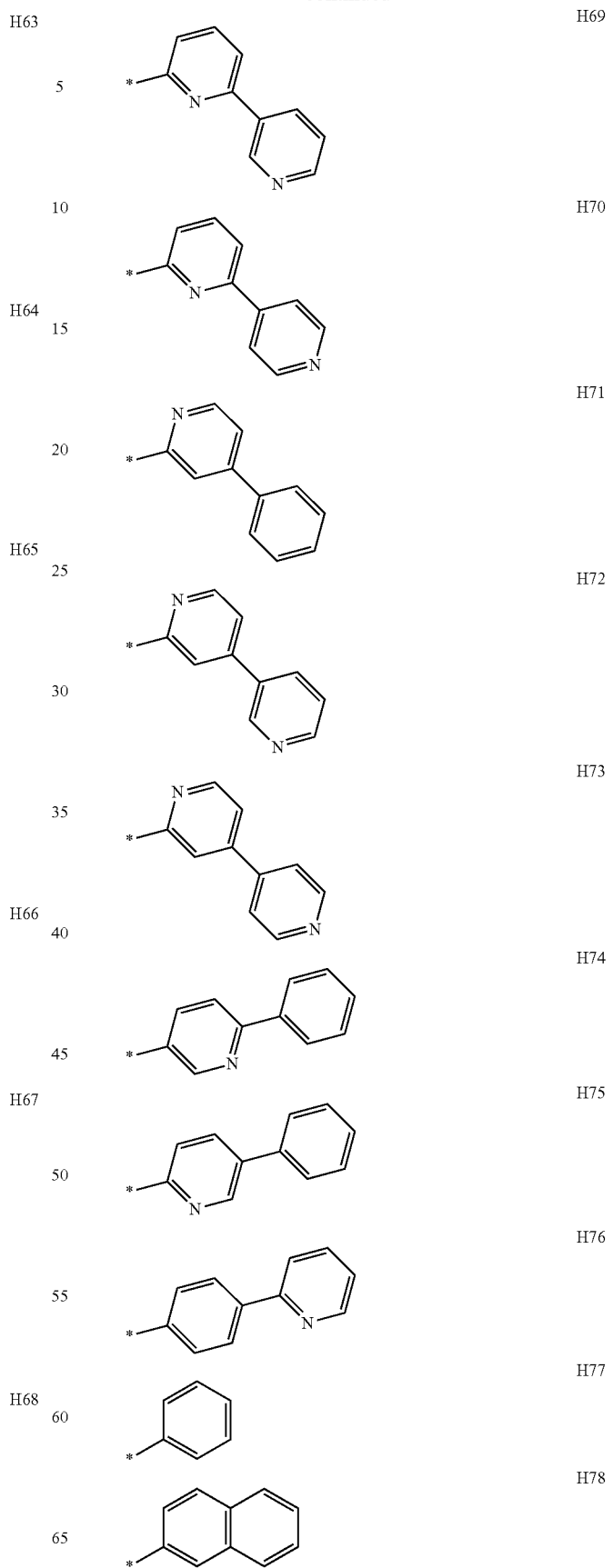

-continued
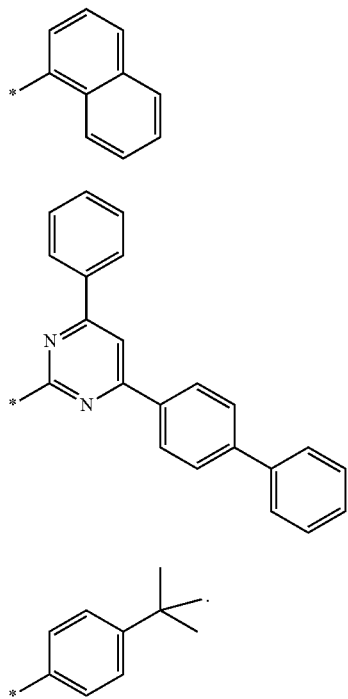
In Formulae H1 to H81, * denotes a binding site with N, $L_1$, or $L_2$.
A compound represented by one of Formulae 10A to 10E may be represented by one selected from Formulae 1-1 to 1-28:
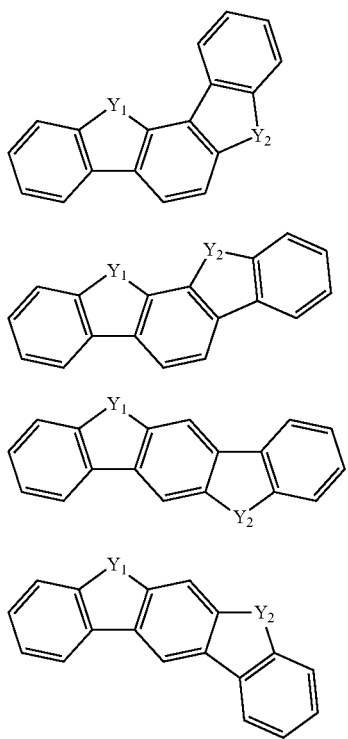
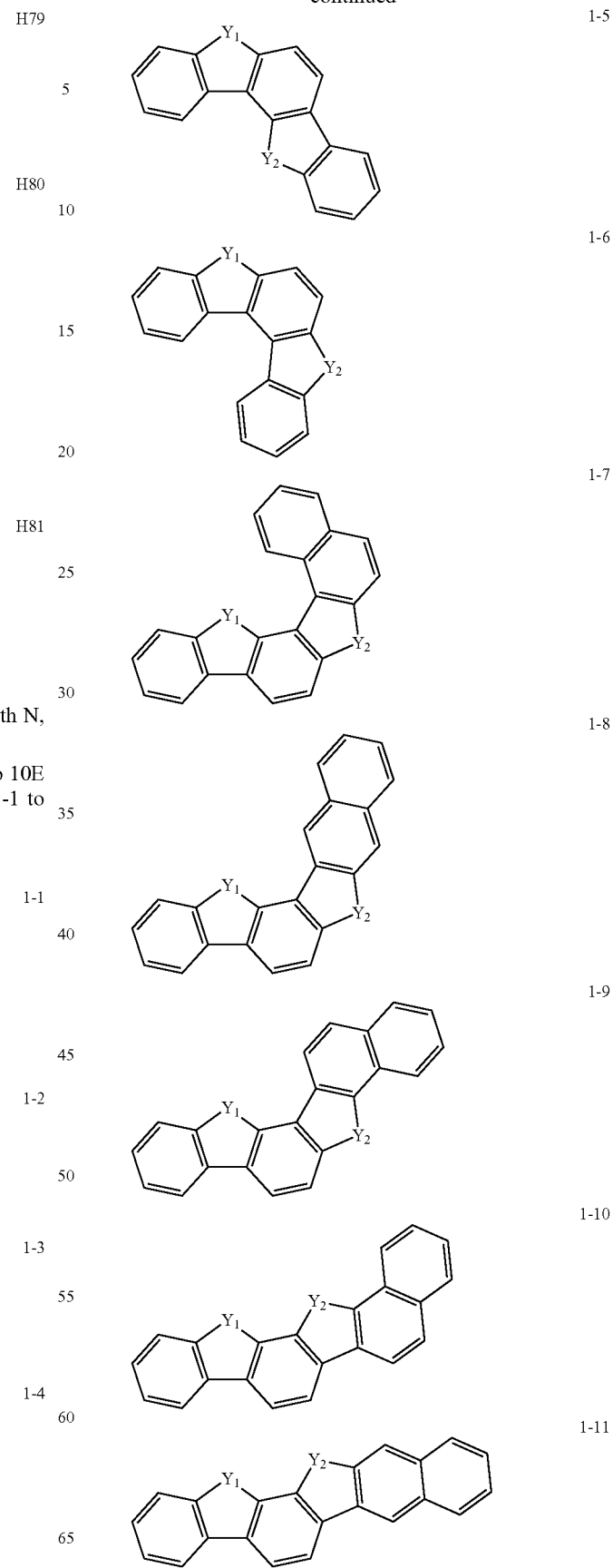

1-12
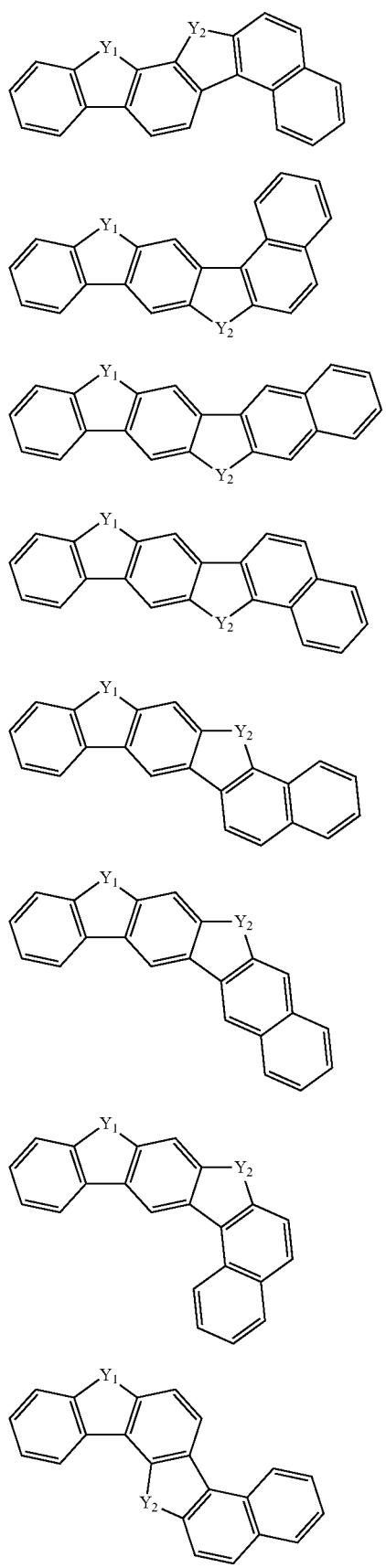
1-13
1-14
1-15
1-16
1-17
1-18
1-19
1-20
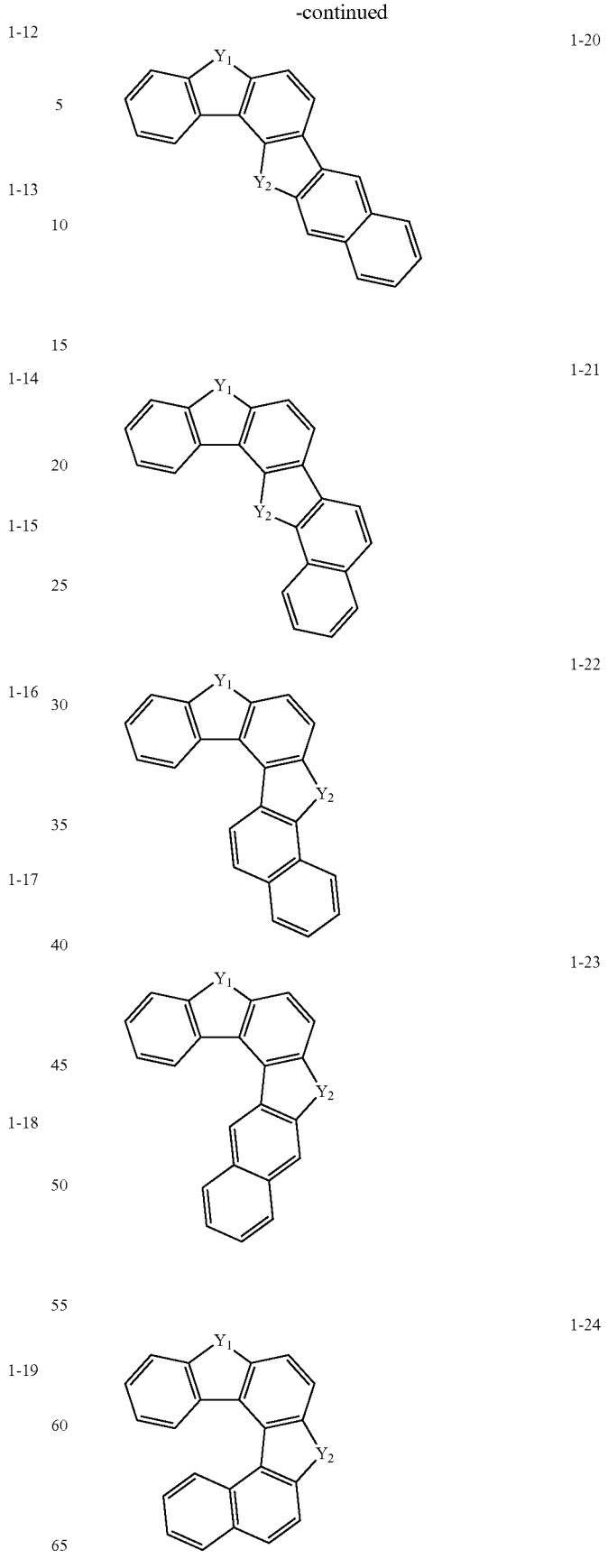
1-21
1-22
1-23
1-24

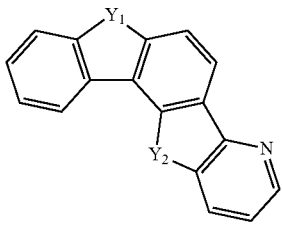
1-25

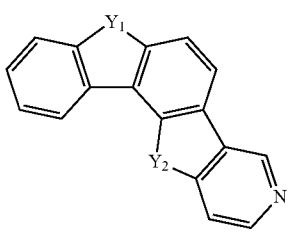
1-26

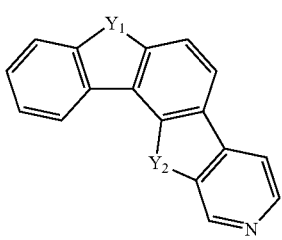
1-27

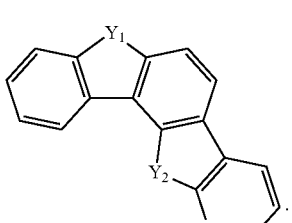
1-28

In an embodiment, in formulae 1-1 to 1-28, $Y_1$ is $N\text{-}(L_1)_{n1}\text{-}Ar_{11}$, and $Y_2$ is $N\text{-}(L_2)_{n2}\text{-}Ar_{12}$, O, S, $C(R_{31})(R_{32})$, or $Si(R_{33F})(R_{34})$. $L_1$, $L_2$, n1, n2, $Ar_{11}$, $Ar_{12}$, and $R_{31}$ to $R_{34}$ are as defined elsewhere in the present specification.

In the formulae above, $L_1$, $L_2$, $L_{11}$, $L_{21}$, and $L_{22}$ may each independently be selected from a $C_3$-$C_{10}$ cycloalkylene group, a $C_2$-$C_{10}$ heterocycloalkylene group, a $C_3$-$C_{10}$ cycloalkenylene group, a $C_2$-$C_{10}$ heterocycloalkenylene group, a $C_6$-$C_{60}$ arylene group, and a $C_2$-$C_{60}$ heteroarylene group;

a $C_3$-$C_{10}$ cycloalkylene group, a $C_2$-$C_{10}$ heterocycloalkylene group, a $C_3$-$C_{10}$ cycloalkenylene group, a $C_2$-$C_{10}$ heterocycloalkenylene group, a $C_6$-$C_{60}$ arylene group, and a $C_2$-$C_{60}$ heteroarylene group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group.

In some embodiments, in the formulae above, $L_1$, $L_2$, $L_{11}$, $L_{21}$, and $L_{22}$ may each independently be selected from a phenylene group, a pentalenylene group, an indenylene group, a naphthylene group, an azulenylene group, a heptalenylene group, an indacenylene group, an acenaphthylene group, a fluorenylene group, a spiro-fluorenylene group, a phenalenylene group, a phenanthrenylene group, an anthracenylene group, a fluoranthrenylene group, a triphenylenylene group, a pyrenylene group, a chrysenylene group, a naphthacenylene group, a picenylene group, a perylenylene group, a pentaphenylene group, a hexacenylene group, a pyrrolylene group, an imidazolylene group, a pyrazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzooxazolylene group, a benzoimidazolylene group, a furanylene group, a benzofuranylene group, a thiophenylene group, a benzothiophenylene group, a thiazolylene group, an isothiazolylene group, a benzothiazolylene group, an isoxazolylene group, an oxazolylene group, a trazolylene group, a tetrazolylene group, an oxadiazolylene group, a triazinylene group, a dibenzofuranylene group, a dibenzothiophenylene group, a benzocarbazolylene group, and a dibenzocarbazolylene group; and a phenylene group, a pentalenylene group, an indenylene group, a naphthylene group, an azulenylene group, a heptalenylene group, an indacenylene group, an acenaphthylene group, a fluorenylene group, a spiro-fluorenylene group, a phenalenylene group, a phenanthrenylene group, an anthracenylene group, a fluoranthrenylene group, a triphenylenylene group, a pyrenylene group, a chrysenylene group, a naphthacenylene group, a picenylene group, a perylenylene group, a pentaphenylene group, a hexacenylene group, a pyrrolylene group, an imidazolylene group, a pyrazolylene a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzooxazolylene group, a benzoimidazolylene group, a furanylene group, a benzofuranylene group, a thiophenylene group, a benzothiophenylene group, a thiazolylene group, an isothiazolylene group, a benzothiazolylene group, an isoxazolylene group, an oxazolylene group, a triazolylene group, a tetrazolylene group, an oxadiazolylene group, a triazinylene group, a dibenzofuranylene group, a dibenzothiophenylene group, a benzocarbazolylene group, and a dibenzocarbazolylene group, each substituted with at least one of a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a phenyl group, a naphthyl group, an anthracenyl group, a pyrenyl group, a phenanthrenyl group, a fluorenyl group, a carbazolyl group, a benzocarbazolyl group, a dibenzocarbazolyl group, a pyridinyl group, a pyrimidinyl group, a pyrazinyl group, a pyridazinyl group, a triazinyl group, a quinolinyl group, an isoquinolinyl group, a quinoxalinyl group, a quinazolinyl group, a cinnolinyl group, and a quinazolinyl group.
In some embodiments, in the formulae above, $L_1$, $L_2$, $L_{11}$, $L_{21}$, and $L_{22}$ may each independently be selected from Formulae 3-1 to 3-32:
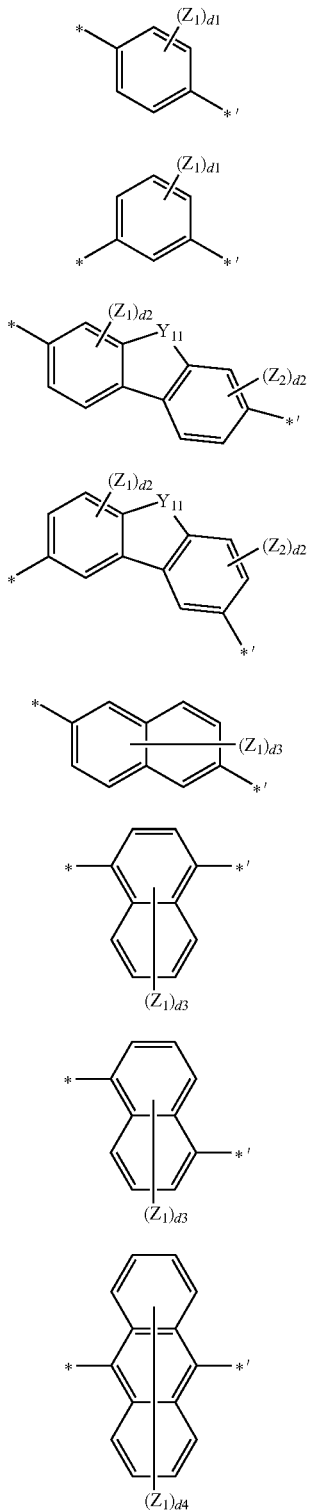
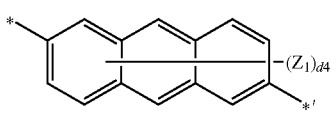
Formula 3-9
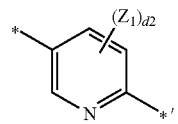
Formula 3-10
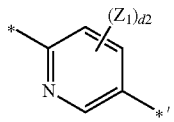
Formula 3-11
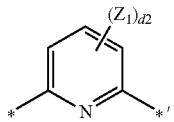
Formula 3-12
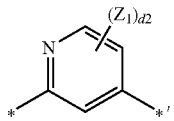
Formula 3-13
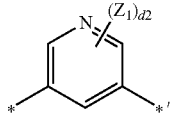
Formula 3-14
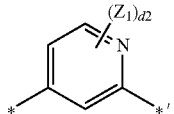
Formula 3-15
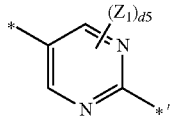
Formula 3-16
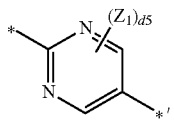
Formula 3-17
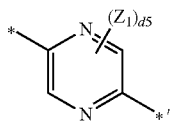
Formula 3-18
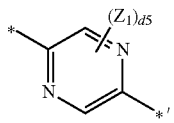
Formula 3-19

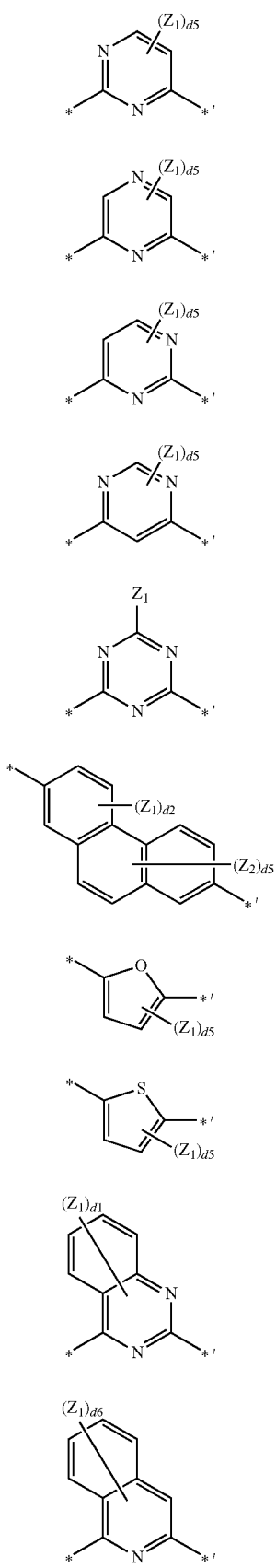

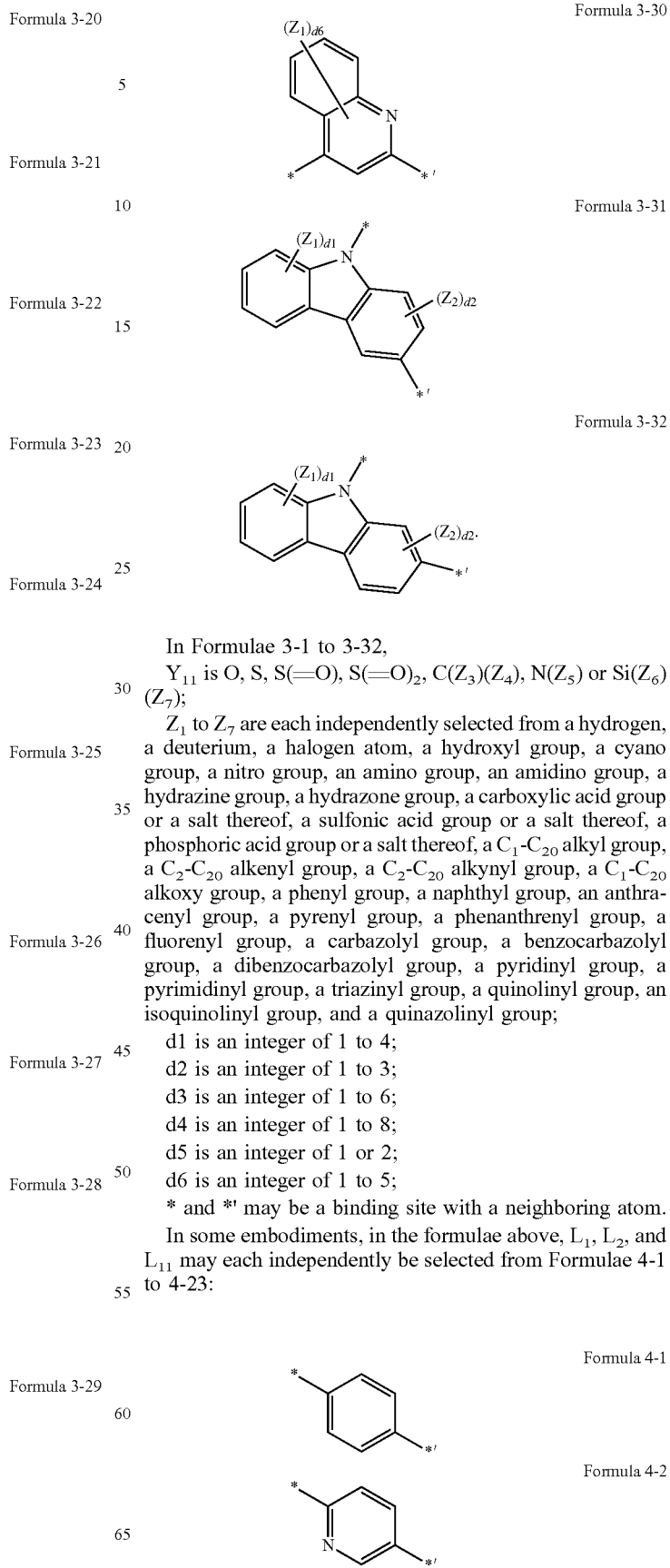

In Formulae 3-1 to 3-32, $Y_{11}$ is O, S, S(=O), S(=O)$_2$, C($Z_3$)($Z_4$), N($Z_5$) or Si($Z_6$)($Z_7$);

$Z_1$ to $Z_7$ are each independently selected from a hydrogen, a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a phenyl group, a naphthyl group, an anthracenyl group, a pyrenyl group, a phenanthrenyl group, a fluorenyl group, a carbazolyl group, a benzocarbazolyl group, a dibenzocarbazolyl group, a pyridinyl group, a pyrimidinyl group, a triazinyl group, a quinolinyl group, an isoquinolinyl group, and a quinazolinyl group;

d1 is an integer of 1 to 4;
d2 is an integer of 1 to 3;
d3 is an integer of 1 to 6;
d4 is an integer of 1 to 8;
d5 is an integer of 1 or 2;
d6 is an integer of 1 to 5;
* and *' may be a binding site with a neighboring atom.

In some embodiments, in the formulae above, $L_1$, $L_2$, and $L_{11}$ may each independently be selected from Formulae 4-1 to 4-23:

-continued
Formula 4-3
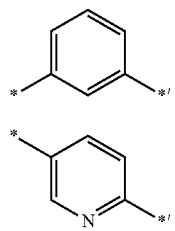
Formula 4-4
Formula 4-5
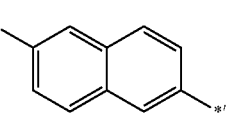
Formula 4-6
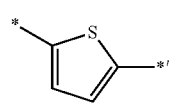
Formula 4-7
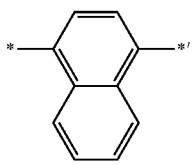
Formula 4-8
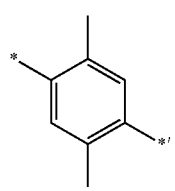
Formula 4-9
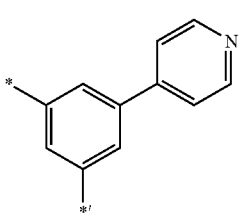
Formula 4-10
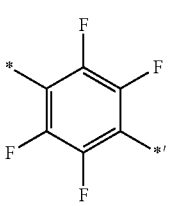
Formula 4-11
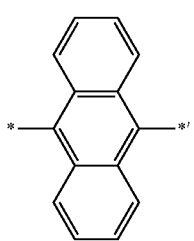
Formula 4-12
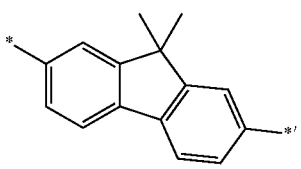
Formula 4-13
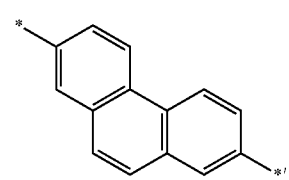
Formula 4-14
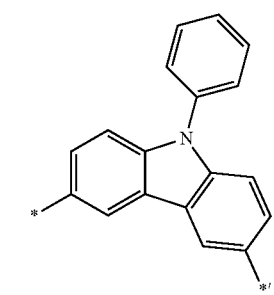
Formula 4-15
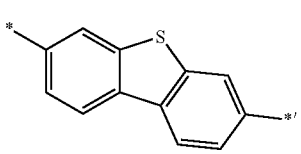
Formula 4-16
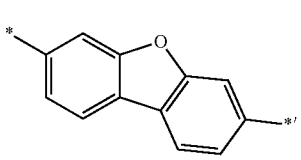
Formula 4-17
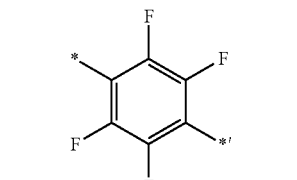
Formula 4-18
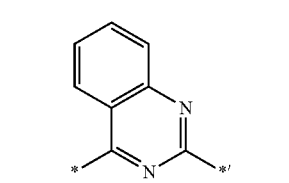
Formula 4-19
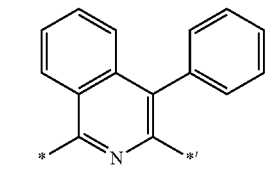

Formula 4-20

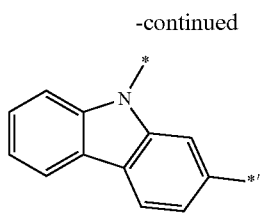

Formula 4-21

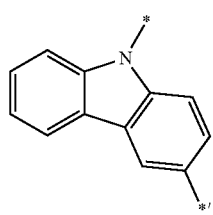

Formula 4-22

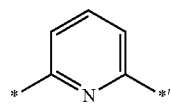

Formula 4-23

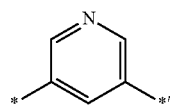

In Formulae 1A and 1C, and 2, a1, a2, and a11 are each independently an integer selected from 0 to 5.

a1 denotes the number of L1, which may be, for example, 0, 1, or 2. When a1 is 2 or greater, the two or more L1 may be identical to or different from each other.

a2 denotes the number of L2, which may be, for example, 0, 1, or 2. When a2 is 2 or greater, the two or more L2 may be identical to or different from each other.

a11 denotes the number of L11, which may be, for example, 0, 1, or 2. When a11 is 2 or greater, the two or more $L_{11}$ may be identical to or different from each other.

In Formulae 1A and 1C, $Ar_{21}$ and $Ar_{22}$ may each independently be selected from a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, and a $C_2$-$C_{60}$ heteroaryl group;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, and a $C_2$-$C_{60}$ heteroaryl group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group.

In some embodiments, in Formula 1A and 1C, $Ar_{21}$ and $Ar_{22}$ are each independently selected from a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzooxazolyl group, a benzoimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a benzooxazolyl group, a dibenzofuranyl group, a dibenzothiophenyl, and a benzocarbazolyl group; and a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, a benzoquinolinyl group, a phthalazinyl group, a naphthyridinyl group, a quinoxalinyl group, a quinazolinyl group, a cinnolinylene group, a carbazolyl group, a phenanthridinyl group, an acridinyl group, a phenanthrolinyl group, a phenazinyl group, a benzooxazolyl group, a benzoimidazolyl group, a furanyl group, a benzofuranyl group, a thiophenyl group, a benzothiophenyl group, a thiazolylene group, an isothiazolyl group, a benzothiazolyl group, an isoxazolyl group, an oxazolyl group, a triazolyl group, a tetrazolyl group, an oxadiazolyl group, a triazinyl group, a benzooxazolyl group, a dibenzofuranyl group, a dibenzothiophenyl group, and a benzocarbazolyl group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_6$-$C_{20}$ aryl group, and a $C_2$-$C_{20}$ heteroaryl group.

In some embodiments, in Formulae 1A and 1C, $Ar_{21}$ and $Ar_{22}$ may each independently be selected from:

a phenyl group, a naphthyl group, a fluorenyl group, a spiro-fluorenyl group, a phenanthrenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group; and a phenyl group, a naphthyl group, a fluorenyl group, a spiro-fluorenyl group, a phenanthrenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinylene group, a carbazolyl group, and a triazinyl group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, $C_1$-$C_{20}$ alkyl group, $C_1$-$C_{20}$ alkoxy group, a phenyl group, a naphthyl group, a fluorenyl group, a spiro-fluorenyl group, a phenanthrenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinylene group, a carbazolyl group, and a triazinyl group.

In some embodiments, in Formulae 1A and 1C, $Ar_{21}$ and $Ar_{22}$ may each independently be represented by one of Formulae 5-1 to 5-20:

Formula 5-1

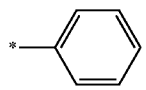

Formula 5-2

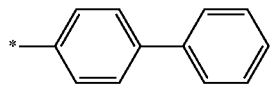

Formula 5-3

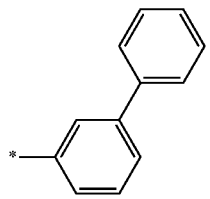

Formula 5-4

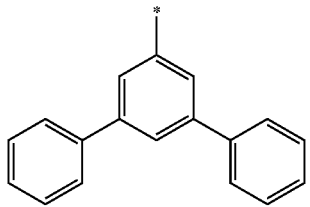

Formula 5-5

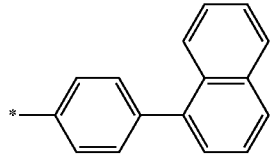

Formula 5-6

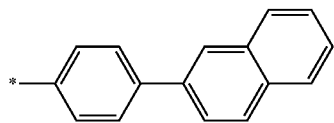

Formula 5-7

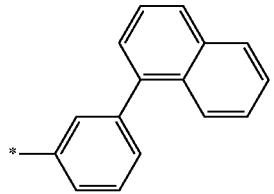

Formula 5-8

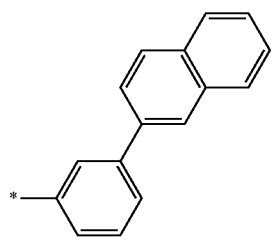

Formula 5-9

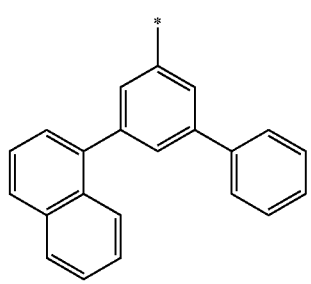

Formula 5-10

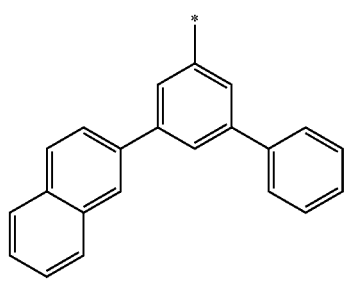

Formula 5-11

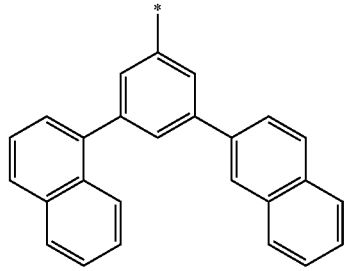

Formula 5-12

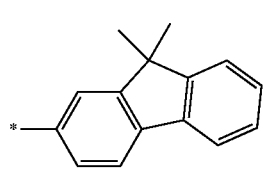

Formula 5-13

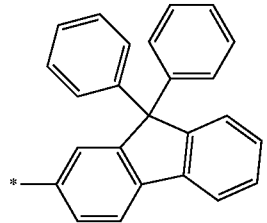

-continued

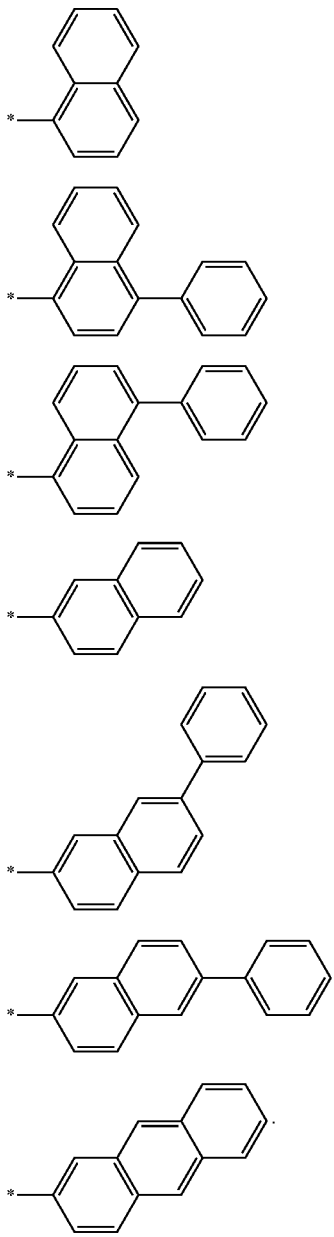

Formula 5-14

Formula 5-15

Formula 5-16

Formula 5-17

Formula 5-18

Formula 5-19

Formula 5-20

In Formulae 5-1 to 5-20, * denotes a binding site with $L_1$, a binding site with $L_2$, or a binding site with N.

In some embodiments, in Formulae 1A and 1C, at least one of $Ar_{21}$ and $Ar_{22}$ may be selected from:

a naphthyl group; and a naphthyl group, substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a phenanthrenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinylene group, a carbazolyl group, and a triazinyl group.

In the formulae above, $R_{51}$ to $R_{54}$, $R_{11}$ to $R_{21}$, $R_{61}$ to $R_{64}$, $R_{41}$, $R_{42}$, and $R_{31}$ to $R_{34}$ may each independently be selected from:

a hydrogen, a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, and a $C_2$-$C_{60}$ heteroaryl group;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, and a $C_2$-$C_{60}$ heteroaryl group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group; and —$N(Q_{11})(Q_{12})$, —$Si(Q_{13})(Q_{14})(Q_{15})$, and —$B(Q_{16})(Q_{17})$ (here, $Q_{11}$ to $Q_{17}$ are each independently a $C_1$-$C_{60}$ alkyl group, a $C_1$-$C_{60}$ alkoxy group, a $C_6$-$C_{60}$ aryl group, or a $C_2$-$C_{60}$ heteroaryl group).

In the formulae above, in Formulae 1A and 1C, $R_{51}$ and $R_{52}$ may each be selected from:

a $C_1$-$C_{20}$ alkyl group;

a $C_1$-$C_{20}$ alkyl group, substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a spiro-fluorenyl group, a phenanthrenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinylene group, a carbazolyl group, and a triazinyl group;

a phenyl group, a naphthyl group, a fluorenyl group, a spiro-fluorenyl group, a phenanthrenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group; and a phenyl group, a naphthyl group, a fluorenyl group, a spiro-fluorenyl group, a phenanthrenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinylene group, a carbazolyl group, and a triazinyl group, each substituted with at least one of a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_2$-$C_{20}$ alkyl group, a $C_1$-$C_{20}$ alkoxy group, a phenyl group, a naphthyl group, a fluorenyl group, a spiro-fluorenyl group, a phenanthrenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinylene group, a carbazolyl group, and a triazinyl group.

In the formulae above, in Formulae 1A and 1C, $R_{51}$ and $R_{52}$ may each independently be selected from a $C_1$-$C_{10}$ alkyl group and groups represented by Formulae 5-1 to 5-20.

In Formulae 1A and 1C, and 2, $R_{53}$, $R_{54}$, $R_{11}$ to $R_{21}$, $R_{61}$ to $R_{64}$, $R_{41}$, and $R_{42}$ may each independently be selected from a hydrogen, a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, and groups represented by Formulae 5-1 to 5-20.

In Formulae 1A and 1C, and 2, p, b1, b2, b3, and b4 may each independently be an integer selected from 1 to 4; and q may be an integer of 1 or 2.

In some embodiments, the amine-based compound may be represented by one of Formulae 1A-1 and 1C-1.

<Formula 1A-1>

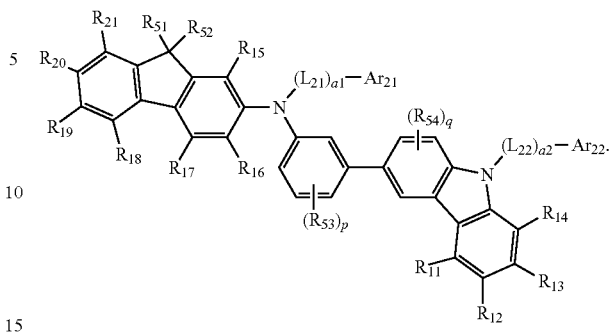

<Formula 1C-1>

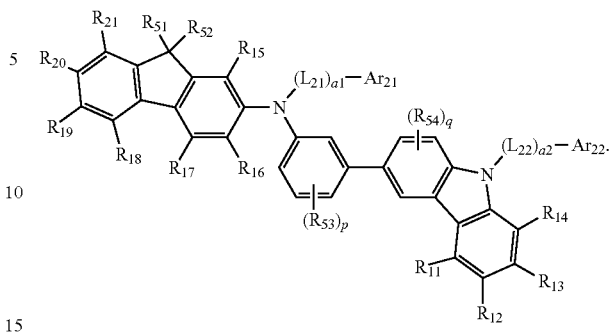

The substituents of compounds represented by Formulae 1A-1 and 1C-1 are as defined elsewhere in the present specification.

In some embodiments, the amine-based compound is represented by one of Formulae 1A-1 and 1C-1, wherein $L_{21}$ and $L_{22}$ may each independently be selected from Formulae 3-1 to 3-32; $Ar_{21}$ to $Ar_{22}$ may each independently be selected from groups represented by Formulae 5-1 to 5-20; a1 and a2 may each independently be 0 or 1; $R_{51}$ and $R_{52}$ may each independently be selected from a $C_1$-$C_{10}$ alkyl group and groups represented by Formulae 5-1 to 5-20; $R_{53}$, $R_{54}$, and $R_{11}$ to $R_{21}$ may each independently be selected from a hydrogen, a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, and groups represented by Formulae 5-1 to 5-20.

According to another embodiment, the amine-based compound may be represented by Formula 1C.

According to another embodiment, the amine-based compound may be represented by Formula 1C-1.

The amine-based compound may be selected from Compounds 1 to 10:

1

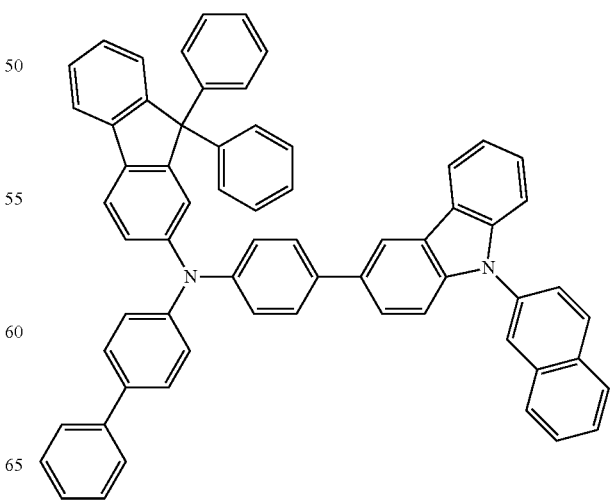

2
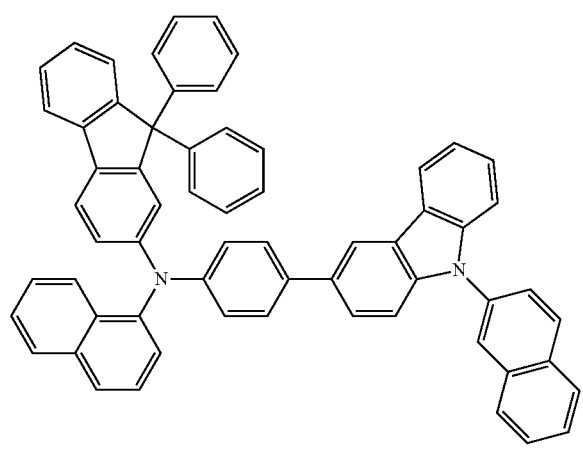
3
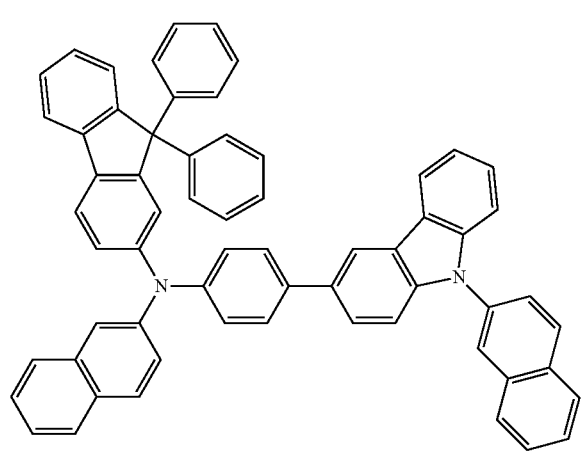
4
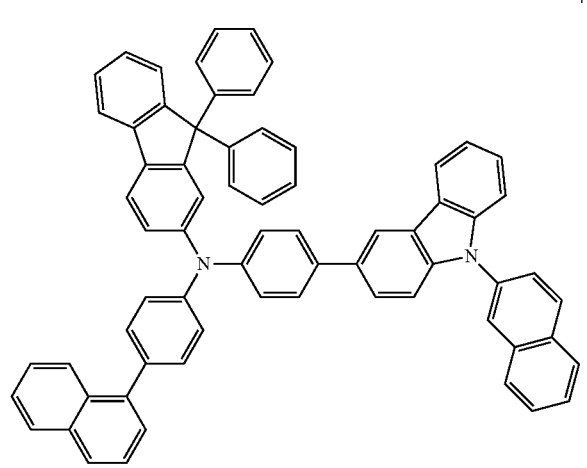
5
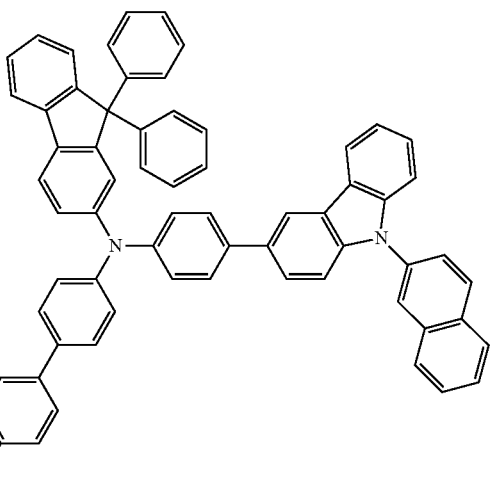
6
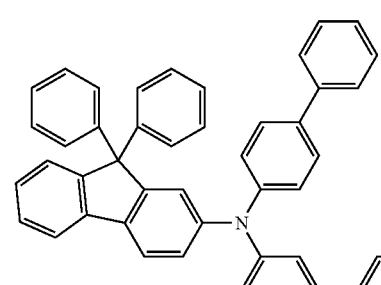
7
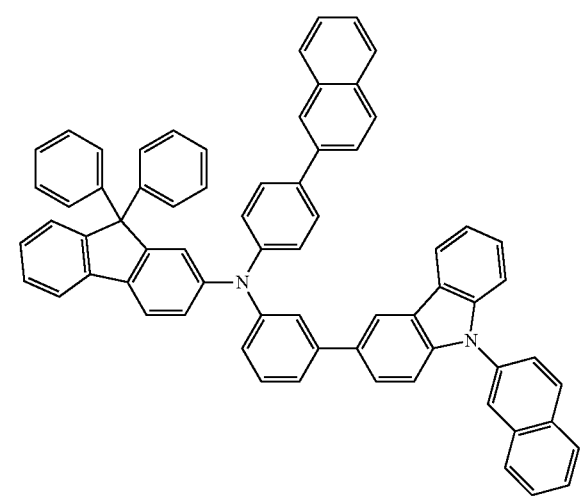

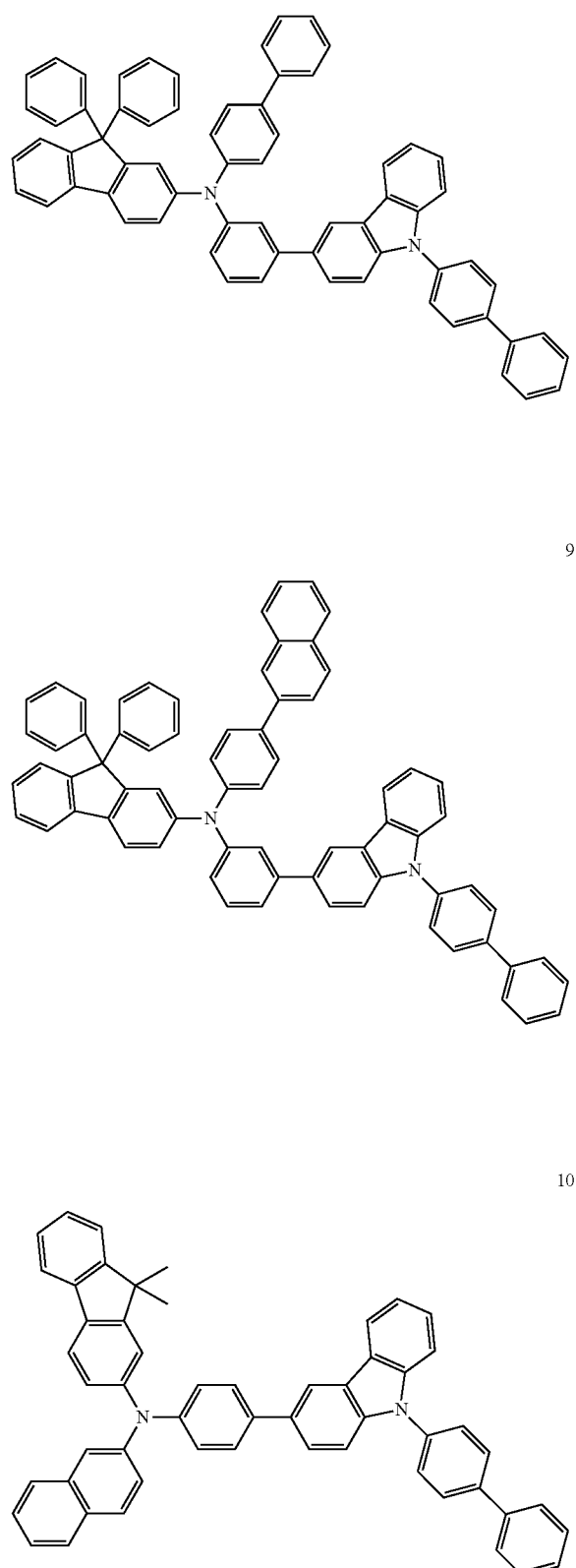
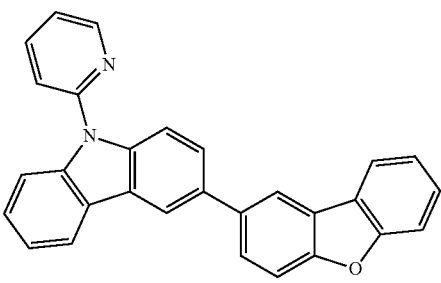
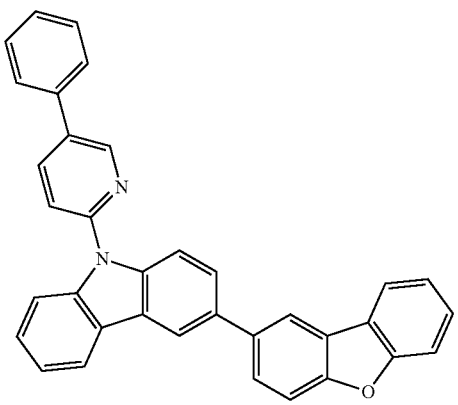
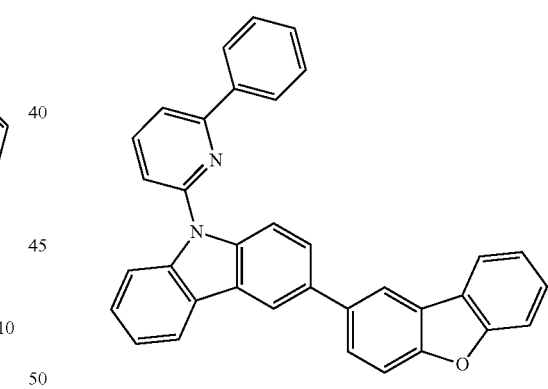
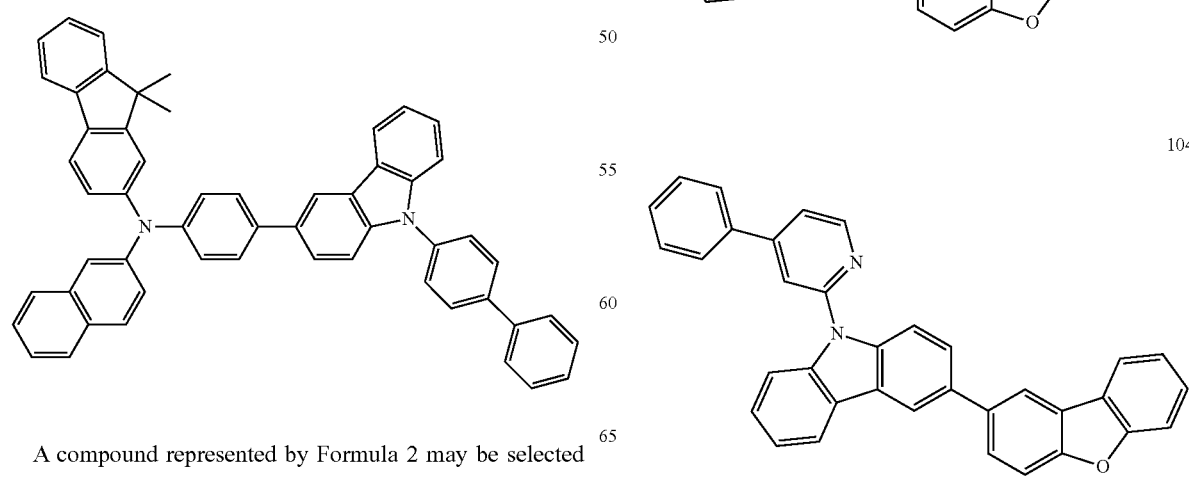
A compound represented by Formula 2 may be selected from Compounds 101A to 160A:

45
-continued
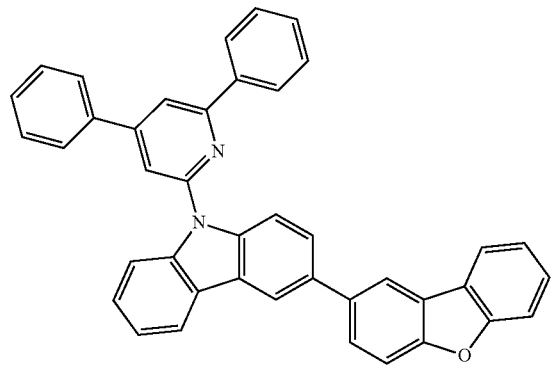
105A
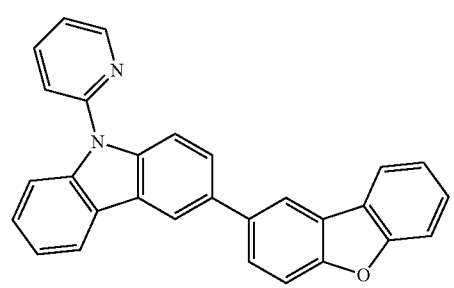
101A
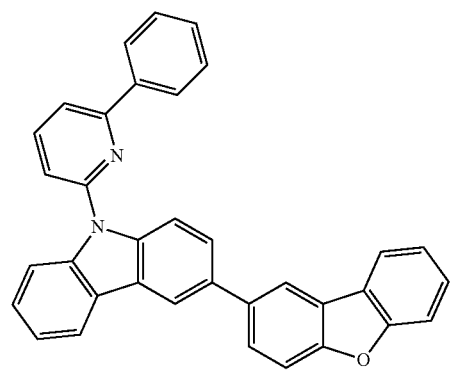
103A
46
-continued
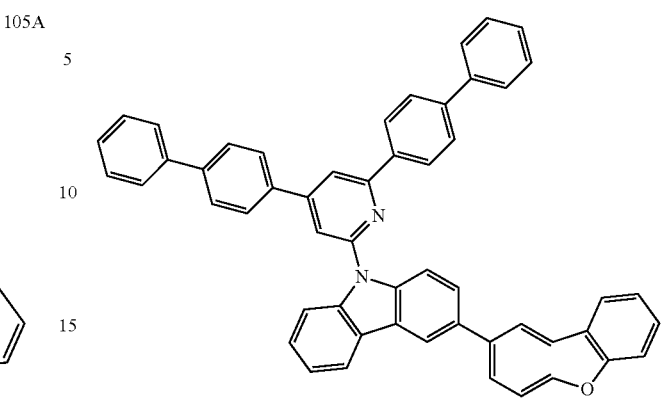
106A
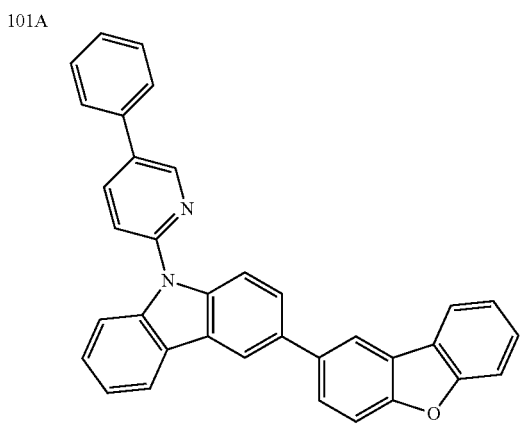
102A
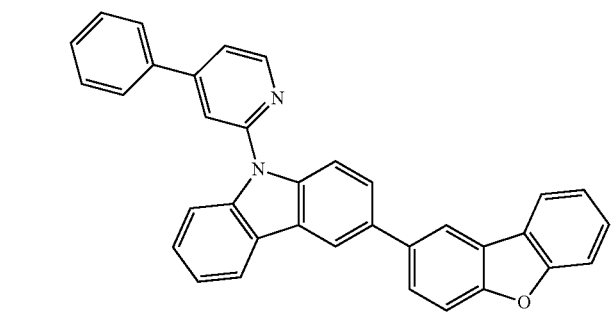
104A -continued
| 105A | 106A |
|---|---|
| 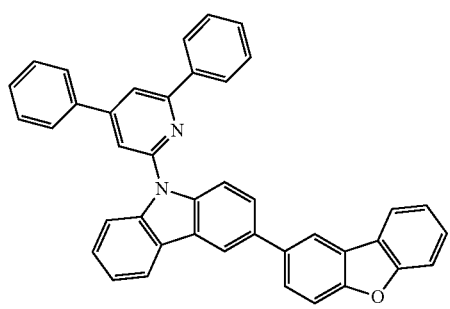 | 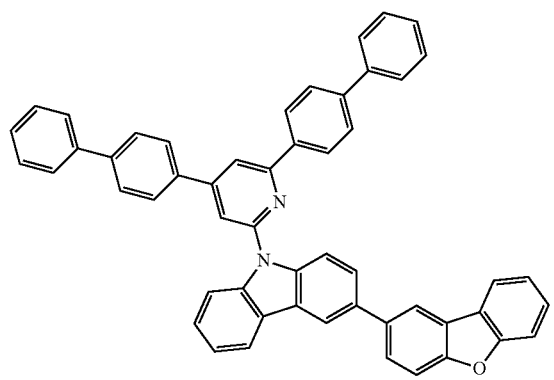 |
| 107A | 108A |
| 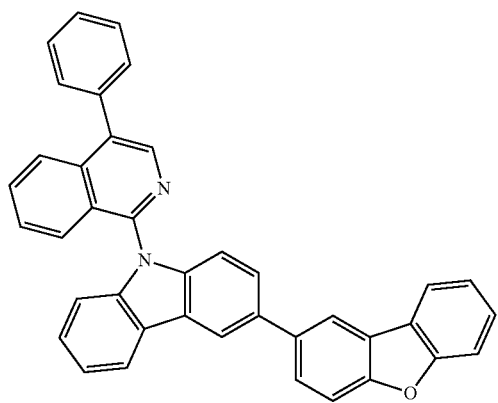 | 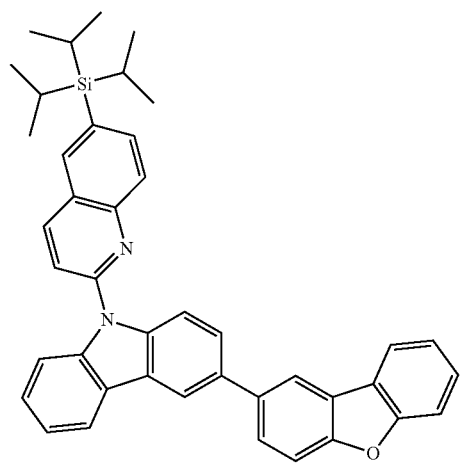 |
| 109A | 110A |
| 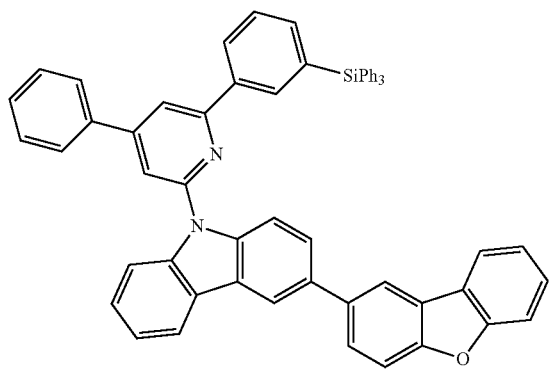 | 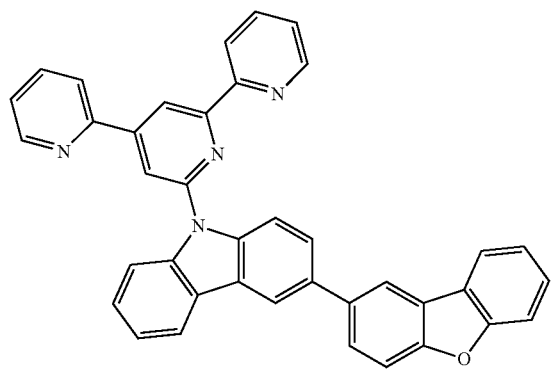 |

-continued
111A
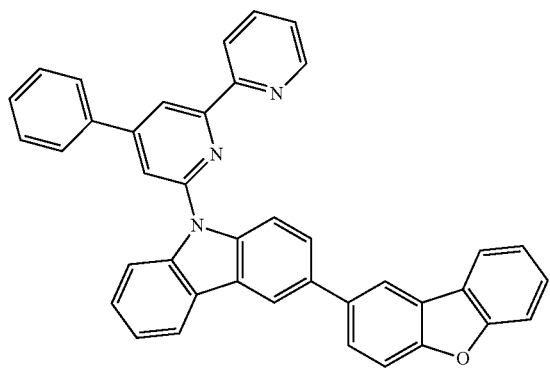
112A
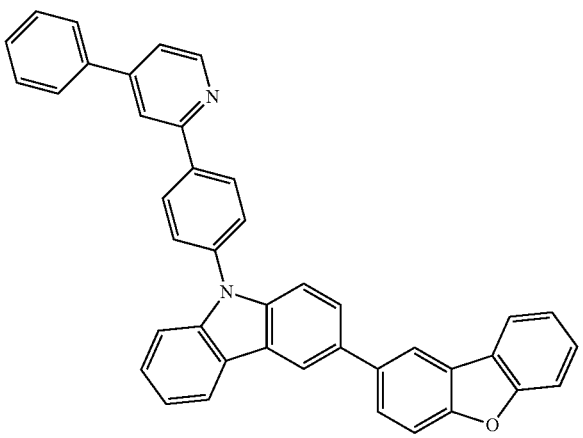
113A
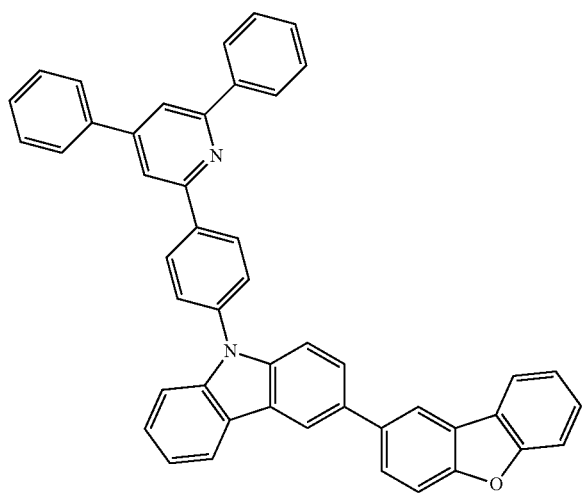
114A
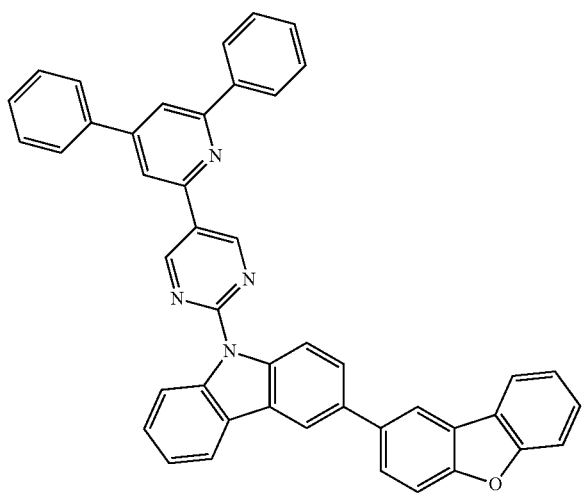
115A
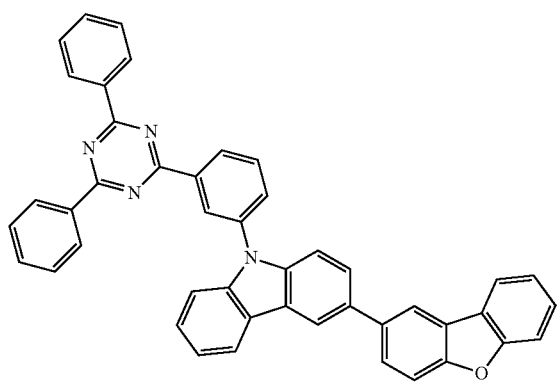
116A
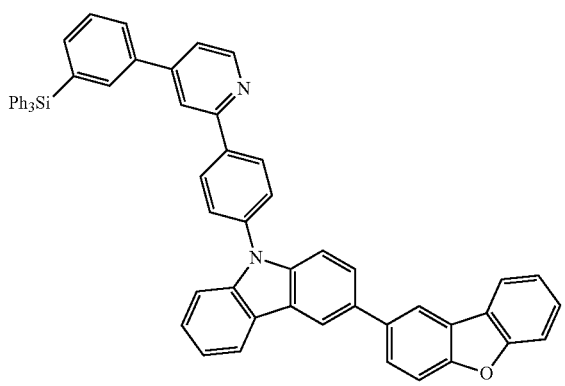

-continued
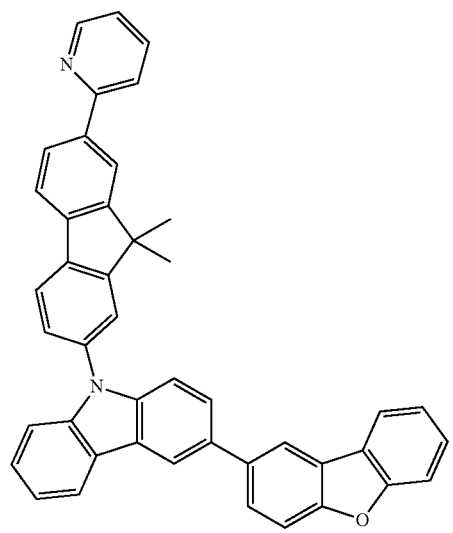
117A
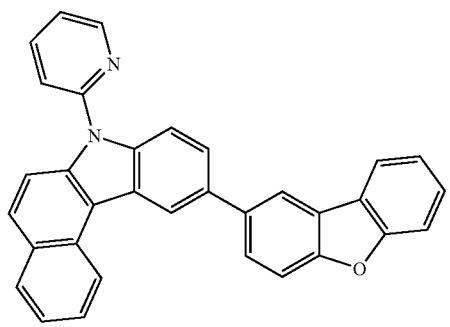
118A
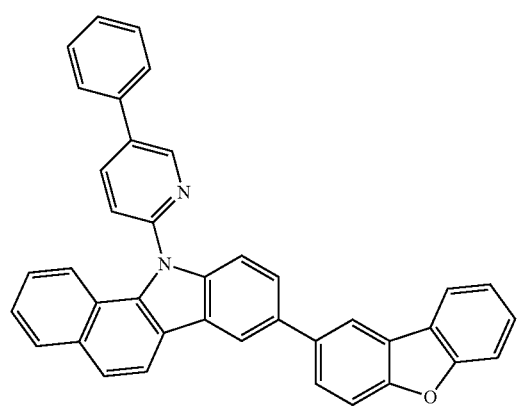
119A
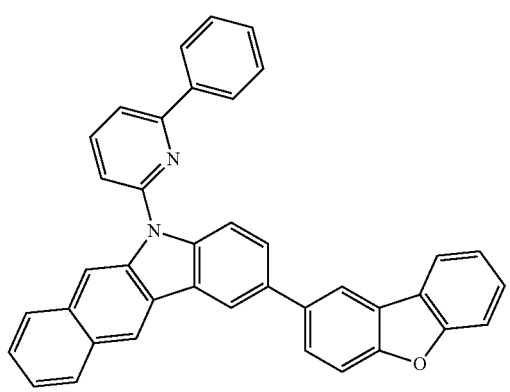
120A
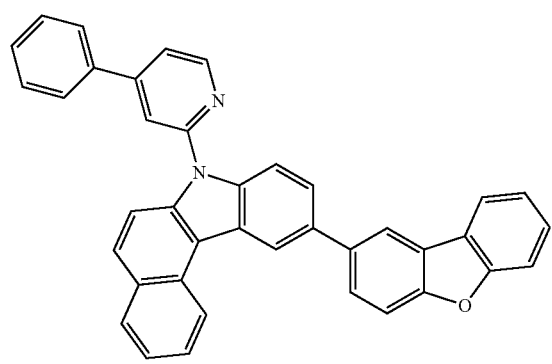
121A
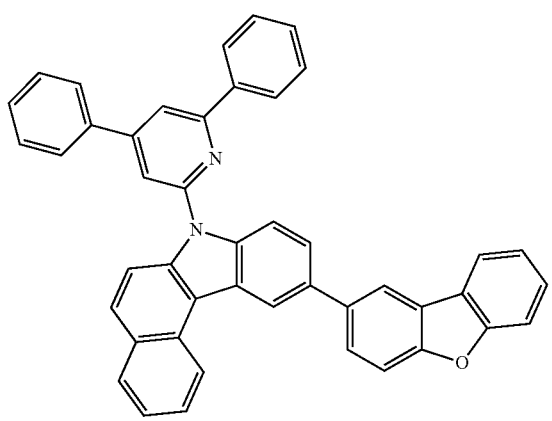
122A -continued
123A
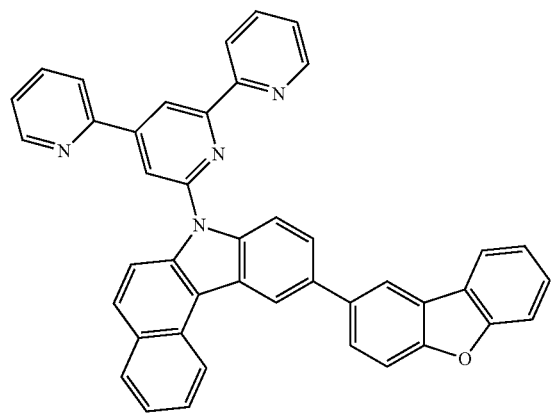
124A
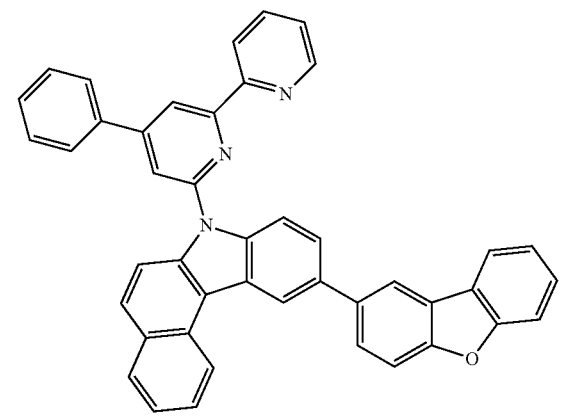
125A
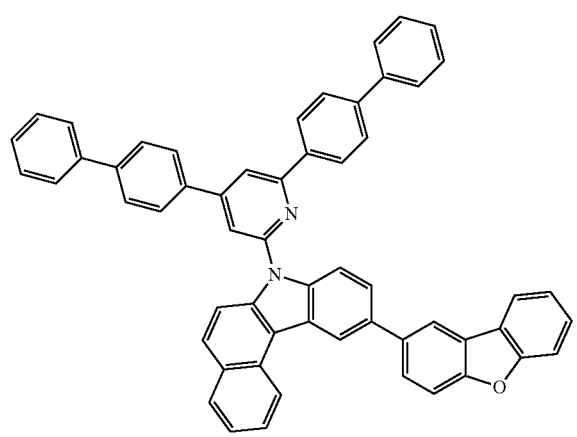
126A
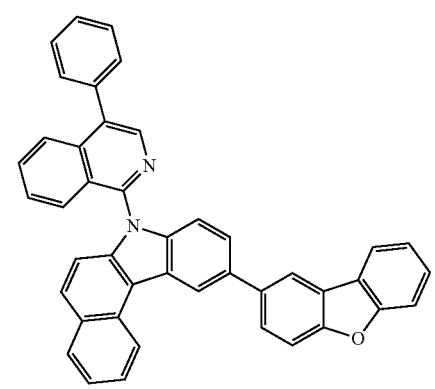
127A
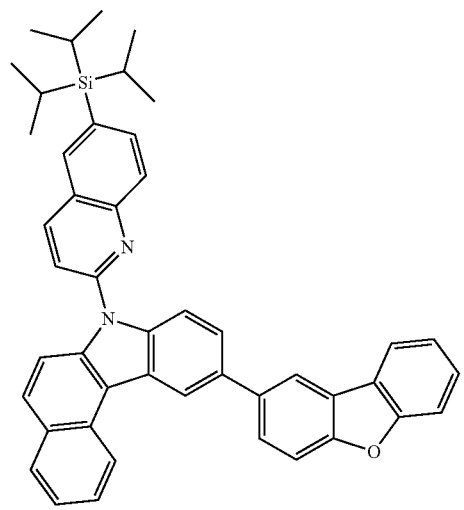
128A
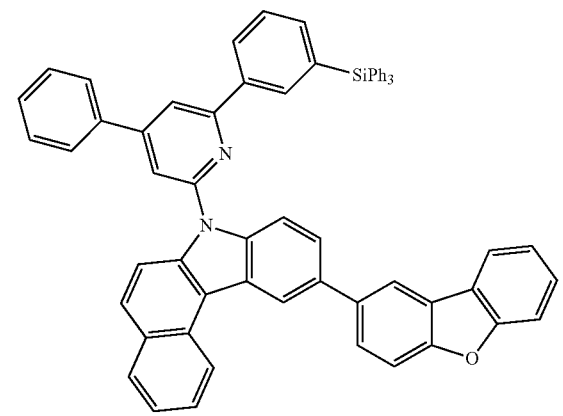

-continued
129A
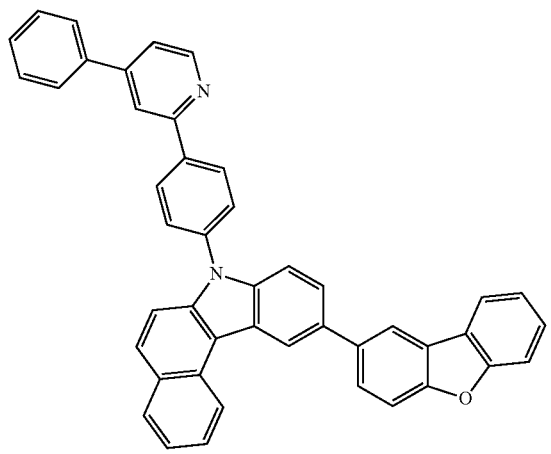
130A
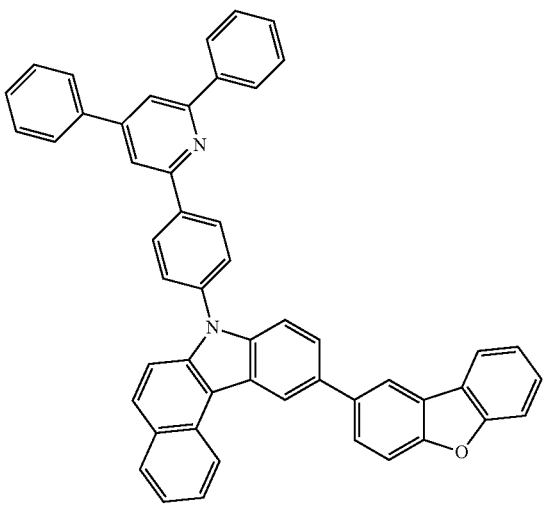
131A
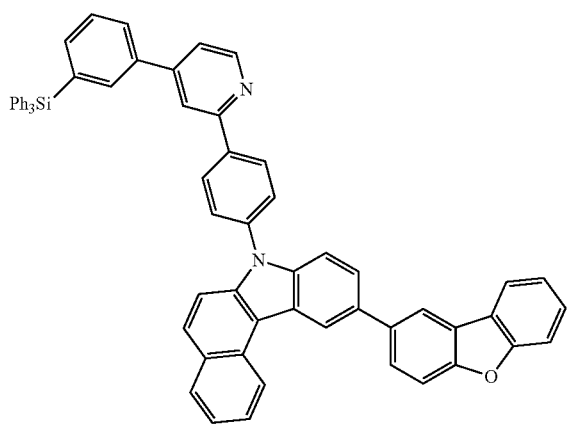
132A
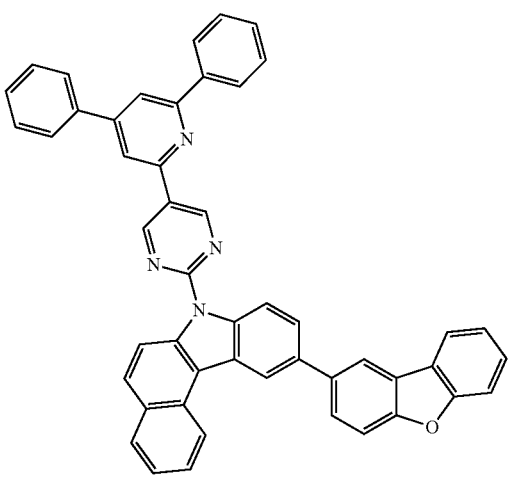
133A
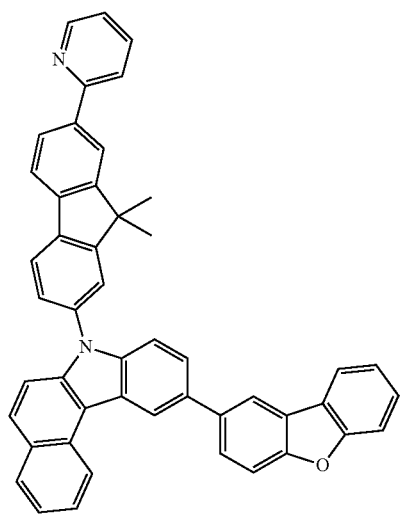
134A
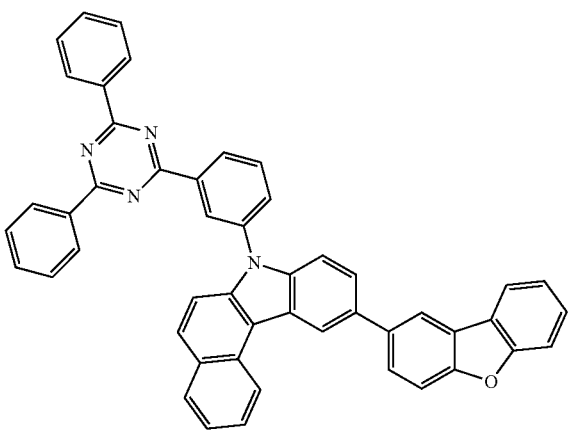

-continued
135A
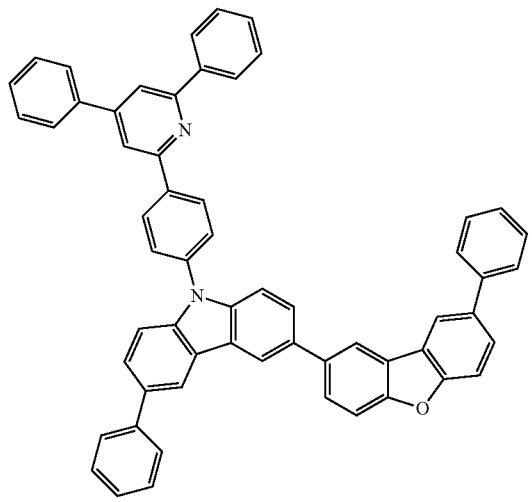
136A
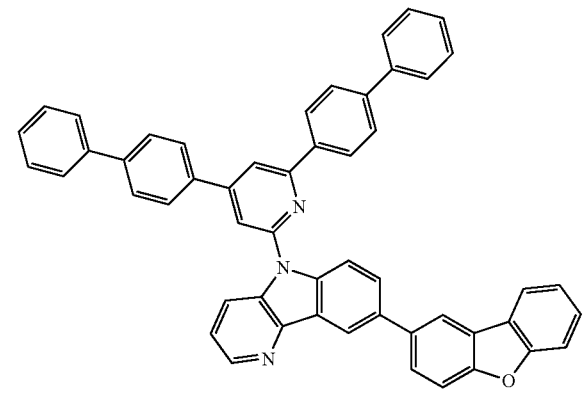
137A
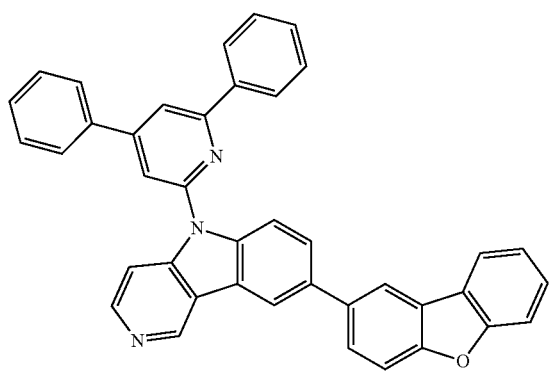
138A
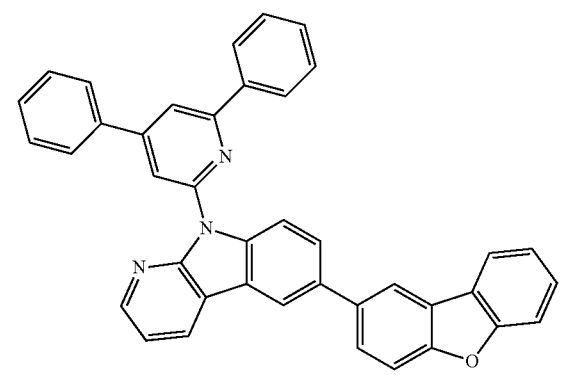
139A
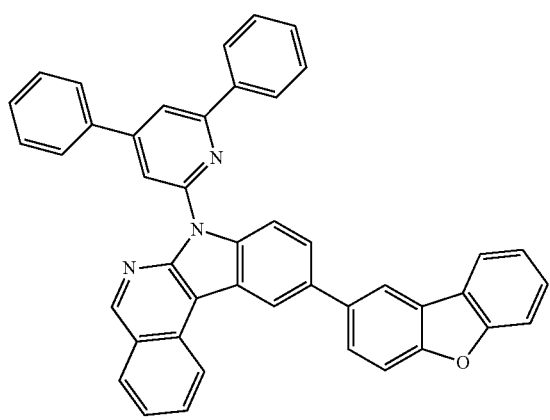
140A
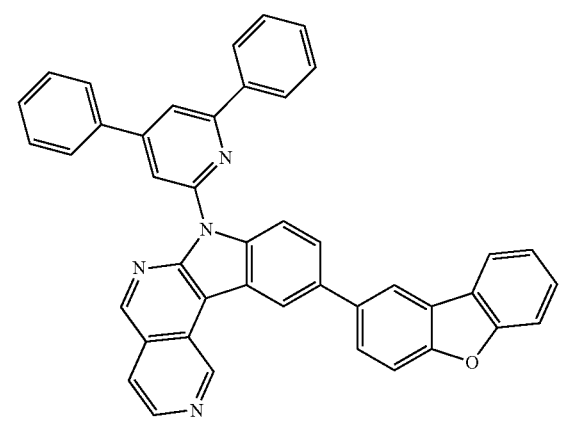

-continued
141A
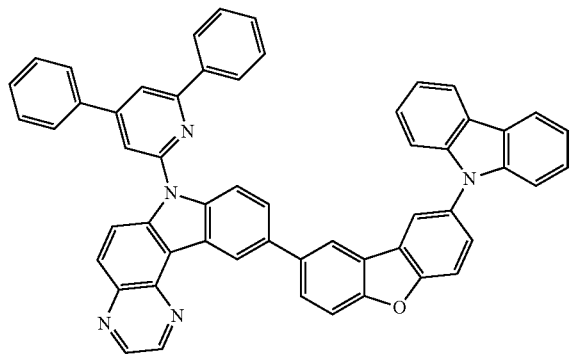
142A
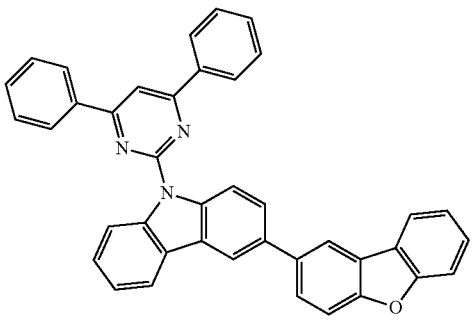
143A
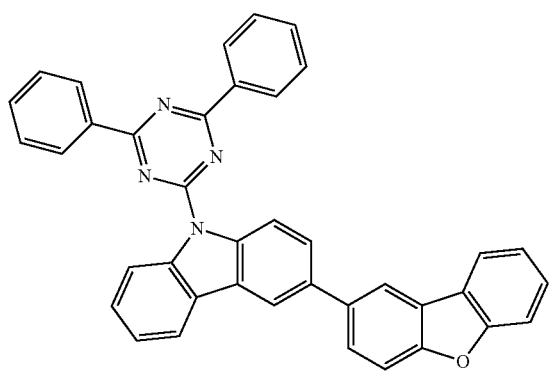
144A
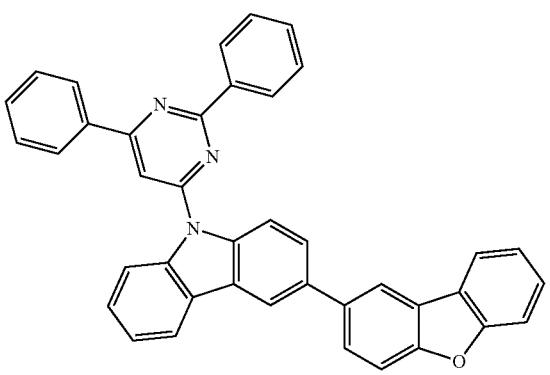
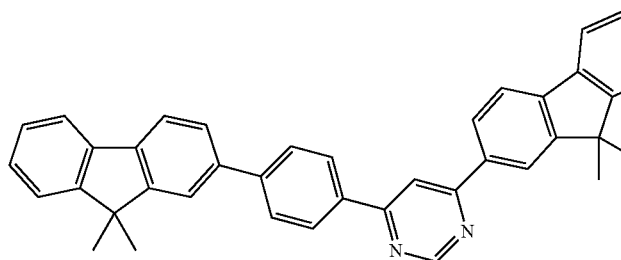
145A
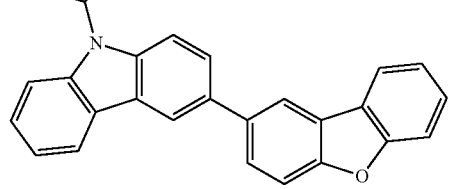
146A
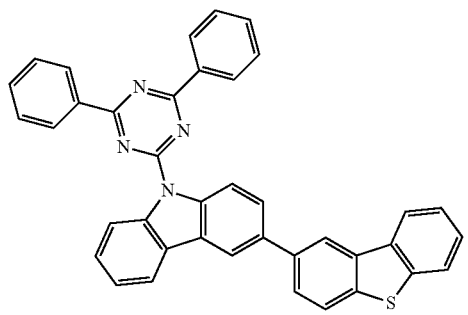
147A
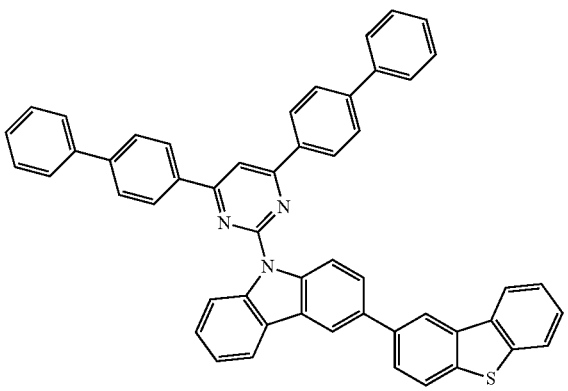

-continued
148A
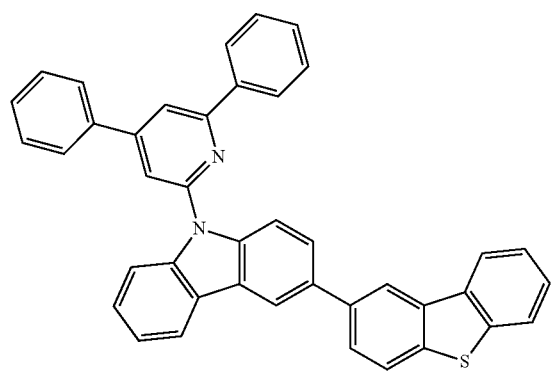
149A
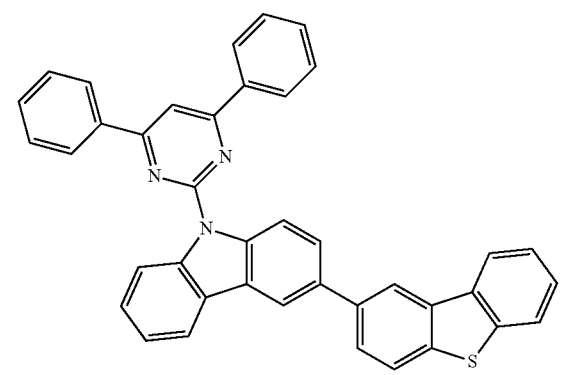
150A
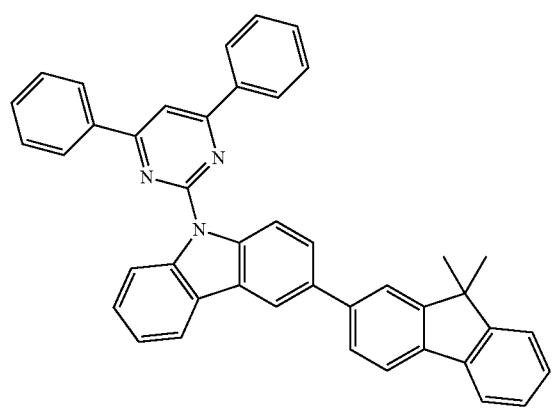
151A
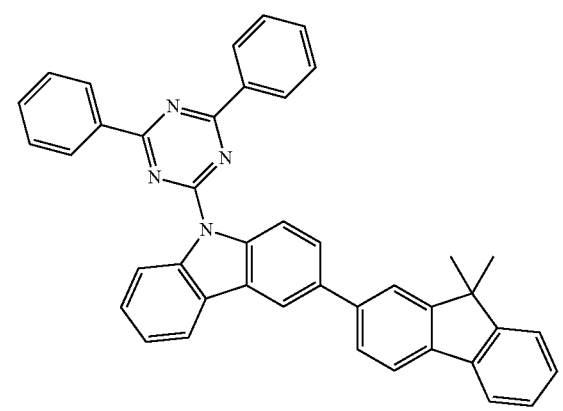
152A
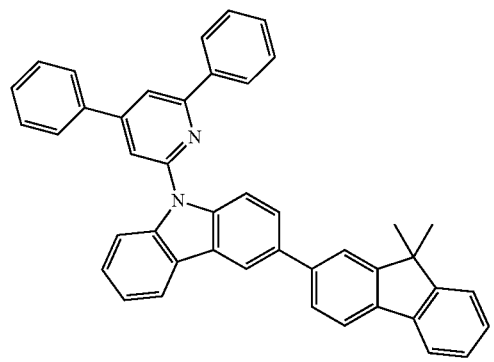
153A
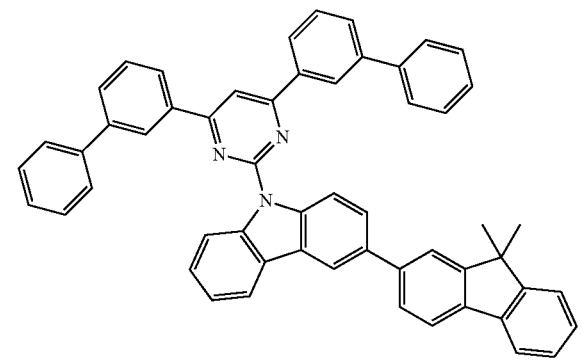

154A
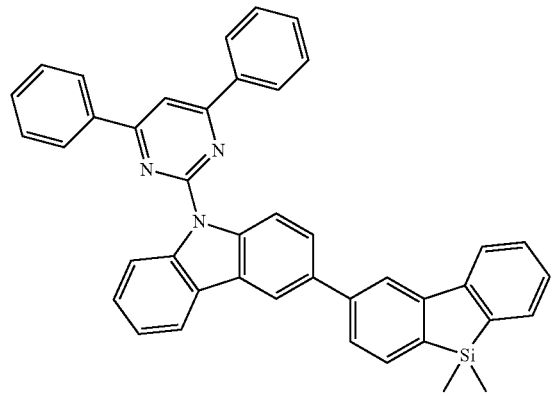
155A
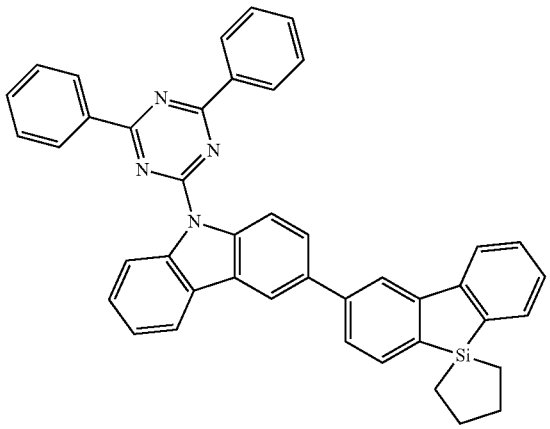
156A
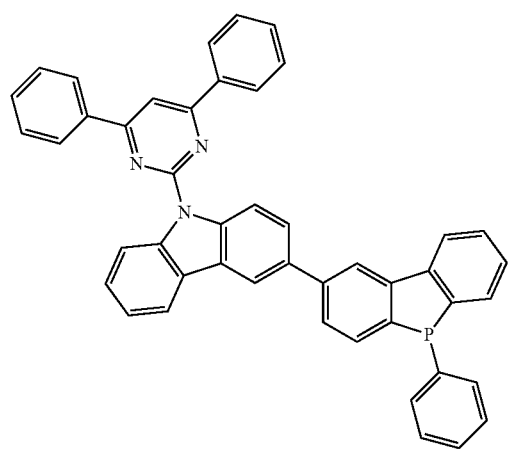
157A
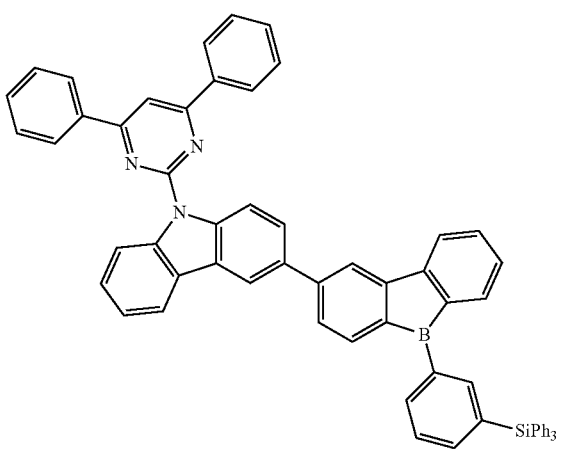
158A
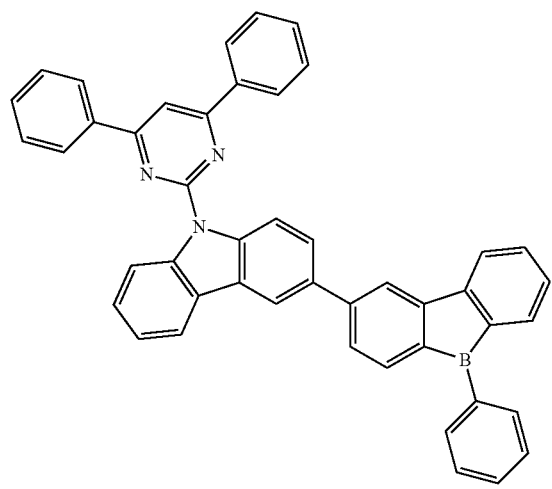
159A
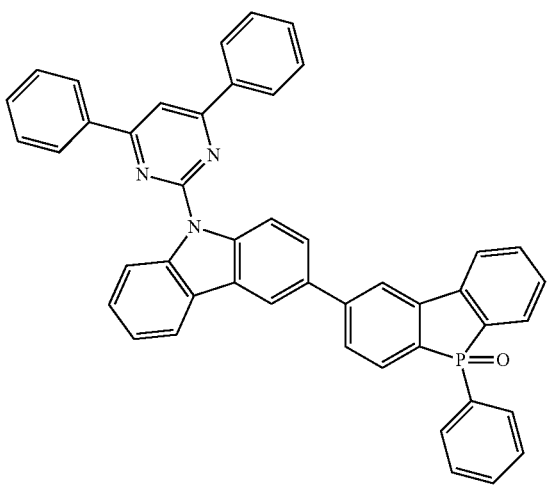

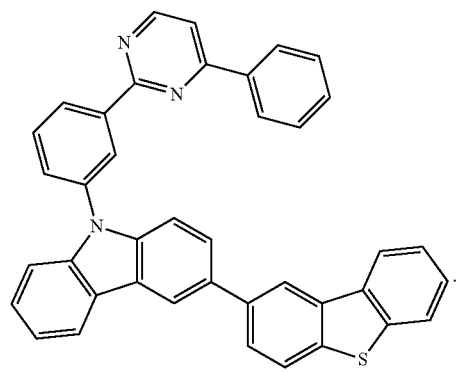
160A
In an embodiment, a compound represented by one of Formulae 10A, 10B, 10C, 10D, and 10E may be selected from Compounds 100 to 236:
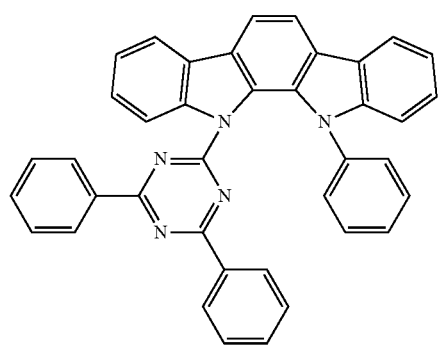
100
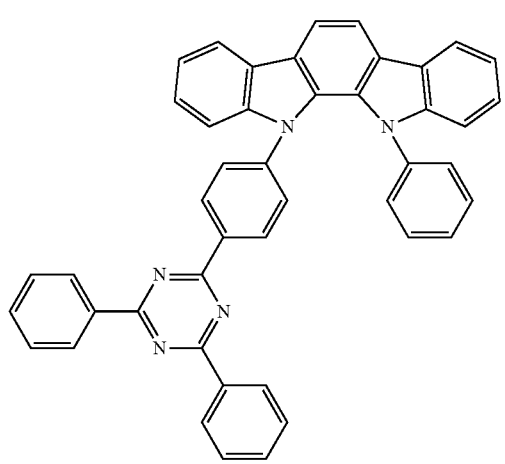
101
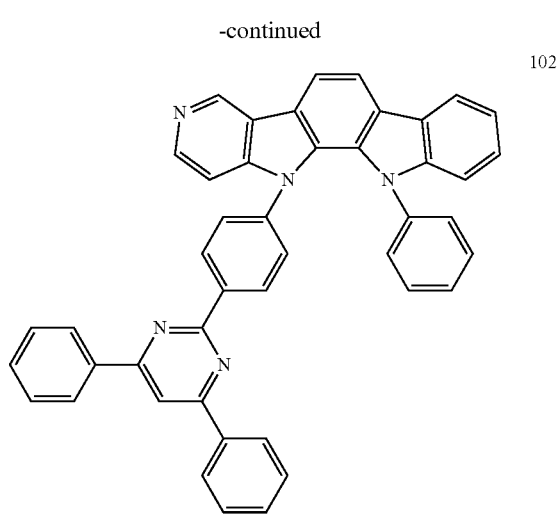
102
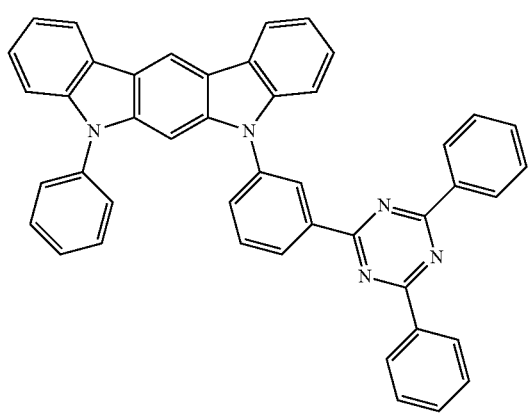
103

104
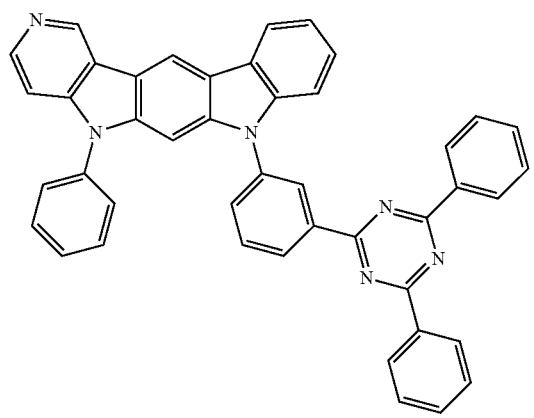
105
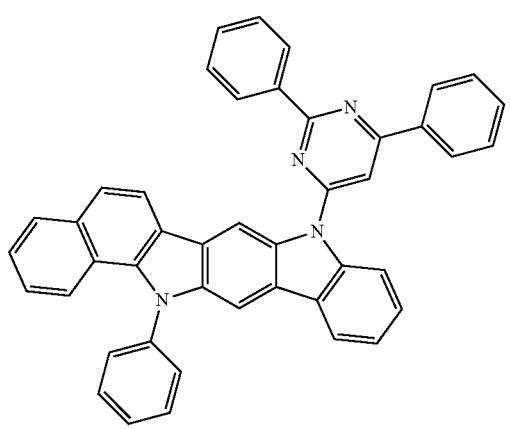
107
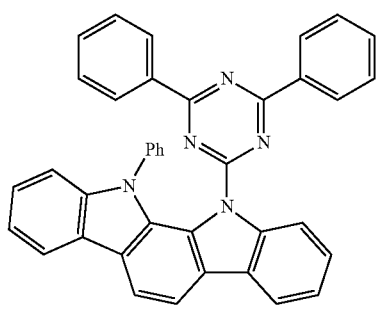
108
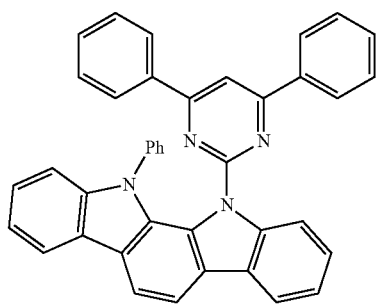
109
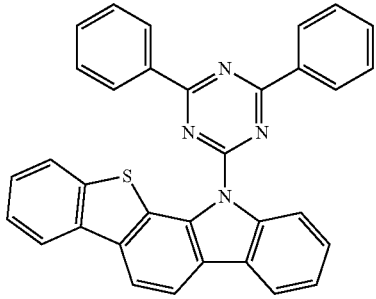
110
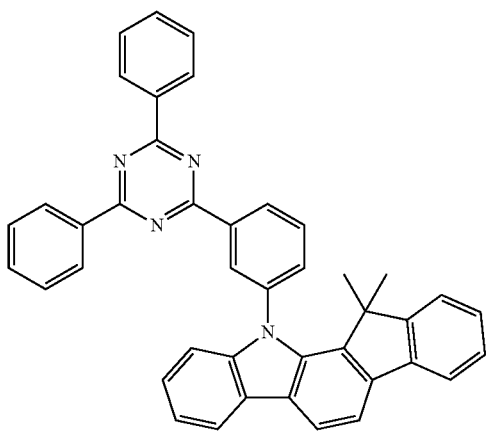
111
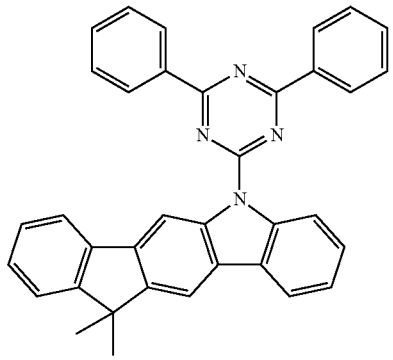
112
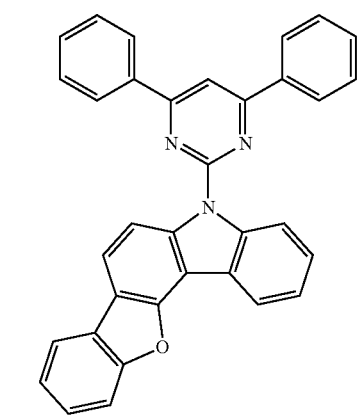

113 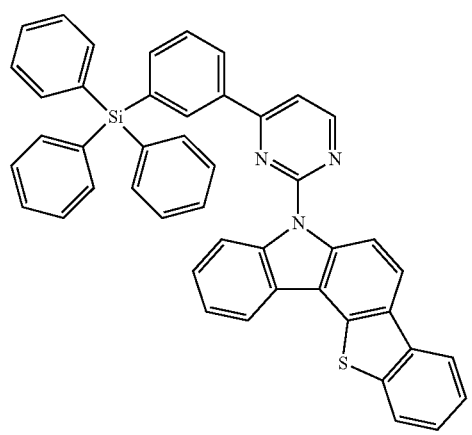
114 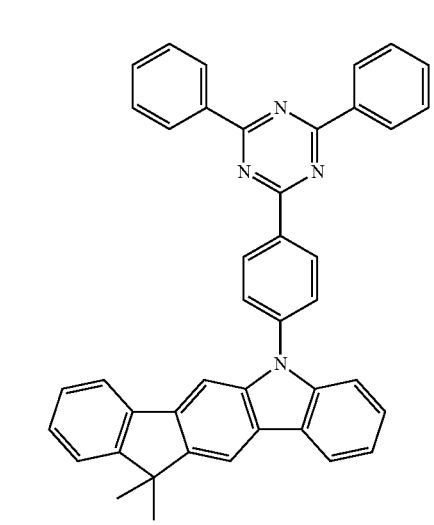
115 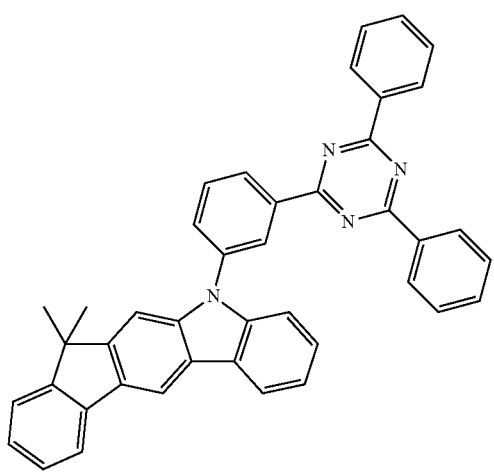
116 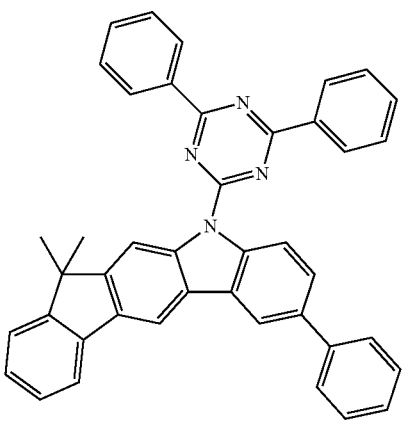
117 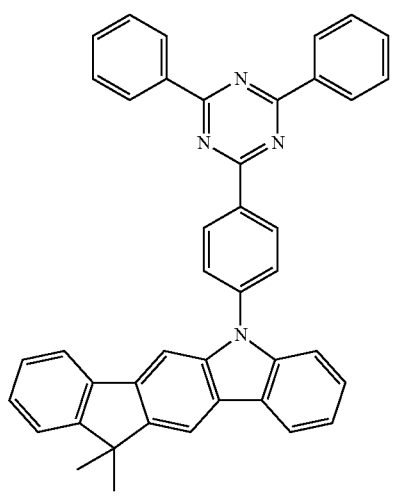
118 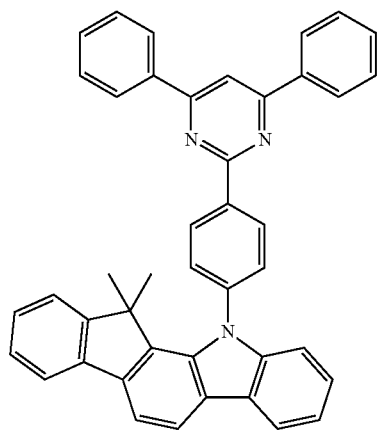

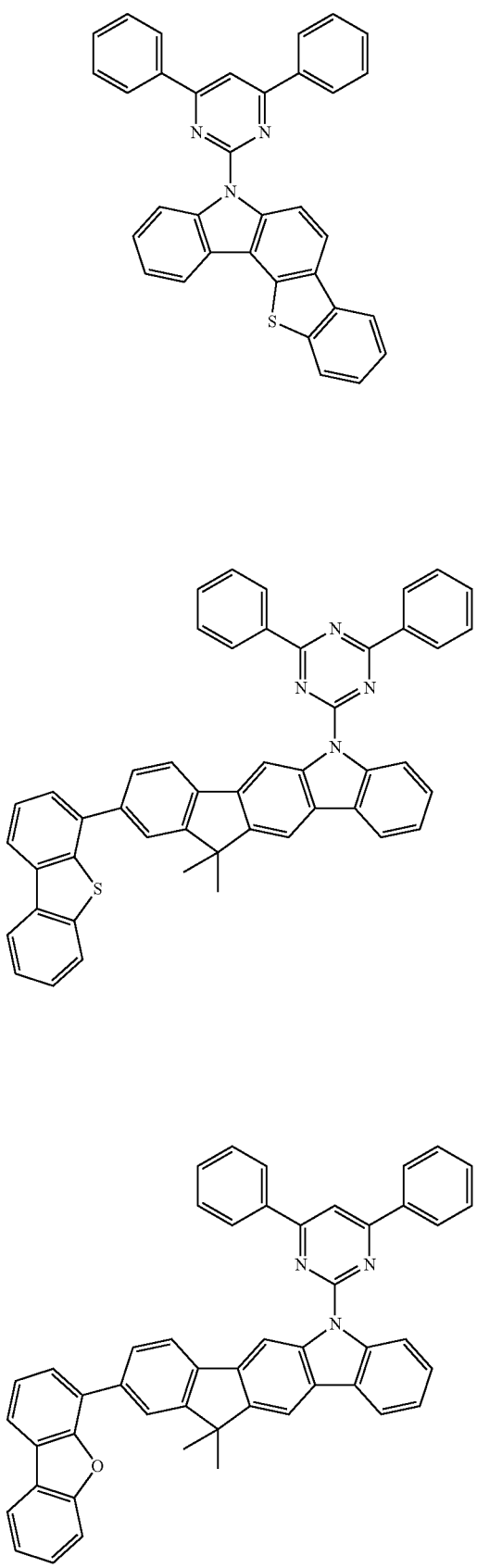
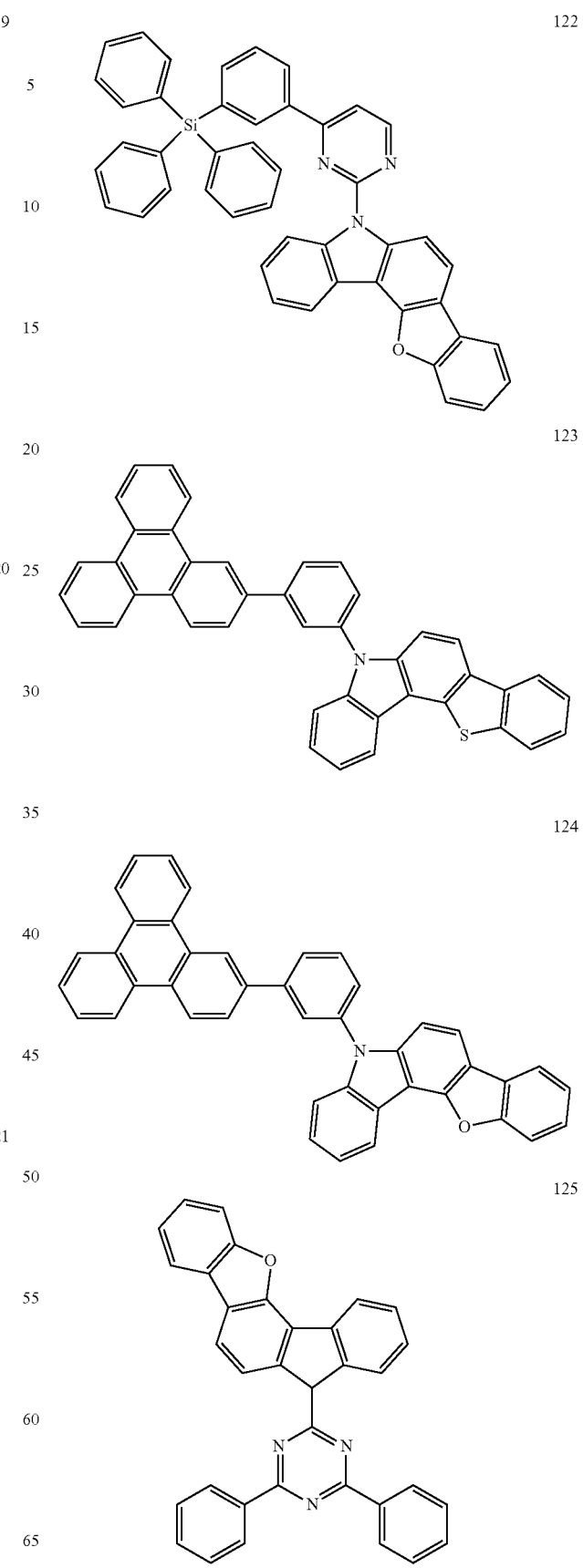

126 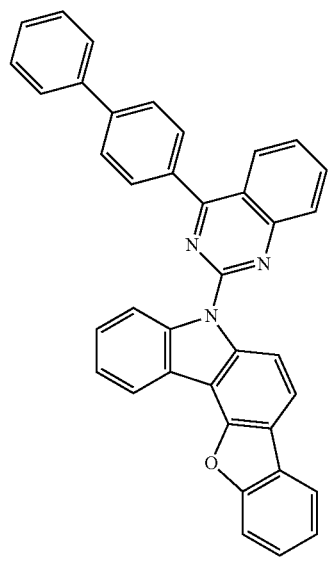
127 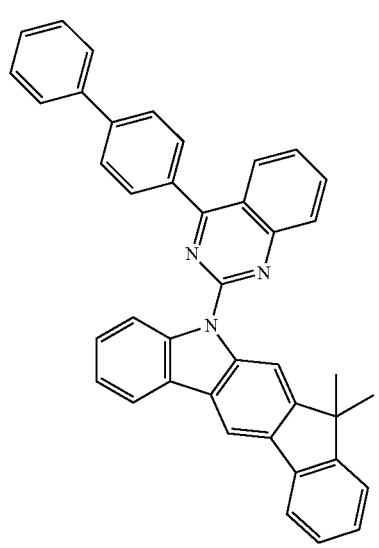
128 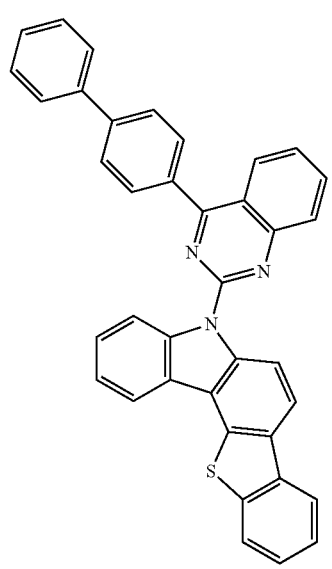
129 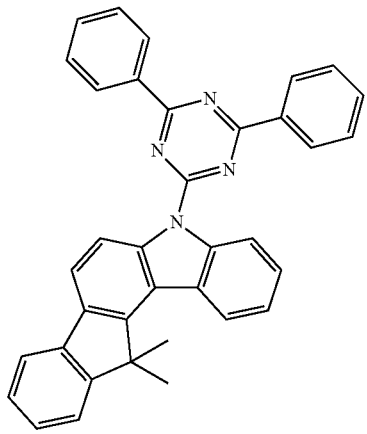
130 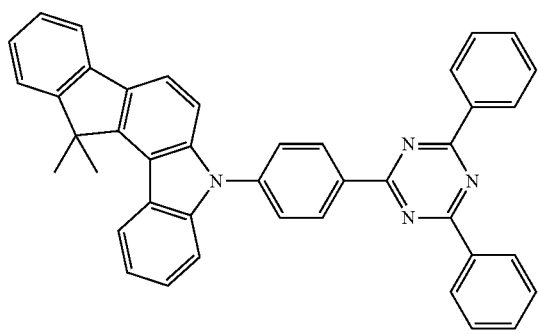
131 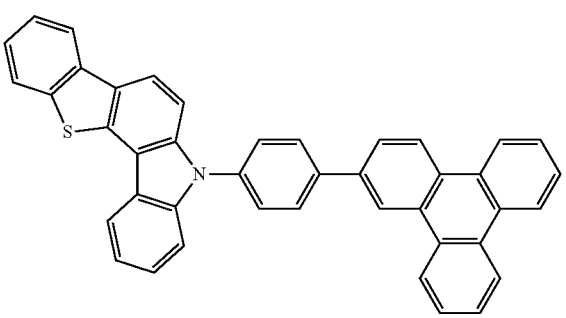
132 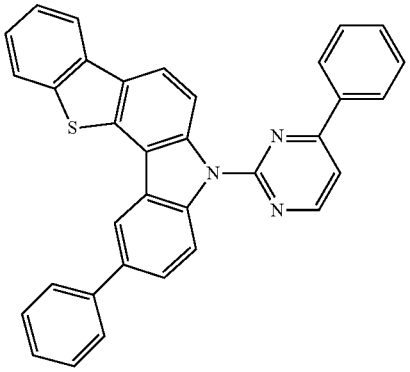

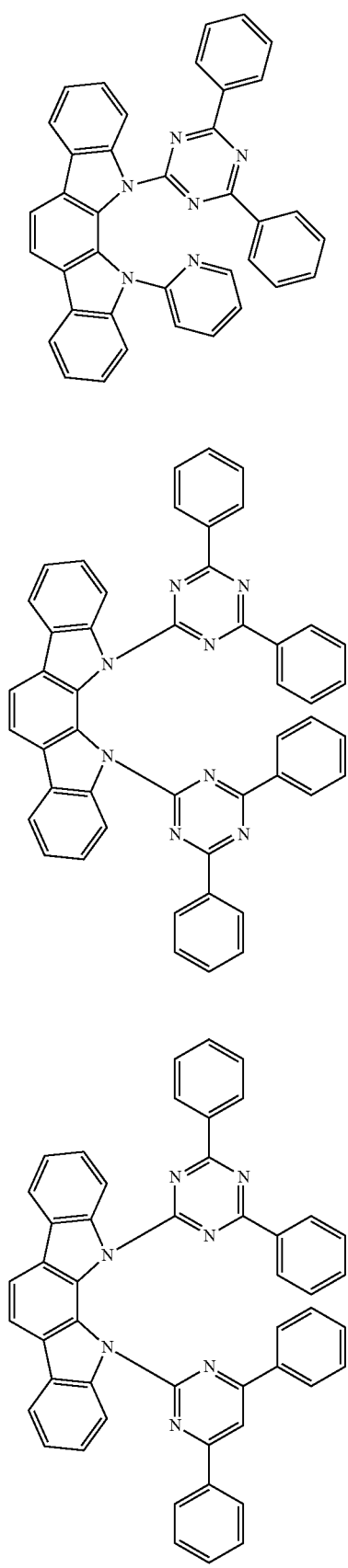
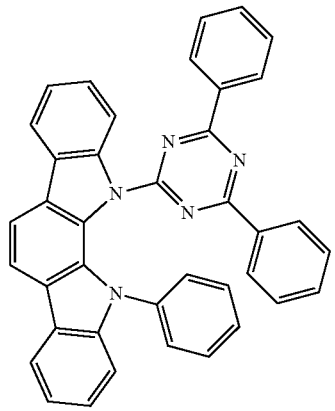
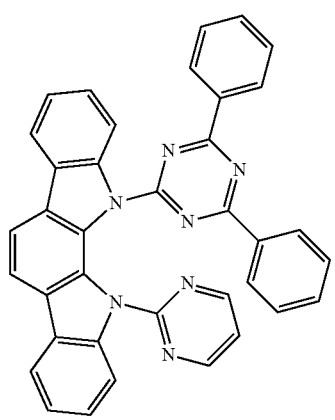
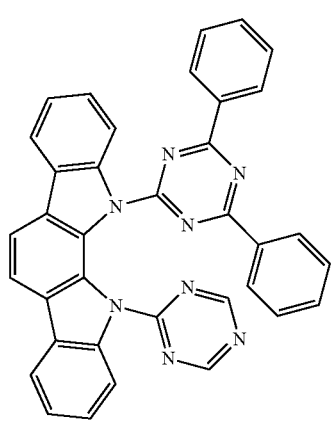
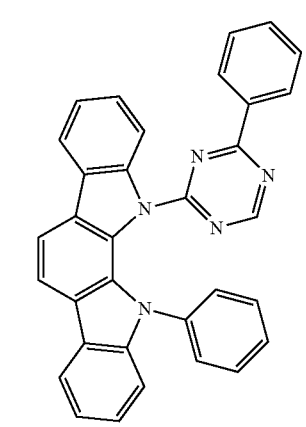

140 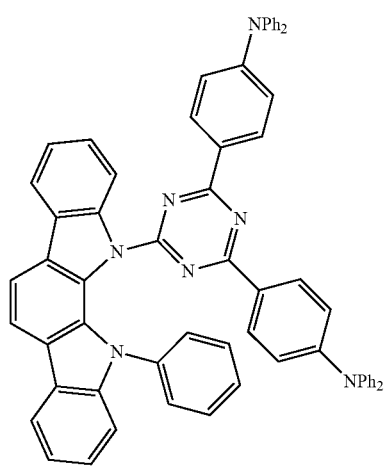
141 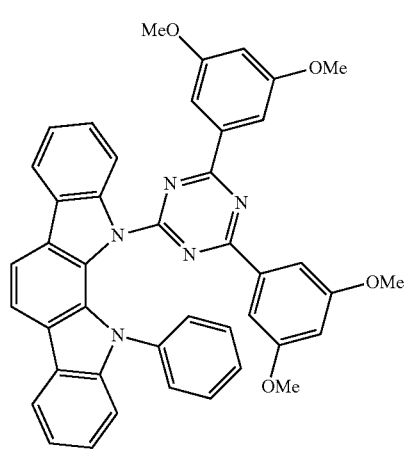
142 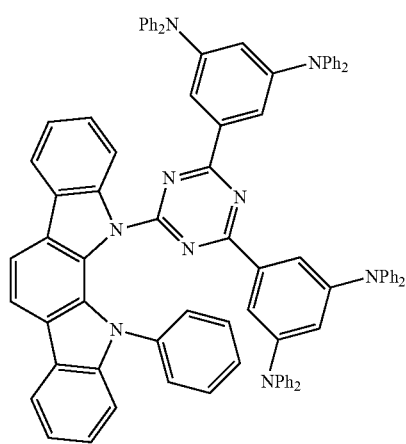
143 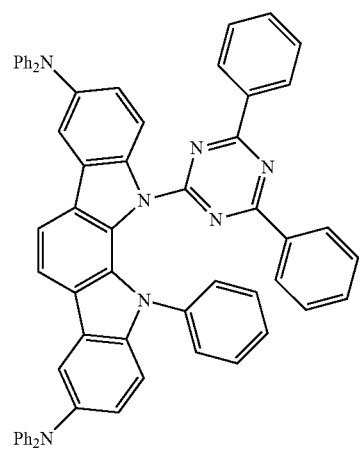
144 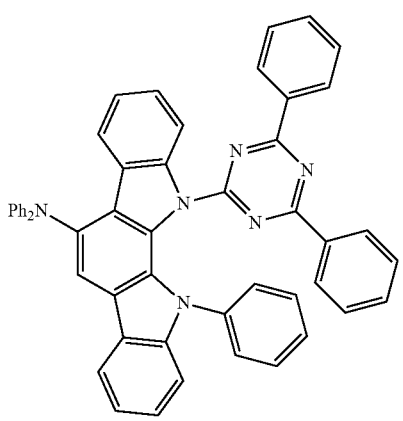
145 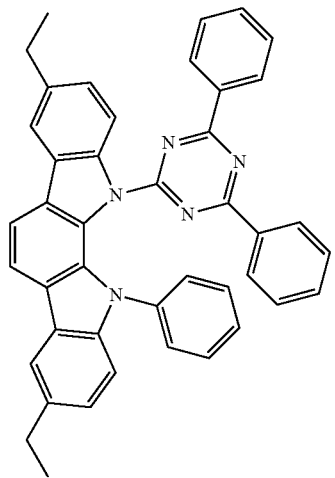

146
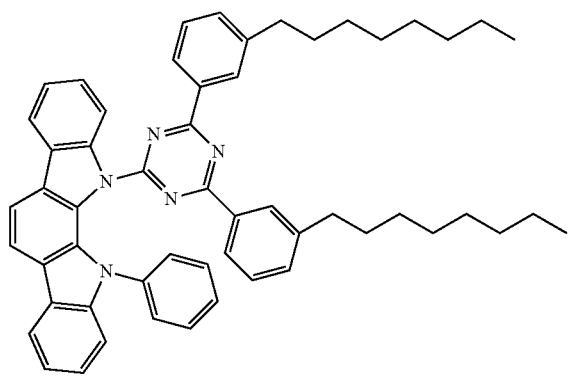
147
149
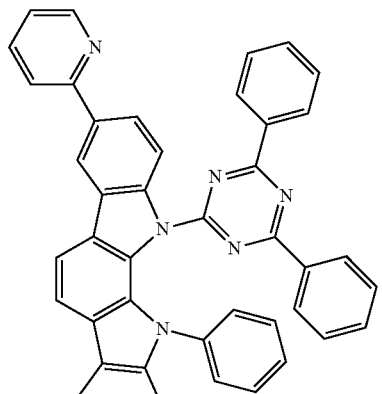
150
148
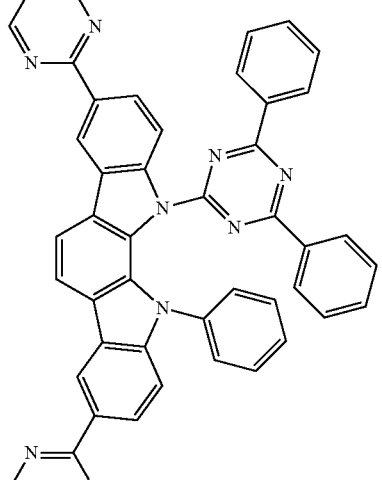
151
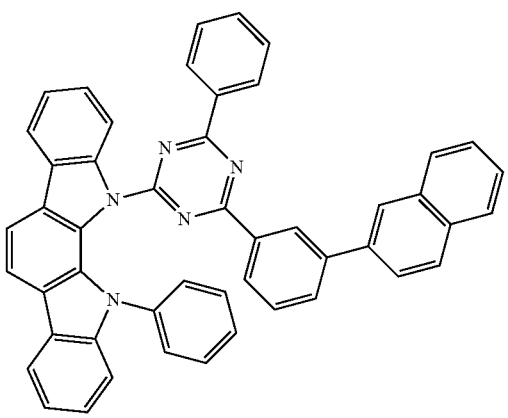

152
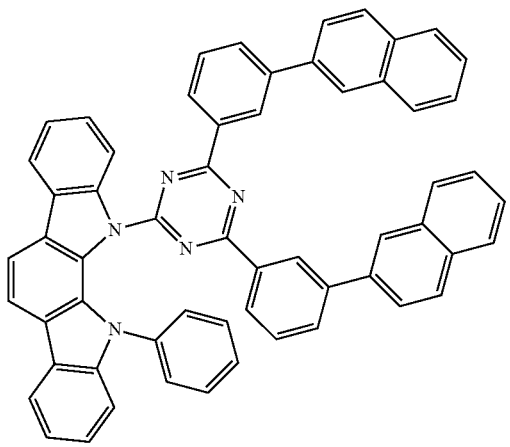
153
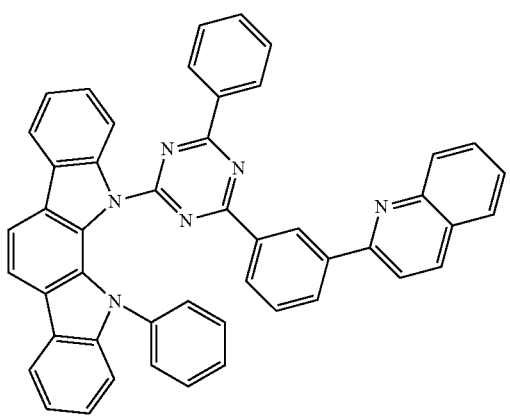
154
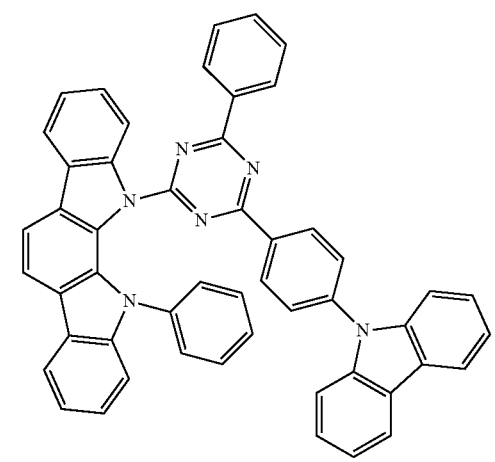
155
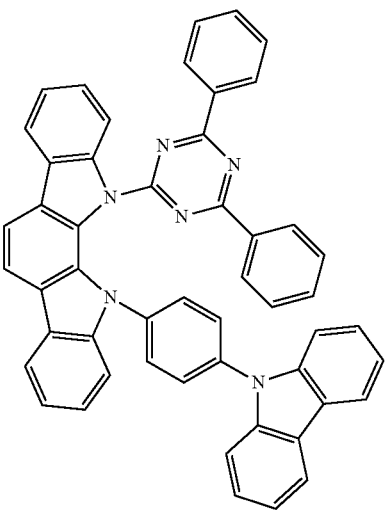
156
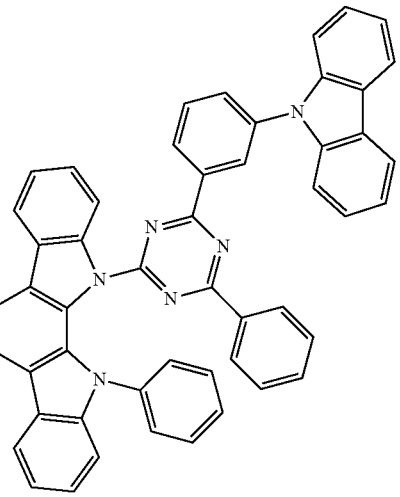
157
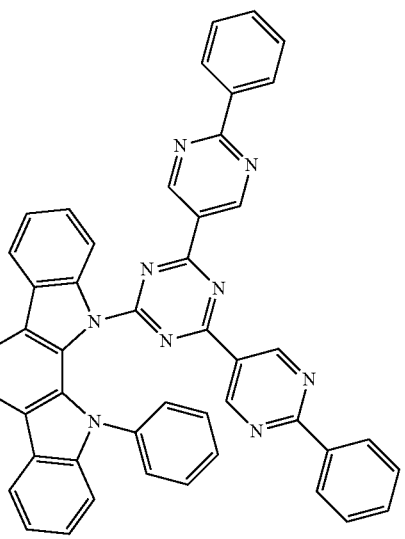

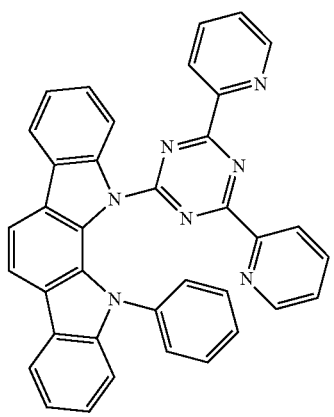
158
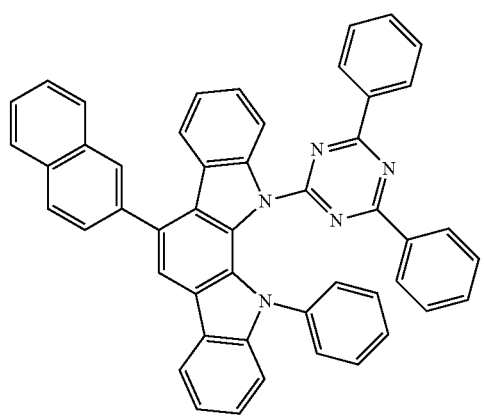
161
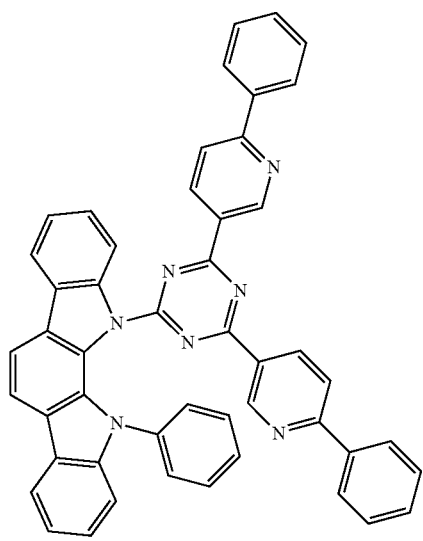
159
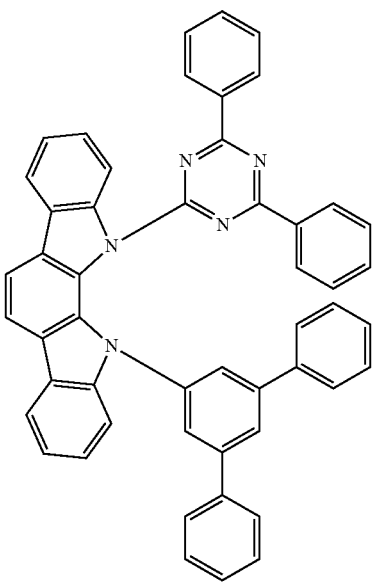
162
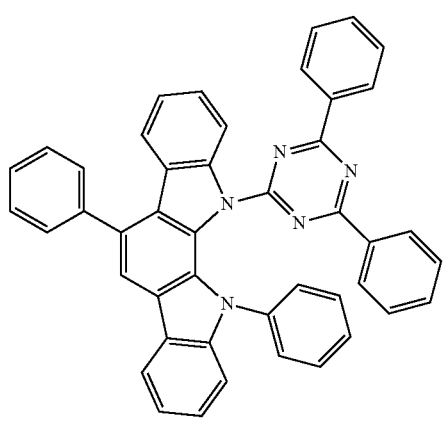
160
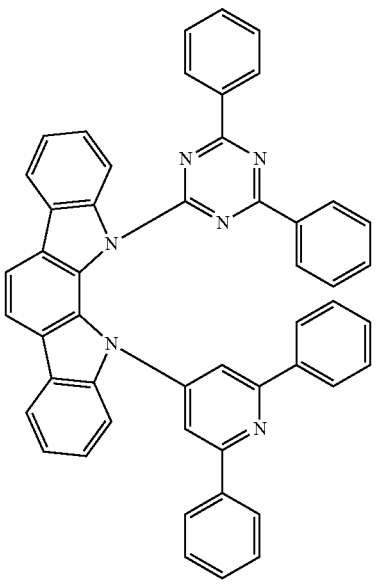
163

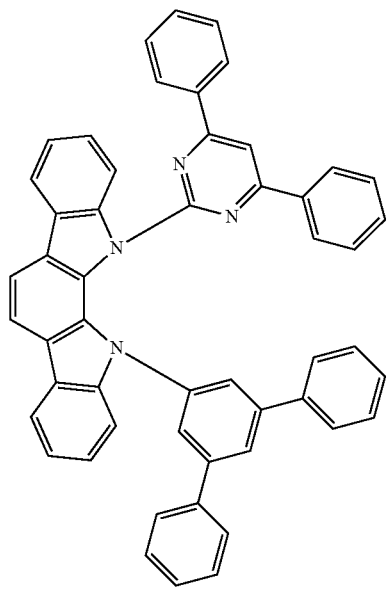
164
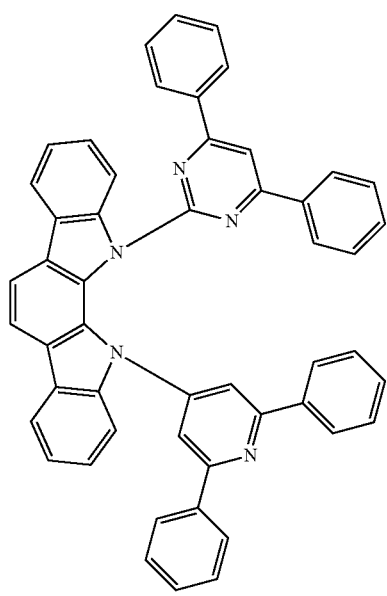
165
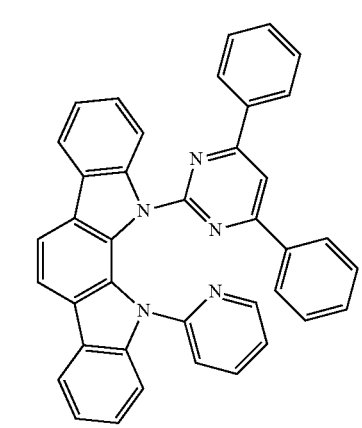
166
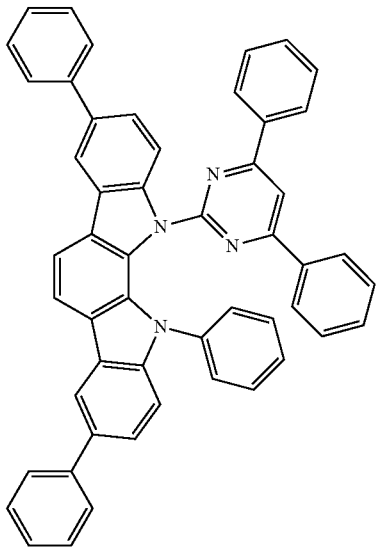
167
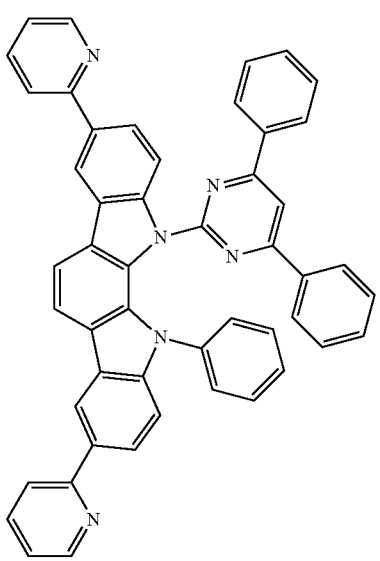
168
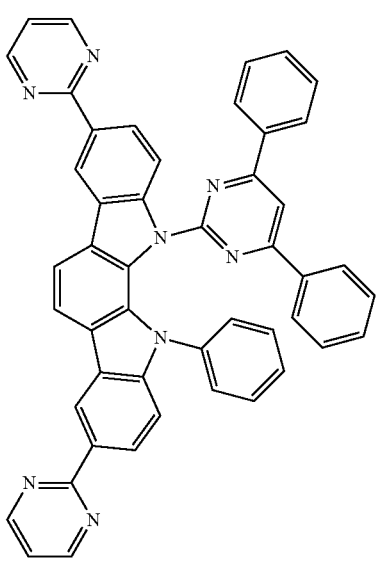
169

170
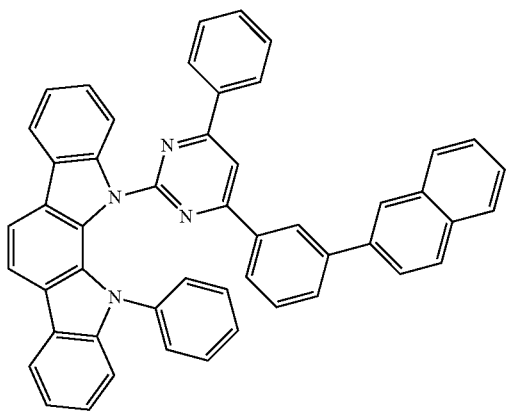
171
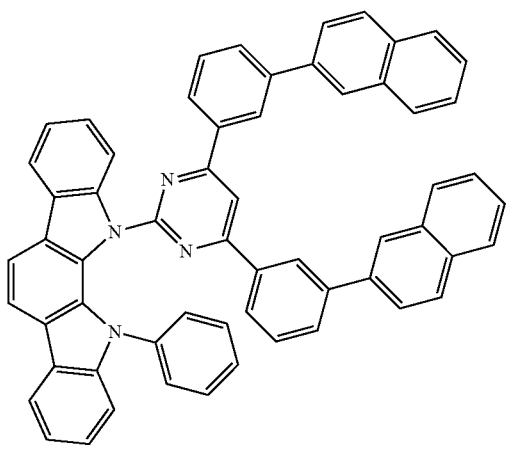
172
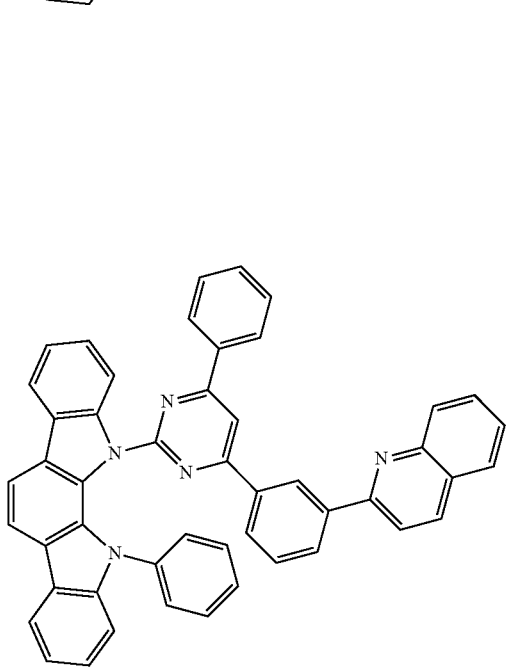
173
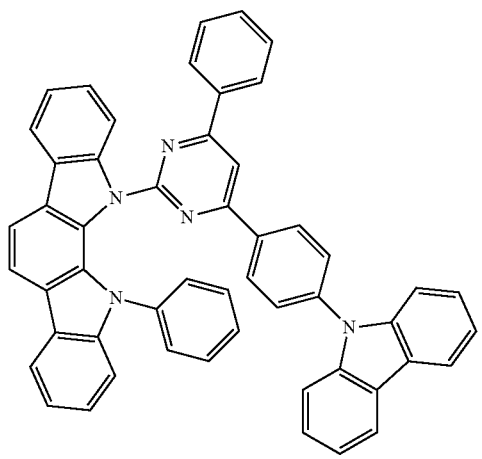
174
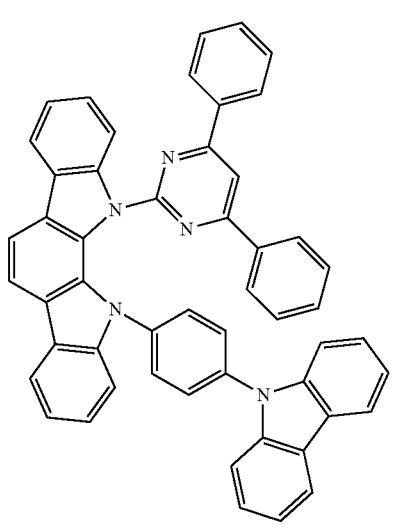
175
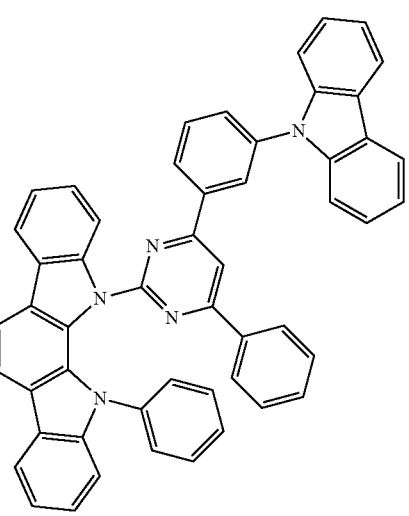

176
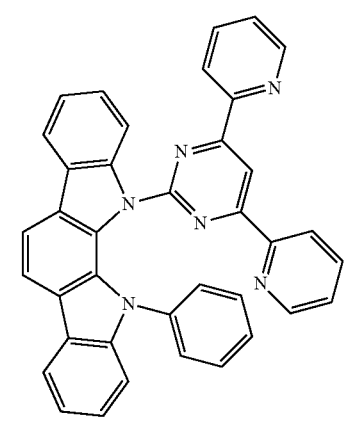
177
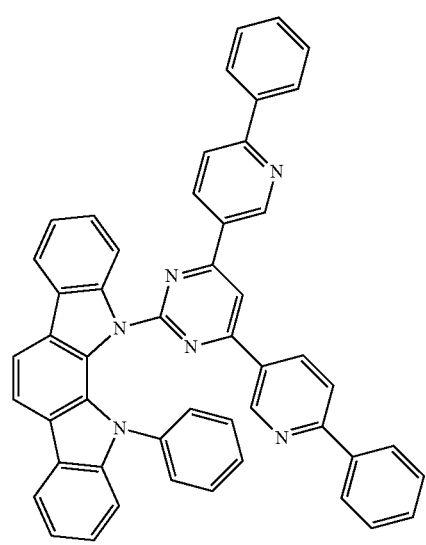
178
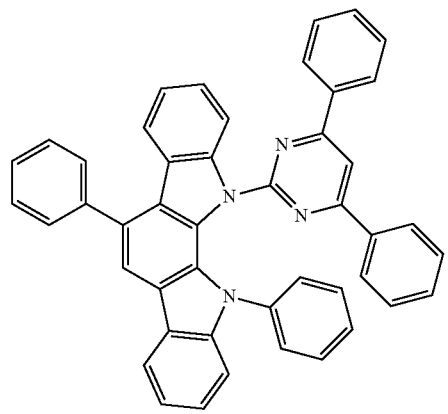
179
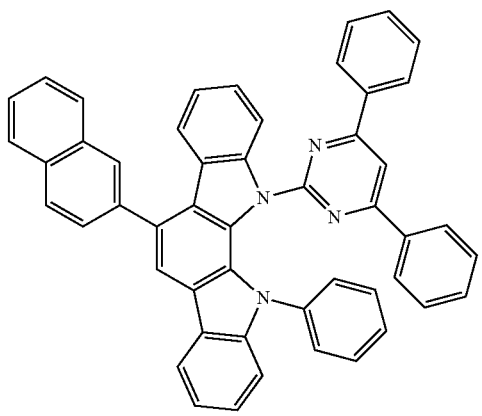
180
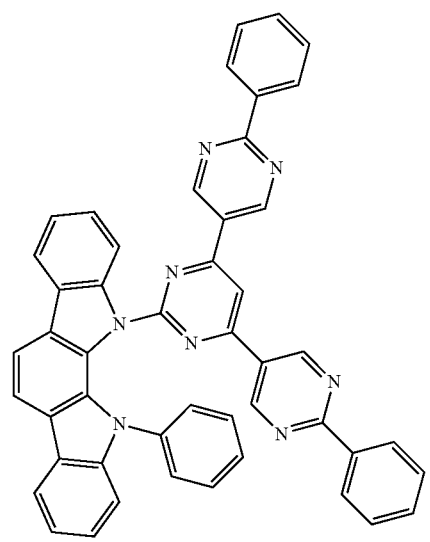
181
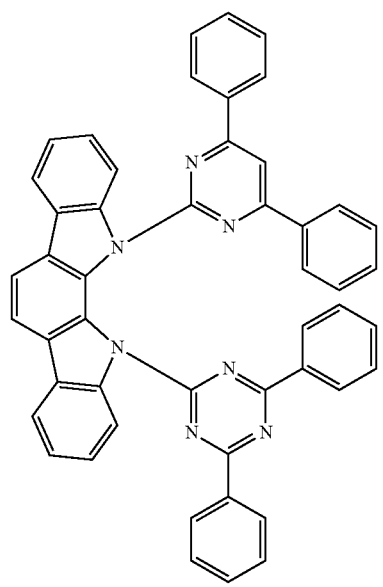

182
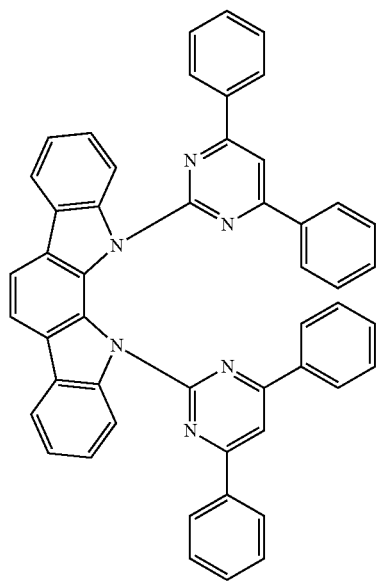
183
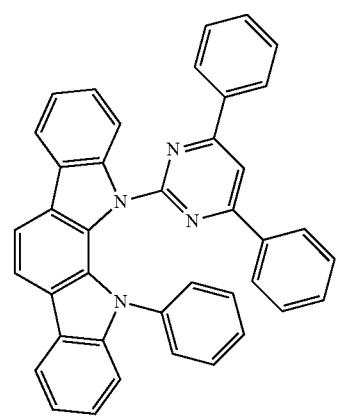
184
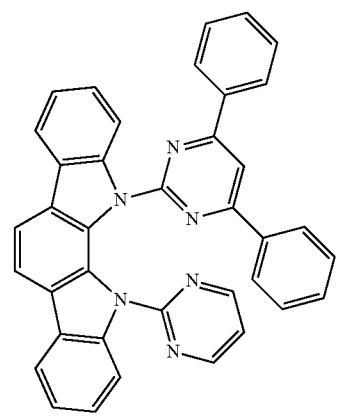
185
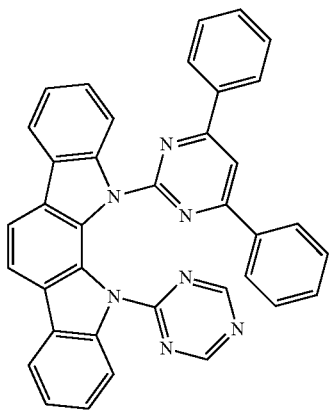
186
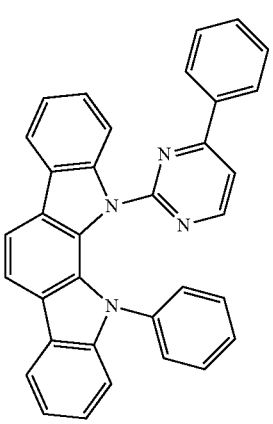
187
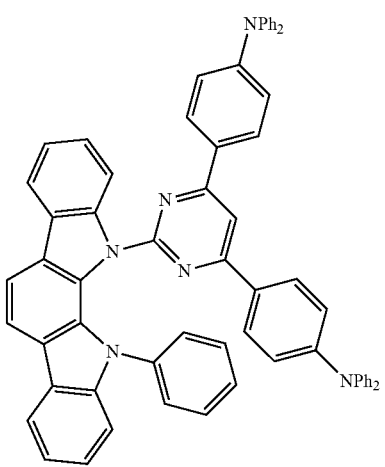

188
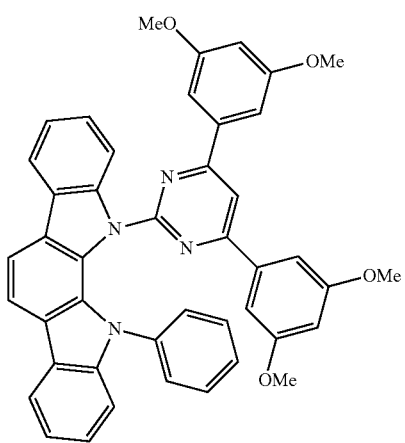
189
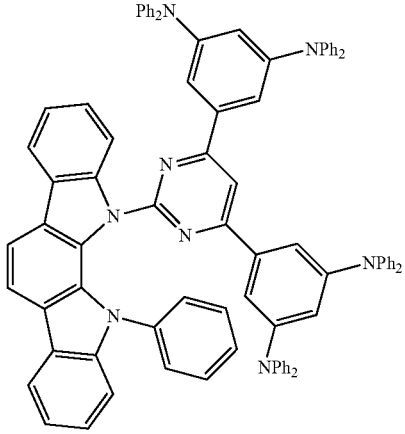
190
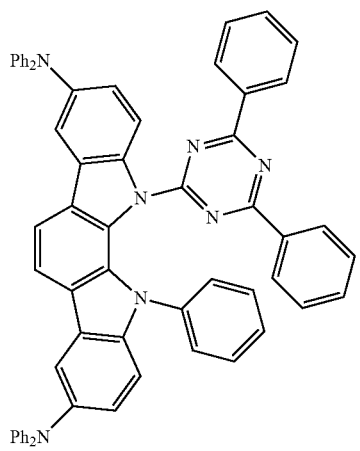
191
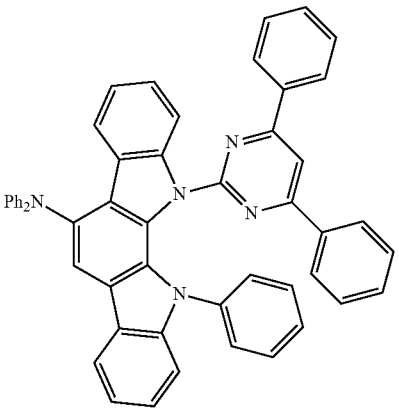
192
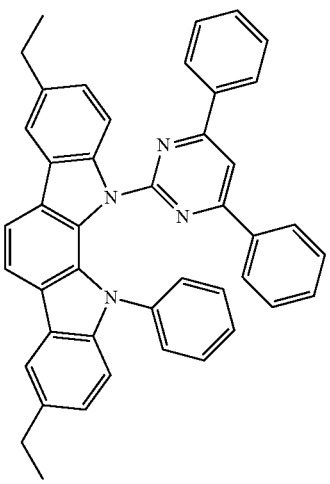
193
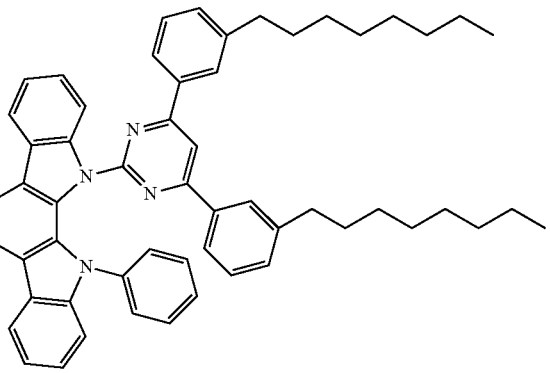

-continued
194
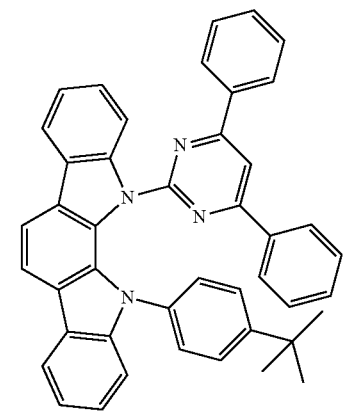
195
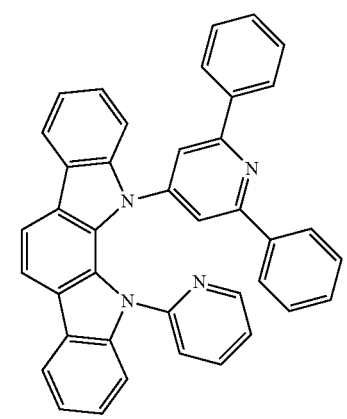
196
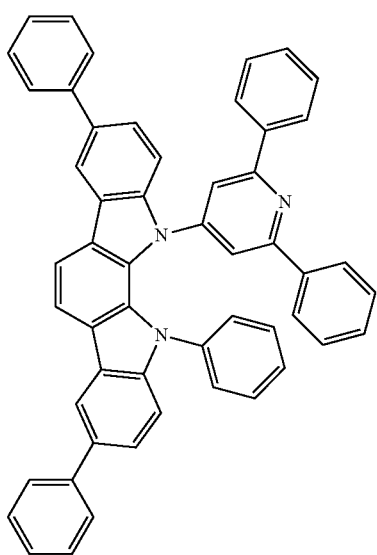
-continued
197
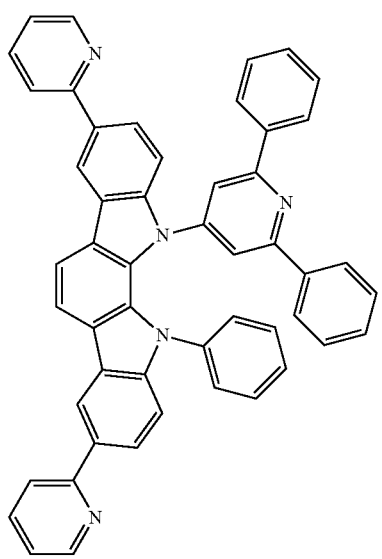
198
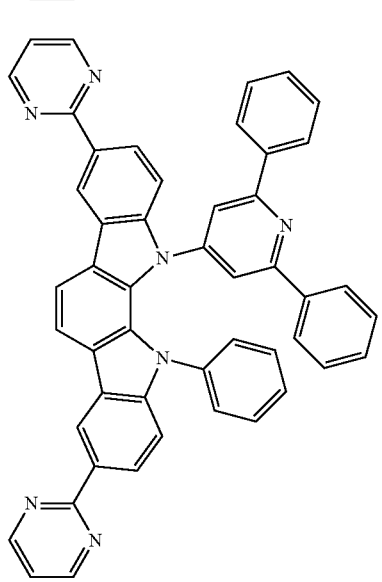
199
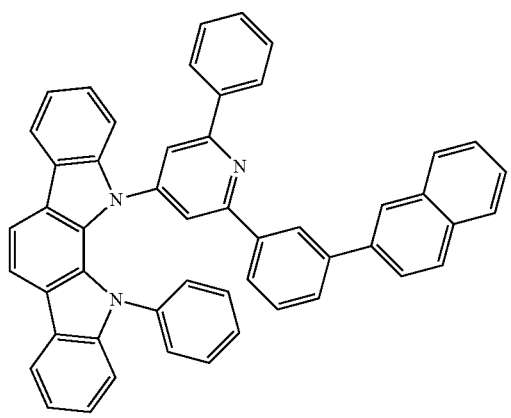

200
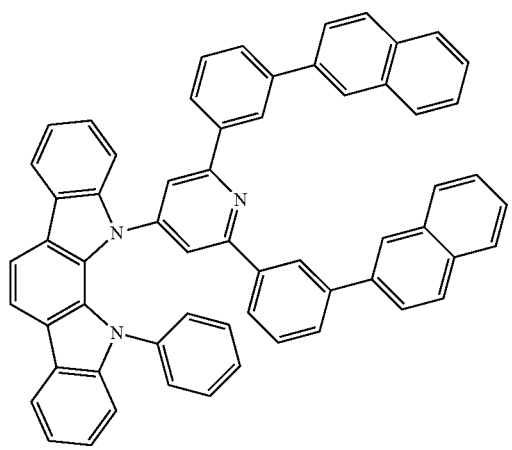
201
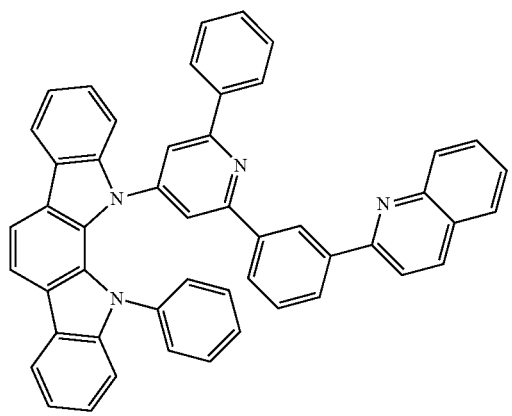
202
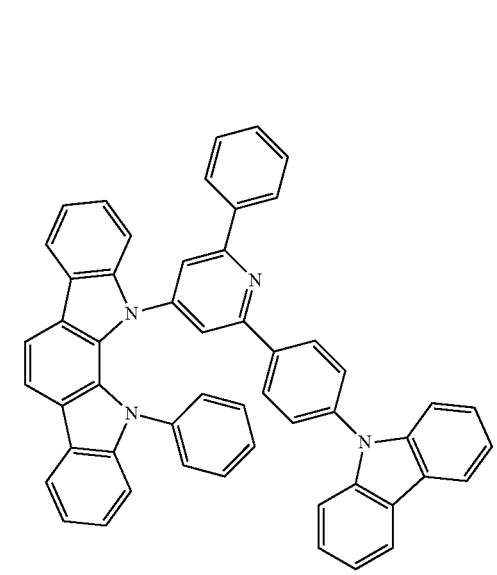
203
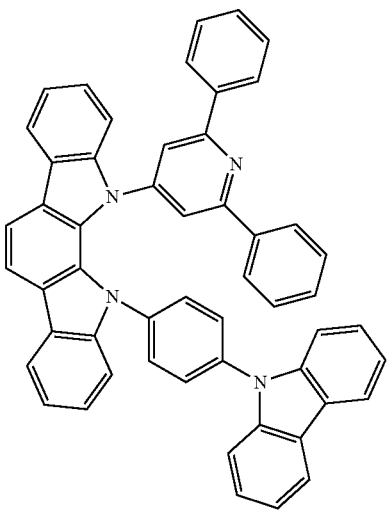
204
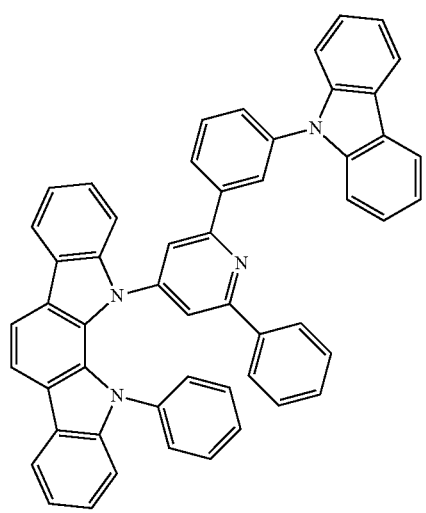
205
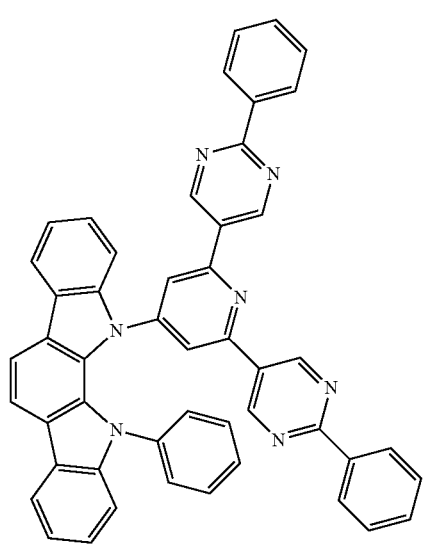

206
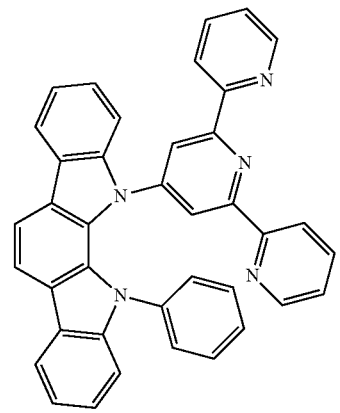
207
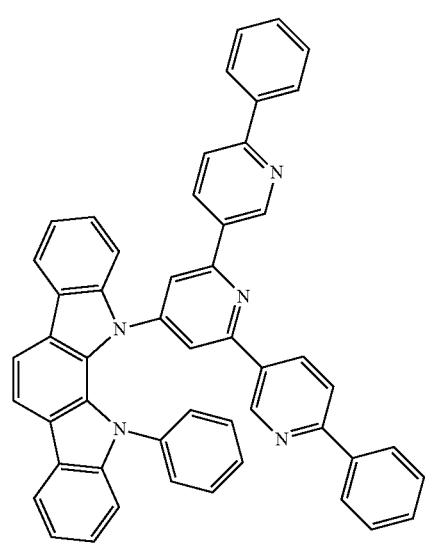
208
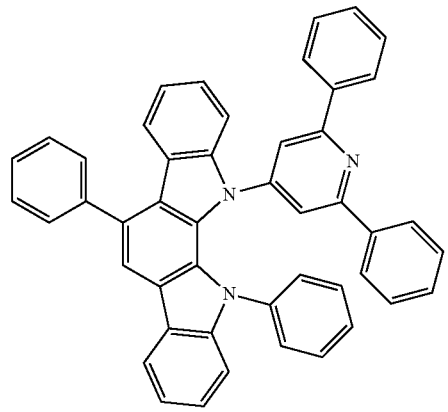
209
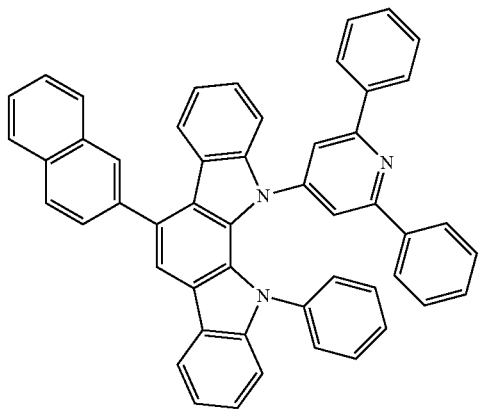
210
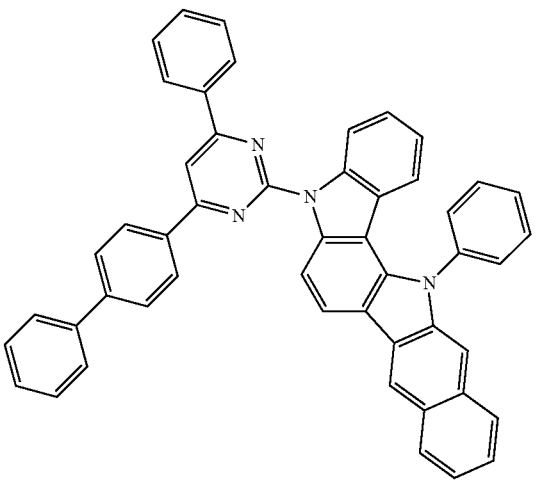
211

US 9,525,141 B2
-continued
212
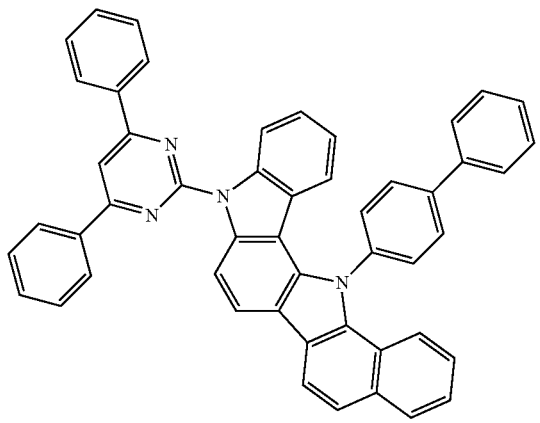
213
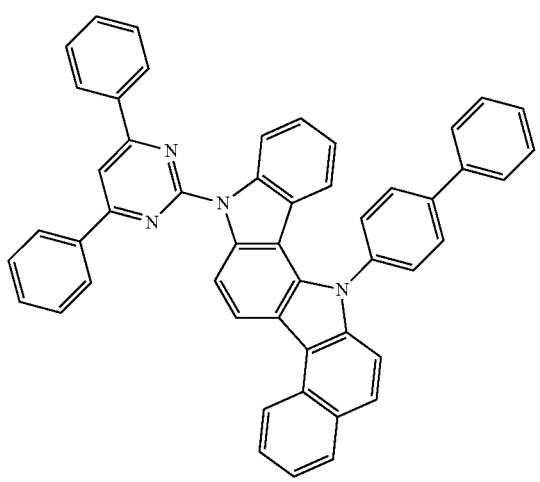
214
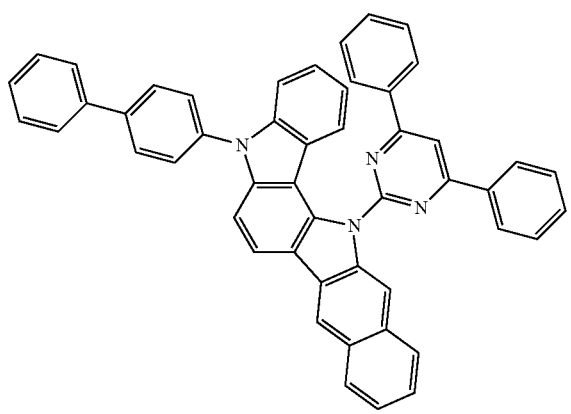
-continued
215
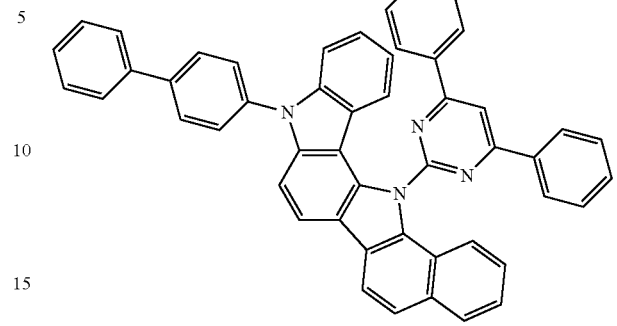
216
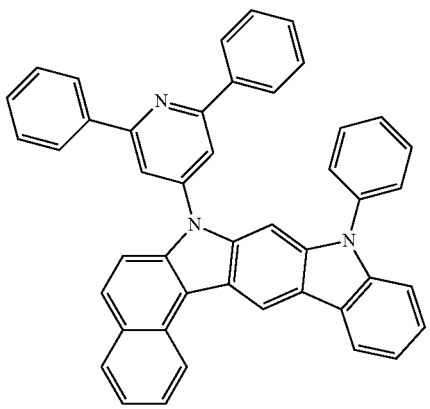
217
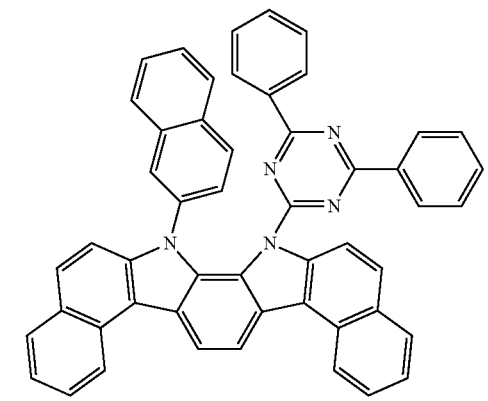
218
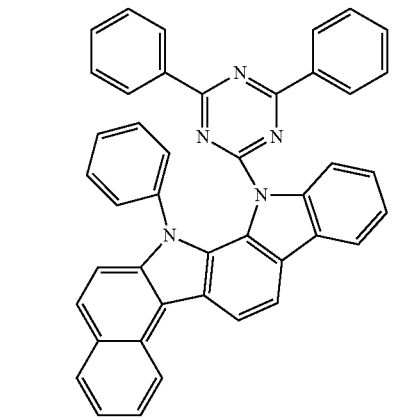

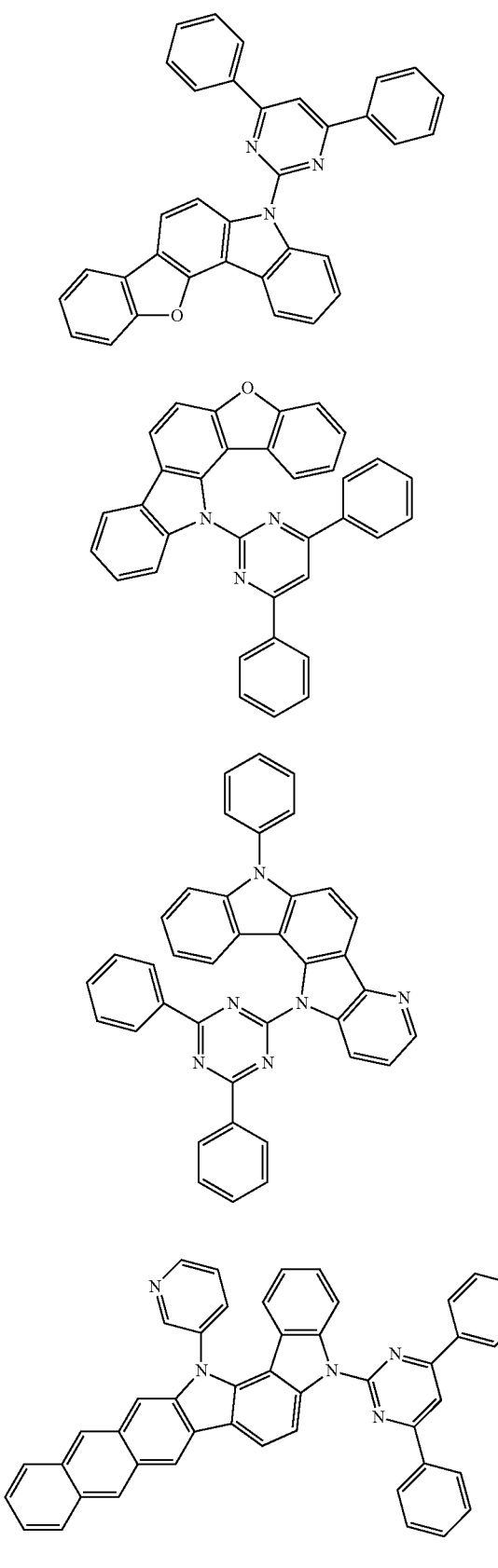

226
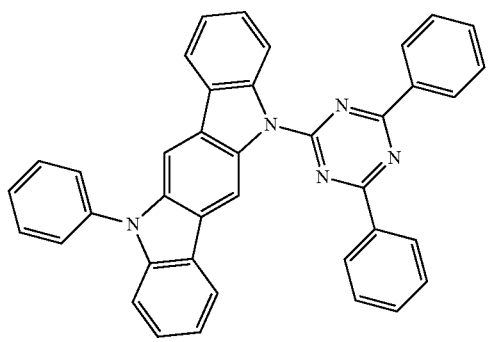
230
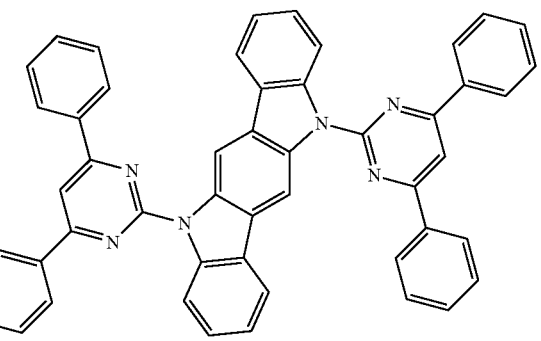
227
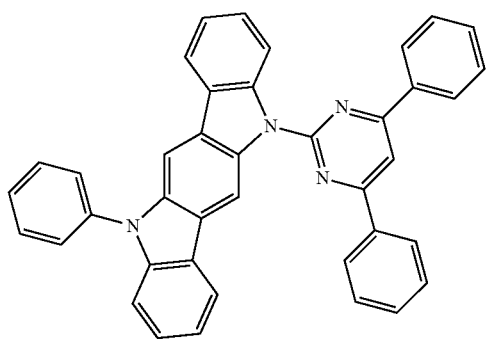
231
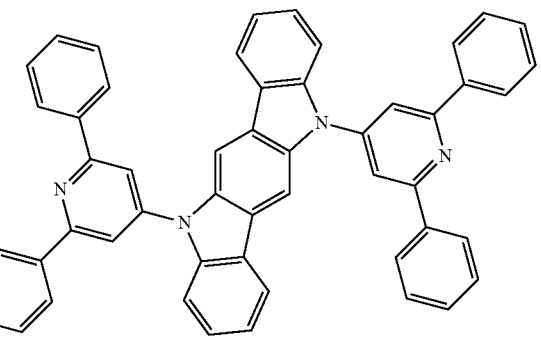
228
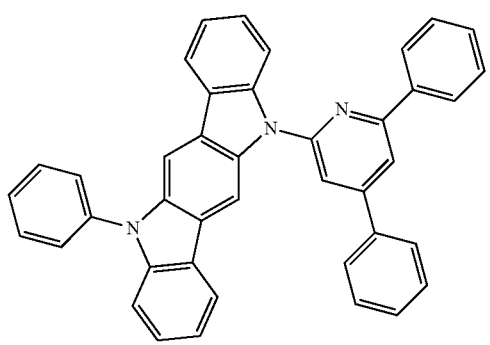
232
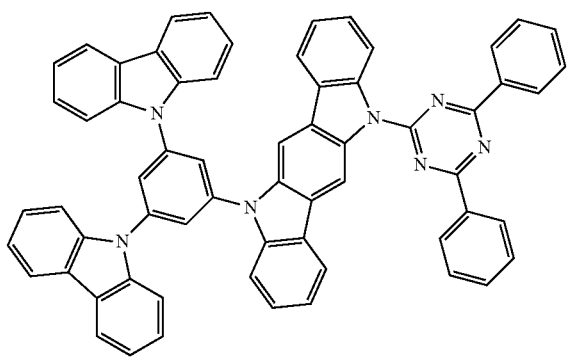
229
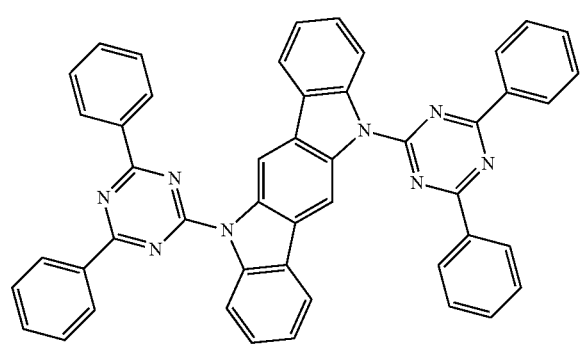
233
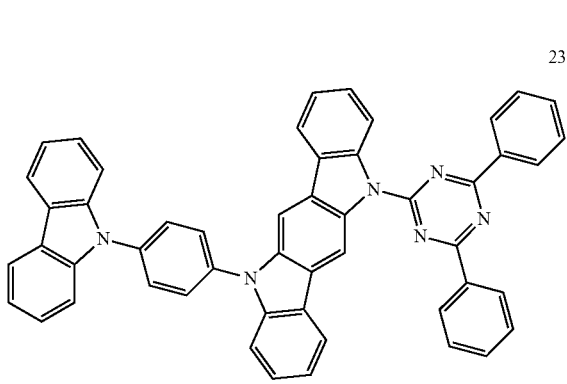

234

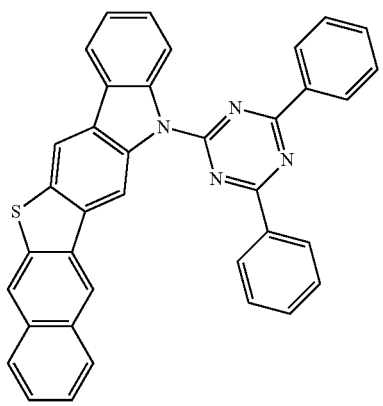

235

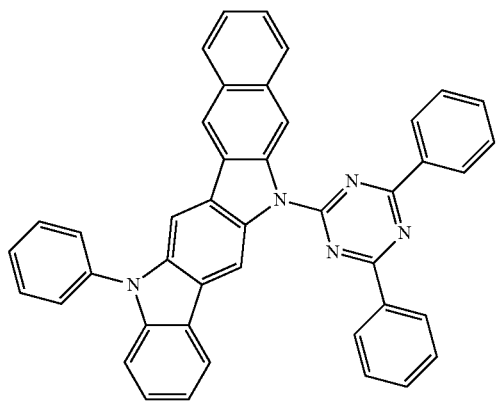

236

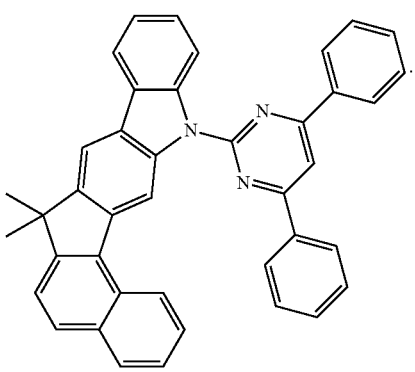

The organic light-emitting device 10 including the amine-based compound represented by one of Formulae 1A and 1C in the hole transporting region 13, and a compound represented by one of Formulae 2, 10A, 10B, 10C, 10D, and 10E in the EML 15 may have a low driving voltage, a high brightness, a long lifespan, and an excellent color purity.

The compound represented by one of Formulae 2, 10A, 10B, 10C, 10D, and 10E may serve as a host in the EML 15.

The hole transporting region 13 may include a hole injection layer (HIL) and a hole transport layer (HTL) sequentially stacked from the first electrode 12. The amine-based compound may be included in the HTL. The HTL may be in contact with the EML 15.

When the hole transporting region 13 includes the HIL, the HIL may be formed by using various methods, such as vacuum deposition, spin coating, casting, or LB deposition.

When the HIL is formed by vacuum, the deposition conditions may be vary depending on a compound used as a material for forming the HIL, and a structure and thermal characteristics of a desired HIL. For example, the deposition conditions may be, for example, a deposition temperature in a range of about 100° C. to about 500° C., a degree of vacuum in a range of about $10^{-8}$ to about $10^{-3}$ torr, and a deposition rate in a range of about 0.01 to about 100 Å/sec.

When the HIL is formed by spin coating, the coating conditions may vary depending on a compound used as a material for forming the HIL, and a structure and thermal characteristics of a desired HIL. For example, the coating conditions may be, for example, a coating rate in a range of about 2,000 rpm to about 5,000 rpm and a heat treatment temperature for removing a solvent after the coating in a range of about 80° C. to about 200° C.

Examples of the hole injection material may include N,N'-diphenyl-N,N'-bis-[4-(phenyl-m-tolyl-amino)-phenyl]-biphenyl-4,4'-diamine (DNTPD), a phthalocyanine-based compound, such as copper phthalocyanine, 4,4',4"-tris (3-methylphenylphenylamino) triphenylamine (m-MTDATA), N,N'-di(1-naphthyl)-N,N'-diphenylbenzidine) (NPB), TDATA, 2-TNATA, polyaniline/dodecylbenzenesulfonic acid (Pani/DBSA), poly(3,4-ethylenedioxythiophene)/poly(4-styrenesulfonate) (PEDOT/PSS), polyaniline/camphor sulfonicacid (Pani/CSA), or polyaniline/poly(4-styrenesulfonate) (PANI/PSS):

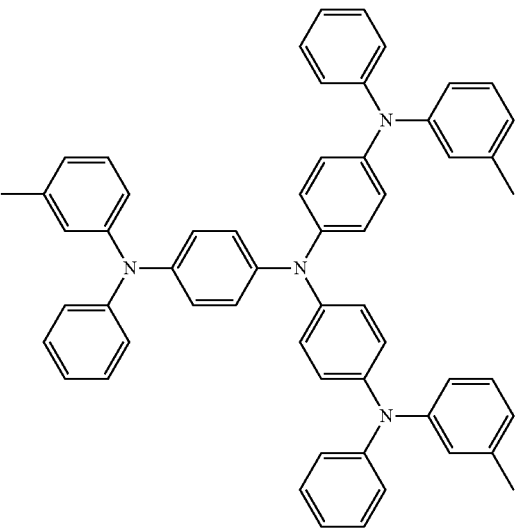

m-MTDATA

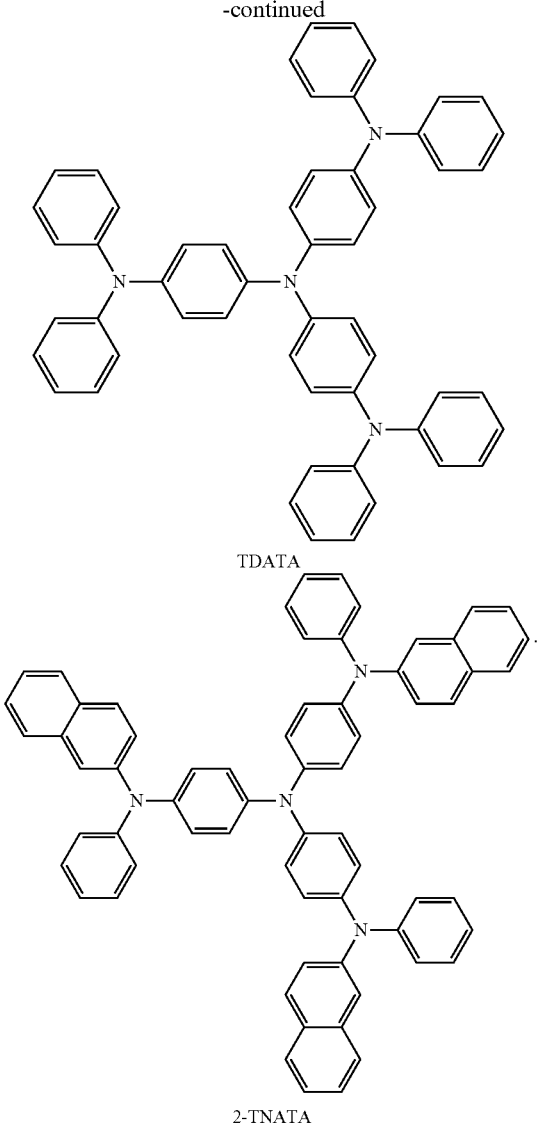

TDATA

2-TNATA

A thickness of the HIL may be in the range of about 100 Å to about 10,000 Å, for example, in the range of about 100 Å to about 1,000 Å. Maintaining the thickness of the HIL within this range may help provide satisfactory hole injection properties without a substantial increase in driving voltage.

Next, a HTL may be formed on the HTL by vacuum deposition, spin coating, casting, or LB deposition. When the HTL is formed by vacuum deposition or spin coating, the deposition and coating conditions vary depending on a used compound. However, in general, the conditions may be about the same as the conditions for forming the HIL.

An amine-based compound represented by one of Formulae 1A and 1C may be used as the material for forming the HTL.

The hole transporting region 13 may further include a charge-generating material so as to increase the conductivity of the layers, in addition to the materials stated above.

The charge-generating material may be, for example, a p-dopant. The p-dopant may be, for example, one of a quinine derivative, a metal oxide, and a cyano-containing compound. Examples of the p-dopant may include quinone derivatives, such as tetra-cyanoquinodimethane (TCNQ) and 2,3,5,6-tetrafluoro-tetracyano-1,4-benzoquinodimethane (F4-TCNQ); metal oxides, such as an tungsten oxide and a molybdenum oxide; and cyano-containing compounds, such as Compound 200:

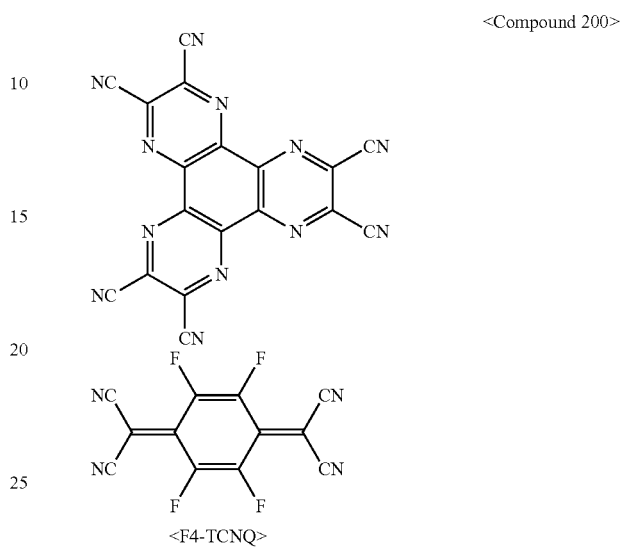

<Compound 200>

<F4-TCNQ>

The charge-generating material may be homogenously or inhomogenously dispersed in the hole transporting region 13.

Subsequently, the EML 15 may be formed on the hole transporting region 13 by vacuum deposition, spin coating, casting, or LB deposition. When the EML 15 is formed by vacuum deposition or spin coating, the deposition and coating conditions may vary depending on a used compound. However, in general, the conditions may be about the same as the conditions for forming the HIL.

The EML may include a host and a dopant. The host includes a compound represented by one of Formulae 2, 10A, 10B, 10C, 10D, and 10E, and the dopant includes an organic metal complex.

When the organic light-emitting device 10 is a full-color organic light-emitting device, the EML may be patterned as a red EML, a green EML, and a blue EML. Alternatively the EML may have a structure, of which a red EML, a green EML, and/or a blue EML are stacked, so as to emit white light.

the organic metal complex may be a dopant material of an EML of an organic light-emitting device.

For examples, a blue dopant may be one of organic metal complexes below:

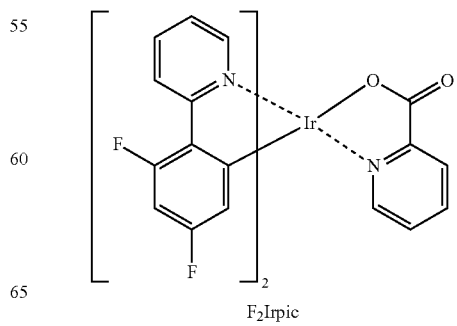

F₂Irpic

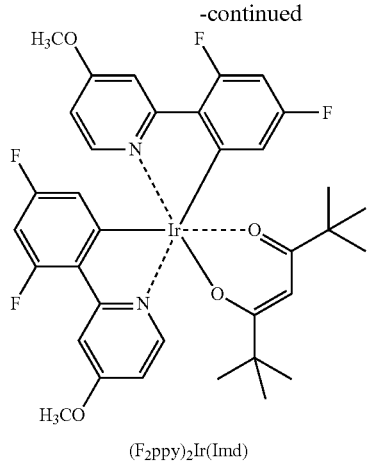
(F₂ppy)₂Ir(Imd)
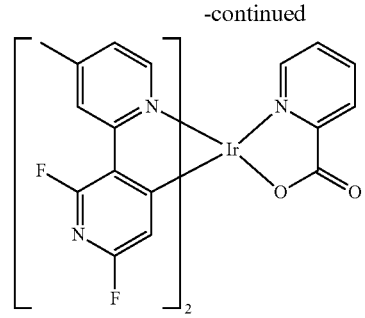
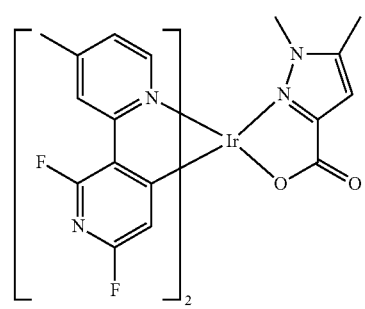
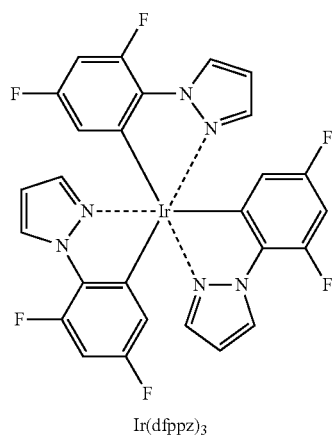
Ir(dfppz)₃
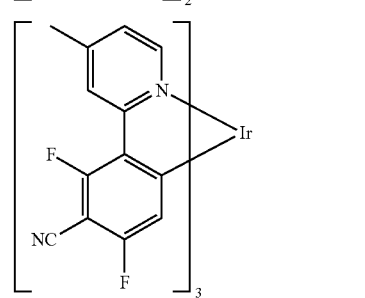
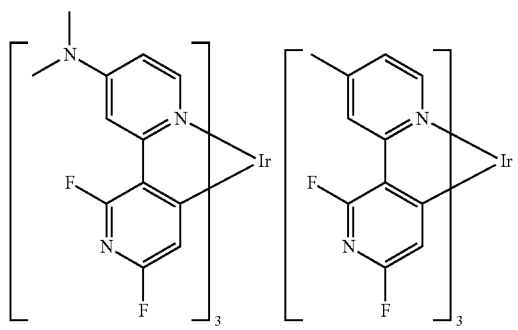
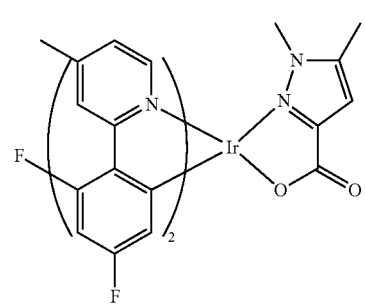
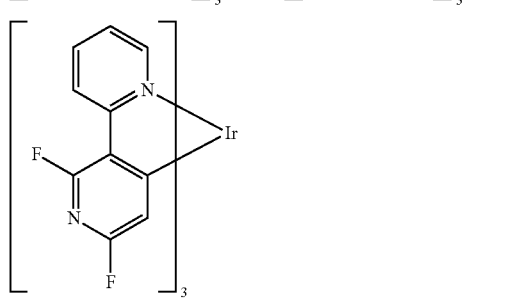
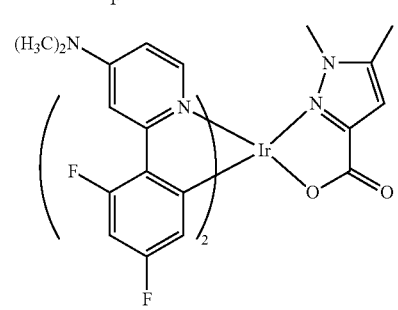

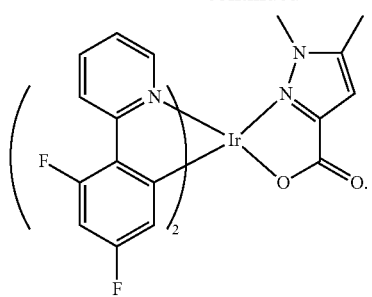
For example, a red dopant may be one of organic metal complexes below:
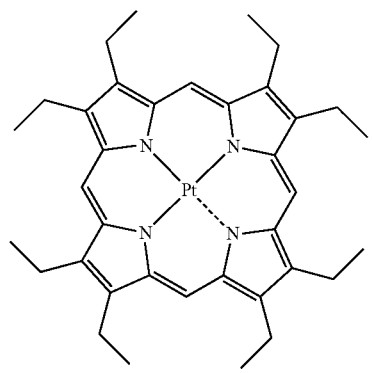
PtOEP
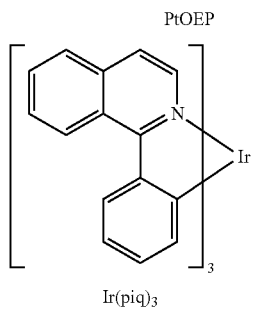
Ir(piq)₃
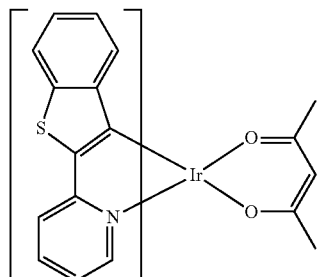
Btp₂Ir(acac)
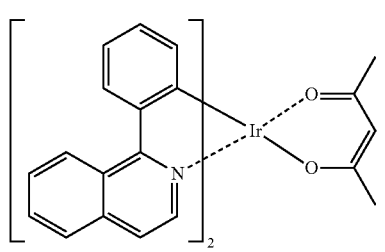
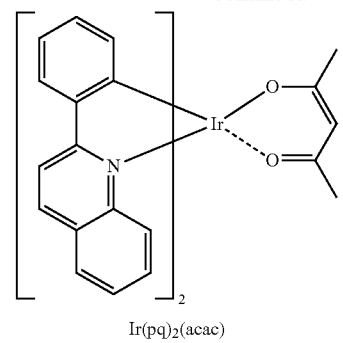
Ir(pq)₂(acac)
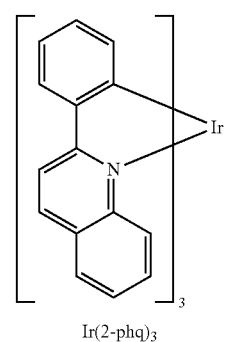
Ir(2-phq)₃
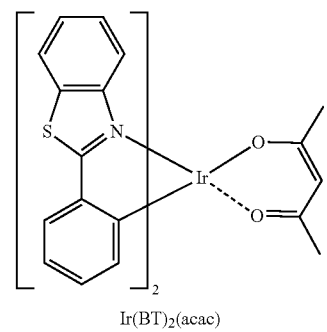
Ir(BT)₂(acac)
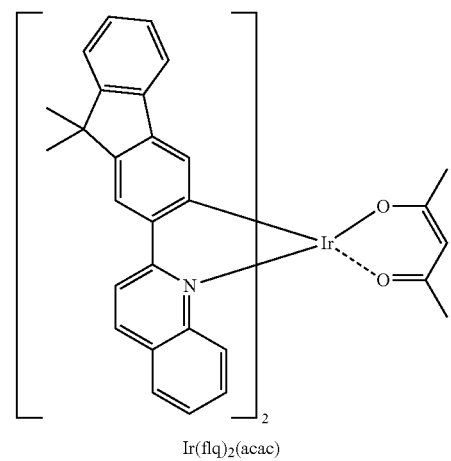
Ir(flq)₂(acac)

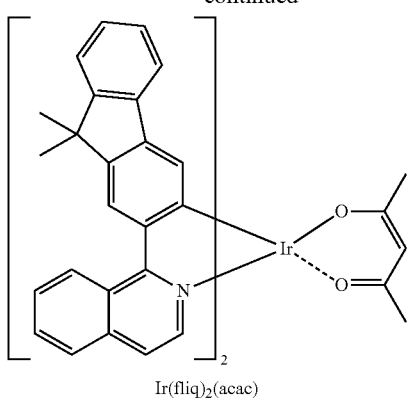
Ir(fliq)₂(acac)
For example, a red dopant may be one of organic metal complexes below:
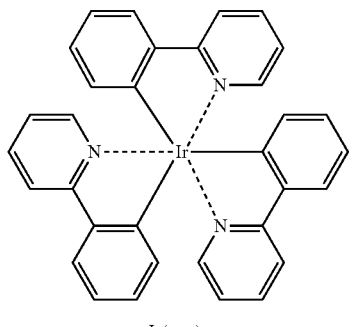
Ir(ppy)₃
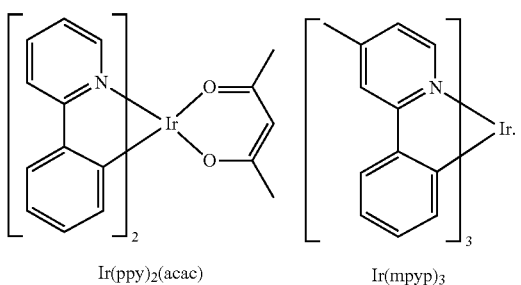
Ir(ppy)₂(acac)  Ir(mpyp)₃
Also, the EML 15 may include at least one of the organic metal complexes below:
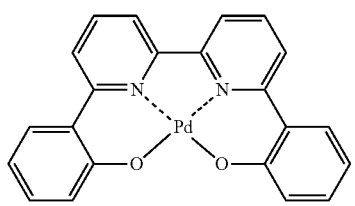
D1
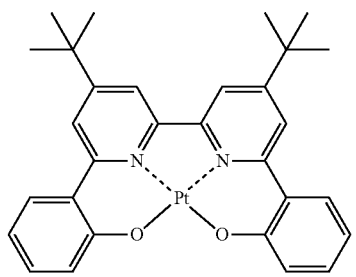
D2
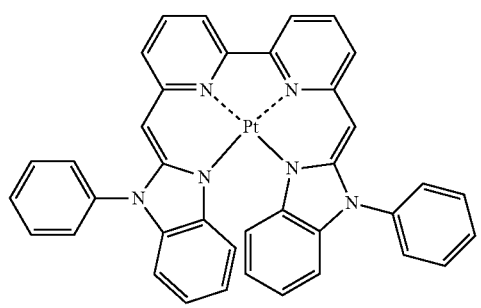
D3
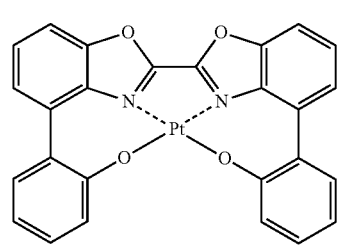
D4
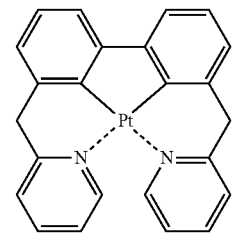
D5
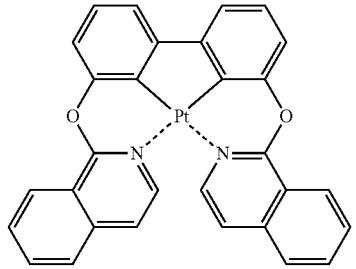
D6
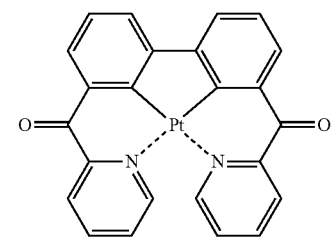
D7

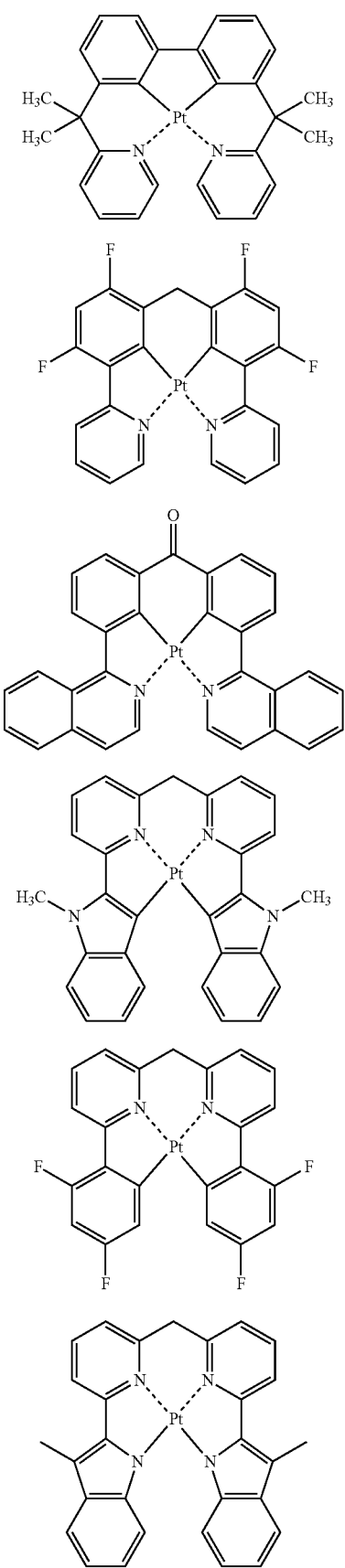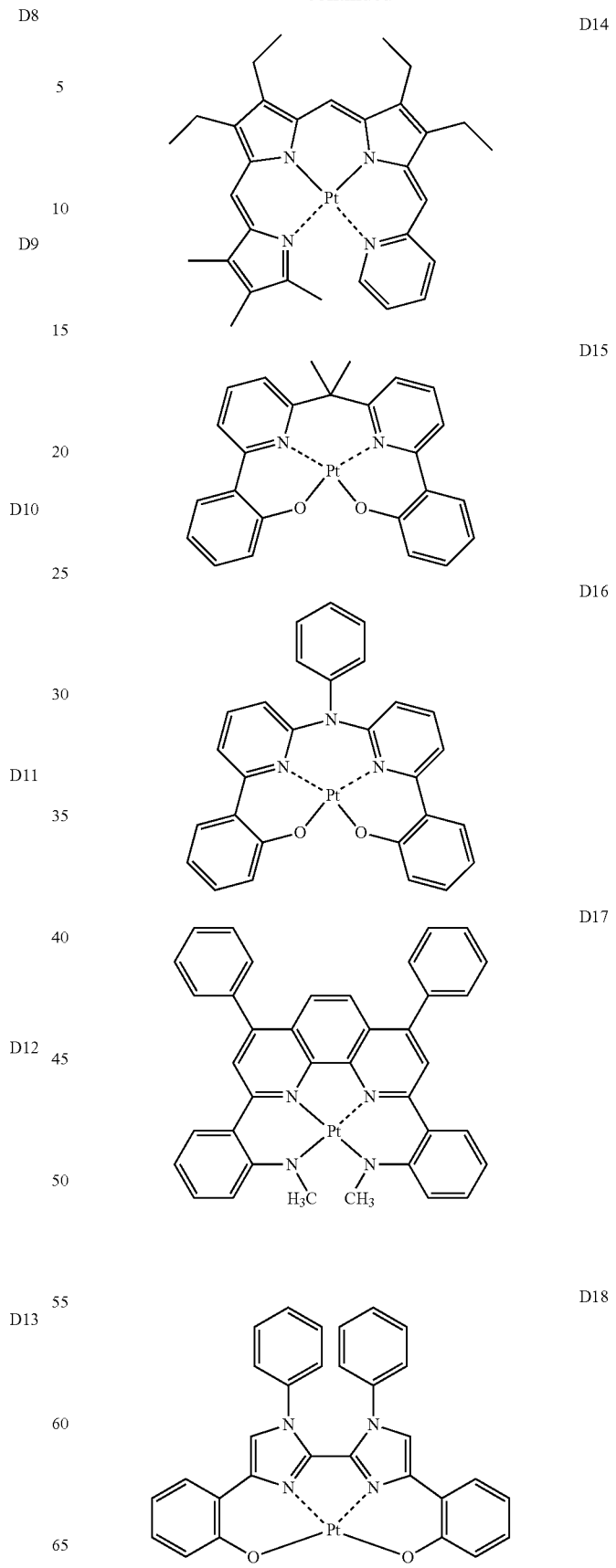

-continued
D19
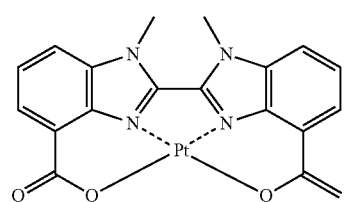
D20
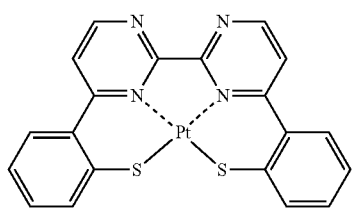
D21
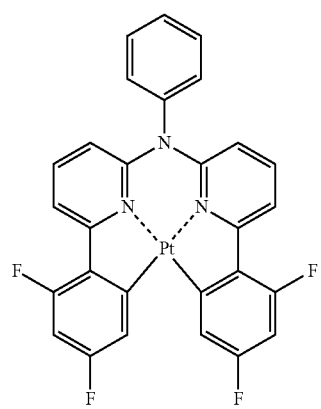
D22
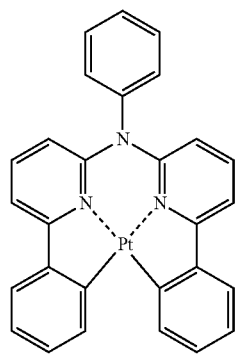
D23
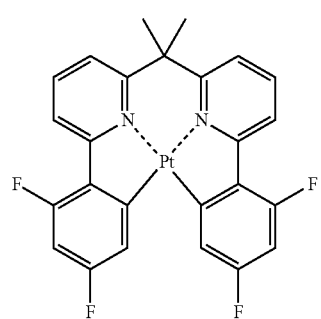
-continued
D24
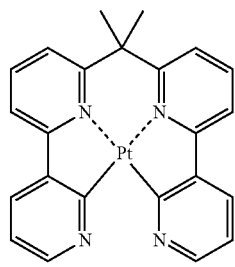
D25
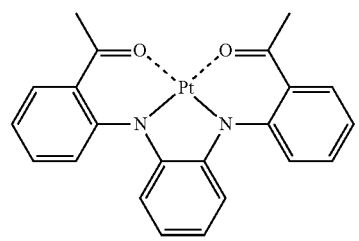
D26
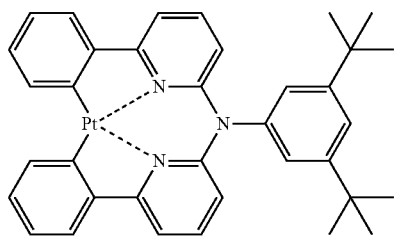
D27
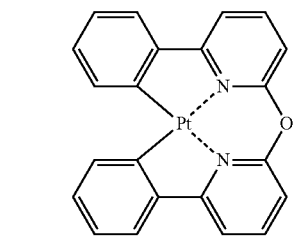
D28
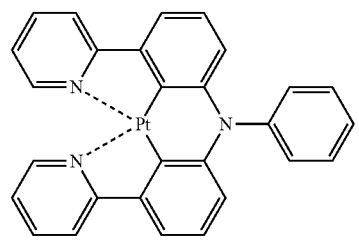
D29
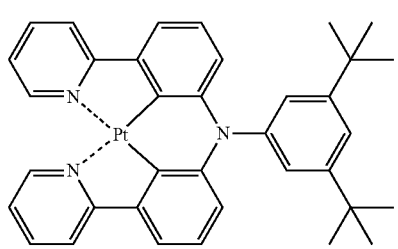

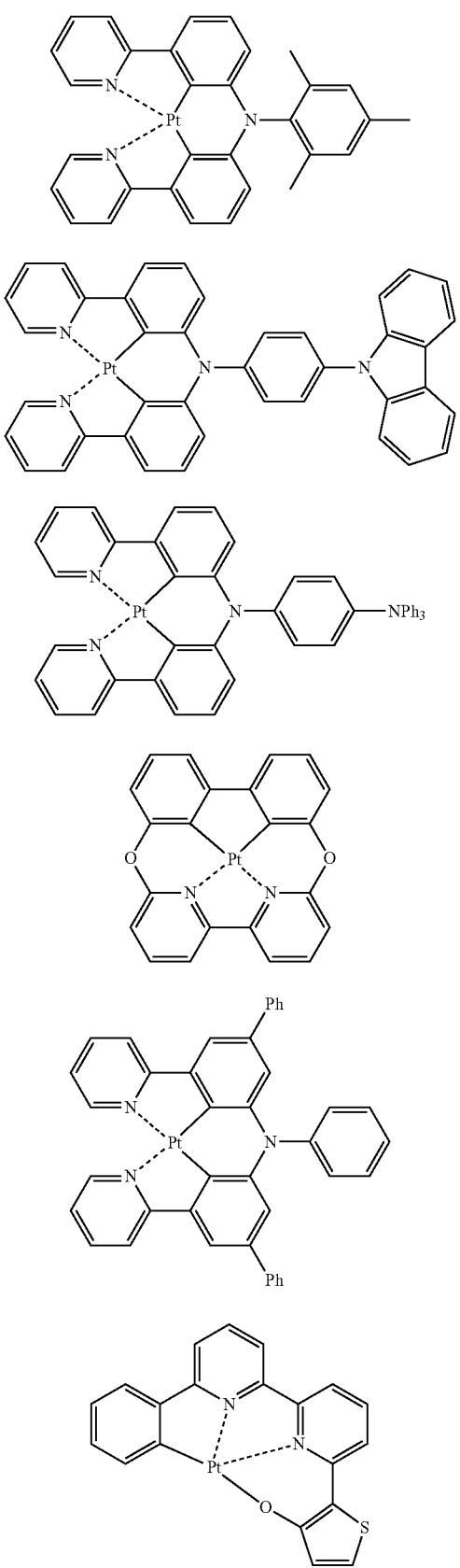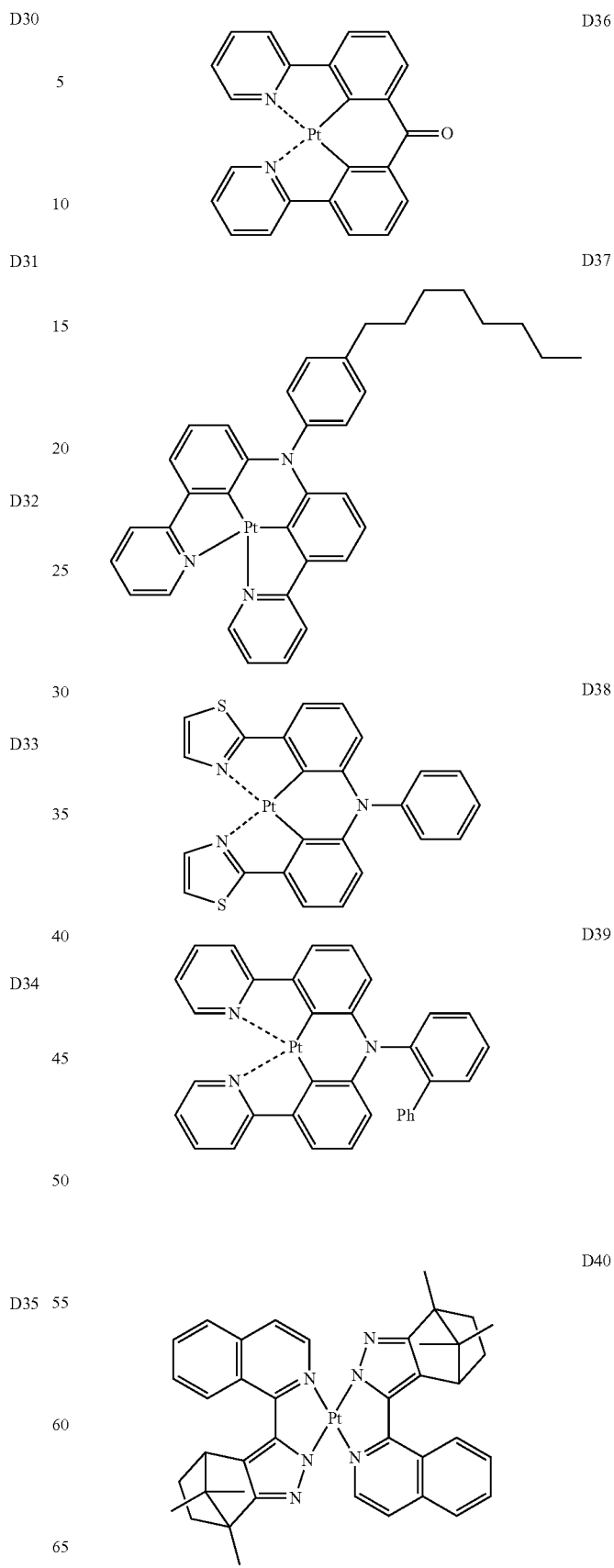

-continued
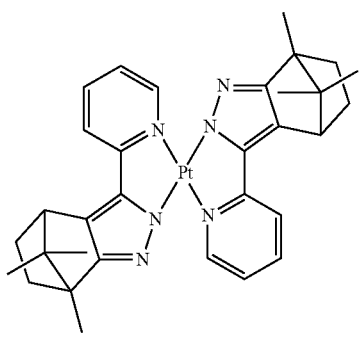 D41
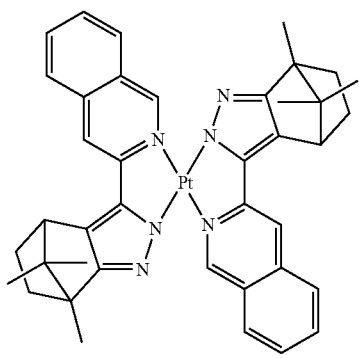 D42
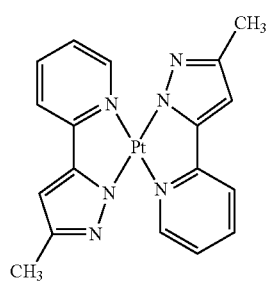 D43
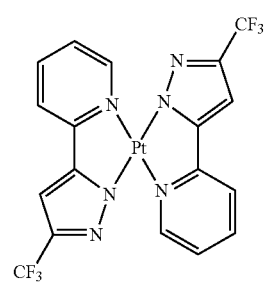 D44
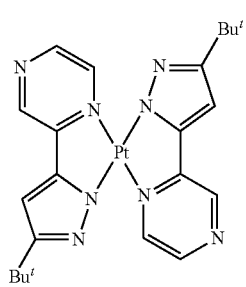 D45
-continued
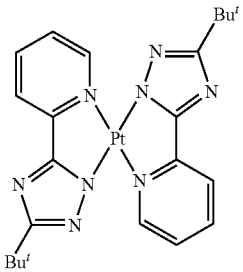 D46
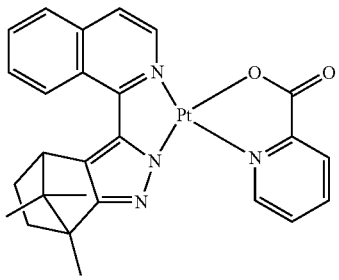 D47
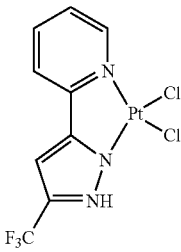 D48
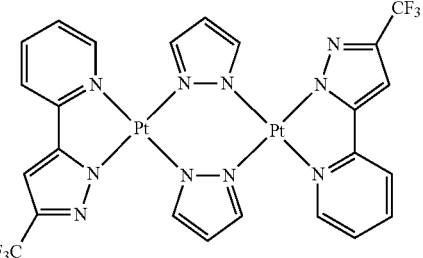 D49
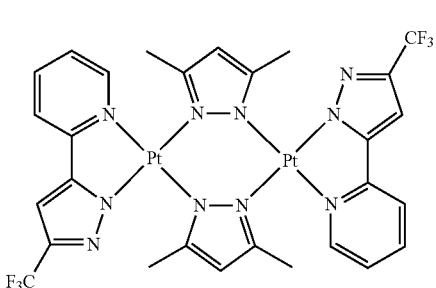 D50

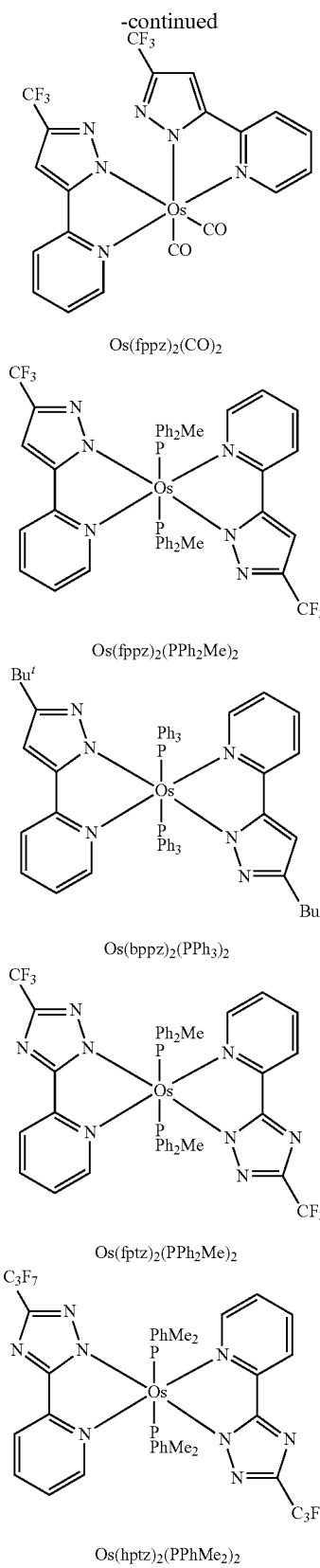

Os(fppz)₂(CO)₂

Os(fppz)₂(PPh₂Me)₂

Os(bppz)₂(PPh₃)₂

Os(fptz)₂(PPh₂Me)₂

Os(hptz)₂(PPhMe₂)₂

An amount of an organic metal complex in the EML 15 may be selected from a range of about 0.01 to about 15 parts by weight based on about 100 parts by weight of the host.

A thickness of the EML 15 may be in a range of about 100 Å to about 1,000 Å, for example, in a range of about 200 Å to about 600 Å. Maintaining a thickness of the EML 15 within this range may help provide excellent luminescent properties without a substantial increase in driving voltage.

Next, the electron transporting region 17 is formed on the EML 15. The electron transporting region 17 may include an electron transport layer (ETL) and an electron injection layer (EIL) that are sequentially stacked on the EML 15. The ETL may be formed by vacuum deposition, spin coating, or casting. When the ETL is formed by deposition or spin coating, the deposition and coating conditions vary depending on a used compound. However, in general, the conditions may be about the same as the conditions for forming the HIL. The material for forming the ETL may be an electron transporting material that stably transports electrons injected from the second electrode 19. Examples of such electron transporting material include a quinoline derivative, such as tris(8-quinolinolate)aluminum (Alq₃), TAZ, BAlq, beryllium bis(benzoquinolin-10-olate (Bebq₂), ADN, Compound 201, and Compound 202:

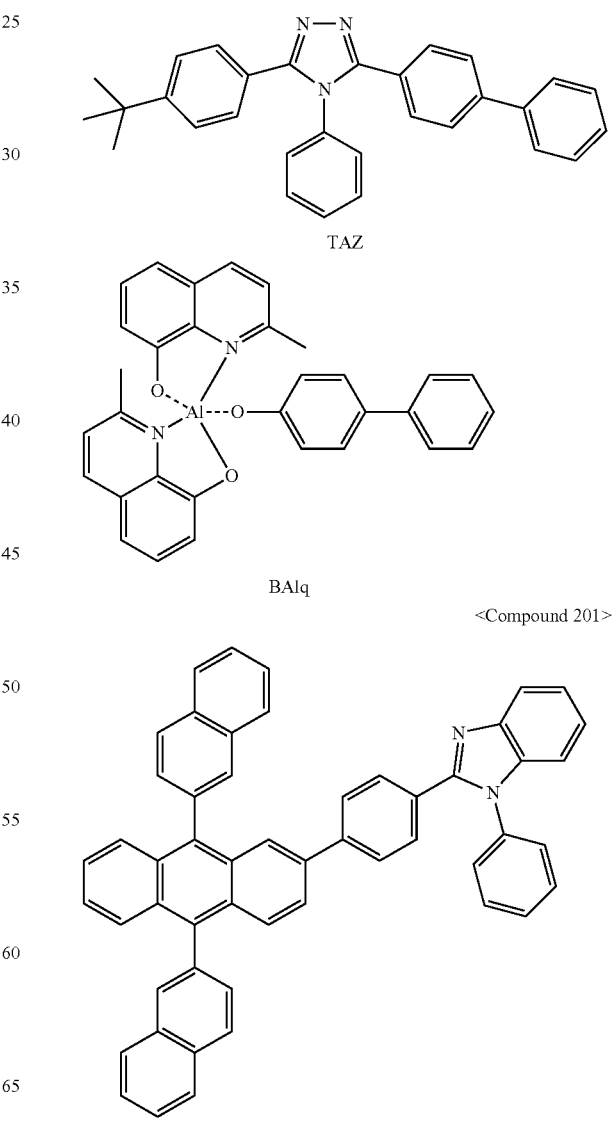

TAZ

BAlq

<Compound 201>

<Compound 202>

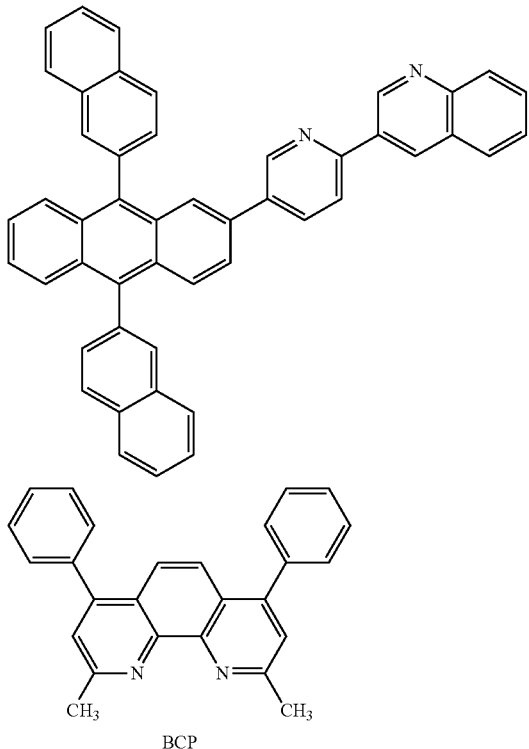

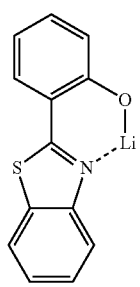

BCP

A thickness of the ETL may be in a range of about 100 Å to about 1,000 Å, for example, in a range of about 150 Å to about 500 Å. Maintaining a thickness of the ETL within this range, may help provide satisfactory electron transport properties without a substantial increase in driving voltage.

The ETL may further include a metal-containing material, in addition to the amine-based compound described above.

The metal-containing material may include a Li-complex. Examples of the Li-complex may include lithium quinolate (LiQ) and Compound 203 below:

<Compound 203>

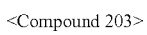

Also, an EIL, which facilitates electron injection from the second electrode 19, may be formed on the ETL.

Exemplary materials for forming the EIL include LiF, NaCl, CsF, $Li_2O$, BaO, and LiQ. The EIL deposition conditions may vary depending on a used compound. However, in general, the conditions may be about the same as the condition for forming the HIL.

A thickness of the EIL may be in a range of about 1 Å to about 100 Å, for example, in a range of about 3 Å to about 90 Å. Maintaining the thickness of the EIL within this range may help provide satisfactory electron injection properties without a substantial increase in driving voltage.

The organic light-emitting device 10 has been described with reference to exemplary FIG. 1. In an embodiment, a hole blocking layer (HBL) may be disposed between the EML 15 and the electron transporting region 17 so as to prevent triplet excitons or holes from being diffused to the ETL. When the HBL is formed by vacuum deposition or spin coating, the conditions thereof may vary depending on a used compound. However, in general, the conditions may be about the same as the conditions for forming the HIL. The HBL may include a hole blocking material such as, for example, an oxadiazole derivative, a triazole derivative, or a phenanthroline derivative, or BCP:

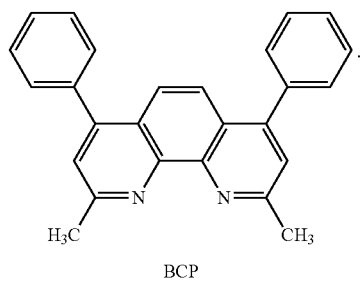 [SMILES: Cc1cc(-c2ccccc2)c2ccc3c(-c4ccccc4)cc(C)nc3c2n1 ; "BCP"]

BCP

A thickness of the HBL may be in a range of about 20 Å to about 1,000 Å, for example, in a range of about 30 Å to about 300 Å. Maintaining the thickness of the HBL within this range may help provide excellent hole blocking properties without a substantial increase in driving voltage.

As used herein, examples of the unsubstituted $C_1$-$C_{60}$ alkyl group (or the $C_1$-$C_{60}$ alkyl group) include a linear or branched $C_1$-$C_{60}$ alkyl group, such as a methyl group, an ethyl group, a propyl group, an isobutyl group, a sec-butyl group, a pentyl group, an iso-amyl group, a hexyl group, and the like.

At least one substituent of the substituted $C_1$-$C_{60}$ alkyl group may be selected from, but is not limited to, a deuterium atom, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium atom, a halogen atom, a hydroxyl group, a cyano group, a nitro group, an amino group, an amidino group, a hydrazine group, a hydrazone group, a carboxylic acid or a salt thereof, a sulfonic acid or a salt thereof, and a phosphoric acid or a salt thereof;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, each substituted with at least one of a deuterium atom, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group; and —N($Q_{11}$)($Q_{12}$) and —Si($Q_{13}$)($Q_{14}$)($Q_{15}$) (here, $Q_{11}$ and $Q_{12}$ are each independently a $C_6$-$C_{60}$ aryl group or a $C_2$-$C_{60}$ heteroaryl group, and $Q_{13}$ to $Q_{15}$ are each independently a $C_1$-$C_{60}$ alkyl group, a $C_1$-$C_{60}$ alkoxy group, a $C_6$-$C_{60}$ aryl group, or a $C_2$-$C_{60}$ heteroaryl group).

As used herein, the unsubstituted $C_1$-$C_{60}$ alkoxy group (or the $C_1$-$C_{60}$ alkoxy group) is represented by —OA (where, A is the unsubstituted $C_1$-$C_{60}$ alkyl group). Examples of the $C_1$-$C_{60}$ alkoxy group include a methoxy group, an ethoxy group, and an isopropyloxy group. At least one hydrogen atom of the alkoxy group may be substituted with the substituents described above in connection with the substituted $C_1$-$C_{60}$ alkyl group.

As used herein, the unsubstituted $C_1$-$C_{60}$ alkenyl group (or $C_2$-$C_{60}$ alkenyl group) denotes a moiety containing at least one carbon double bond in the middle or at the end of the unsubstituted $C_2$-$C_{60}$ alkyl group. Examples of the $C_2$-$C_{60}$ alkenyl group include an ethenyl group, a propenyl group, and a butenyl group. At least one hydrogen atom of the unsubstituted $C_2$-$C_{60}$ alkenyl group may be substituted with the substituents described above in connection with the substituted $C_1$-$C_{60}$ alkyl group.

As used herein, the unsubstituted $C_2$-$C_{60}$ alkynyl group (or the $C_2$-$C_{60}$ alkynyl group) denotes a moiety containing at least one carbon triple bond in the middle or at the end of the unsubstituted $C_2$-$C_{60}$ alkyl group. Examples of the $C_2$-$C_{60}$ alkynyl group include an ethynyl group and a propynyl group. At least one hydrogen atom of the unsubstituted $C_2$-$C_{60}$ alkynyl group may be substituted with the substituents described above in connection with the substituted $C_1$-$C_{60}$ alkyl group.

As used herein, the unsubstituted $C_6$-$C_{60}$ aryl group (or the $C_6$-$C_{60}$ aryl group) denotes a monovalent group that has 6 to 60 carbons. The $C_6$-$C_{60}$ arylene group denotes a divalent group having the same structure with the $C_6$-$C_{60}$ aryl group. When the $C_6$-$C_{60}$ aryl group and the $C_6$-$C_{60}$ arylene group include at least two rings, the rings may be fused to each other. At least one hydrogen atom of the $C_6$-$C_{60}$ aryl group and the $C_6$-$C_{60}$ arylene group may be substituted with the substituents described above in connection with the substituted $C_1$-$C_{60}$ alkyl group.

Examples of the substituted or unsubstituted $C_6$-$C_{60}$ aryl group include a phenyl group, a $C_1$-$C_{10}$ alkylphenyl group (e.g., an ethylphenyl group), a $C_1$-$C_{10}$ alkylbiphenyl group (e.g., an ethylbiphenyl group), a halophenyl group (e.g., an o-, m-, or p-fluorophenyl group, a dichlorophenyl group), a dicyanophenyl group, a trifluoromethoxyphenyl group, an o-, m-, or p-tolyl group, an o-, m-, or p-cumenyl group, a mesityl group, a phenoxyphenyl group, an (α,α-dimethylbenzene)phenyl group, a (N,N'-dimethyl)aminophenyl group, a (N,N'-diphenyl)aminophenyl group, a pentalenyl group, an indenyl group, a naphthyl group, a halonaphthyl group (e.g., a fluoronaphthyl group), a $C_1$-$C_{10}$ alkyl naphthyl group (e.g., a methylnaphthyl group), a $C_1$-$C_{10}$ alkoxynaphthyl group (e.g., a methoxynaphthyl group), an anthracenyl group, an azulenyl group, a heptalenyl group, an acenaphthyl group, a phenalenyl group, a fluorenyl group, an anthraquinolyl group, a methylanthyl group, a phenanthrenyl group, a triphenylenyl group, a pyrenyl group, a chrysenyl group, an ethyl-chrysenyl group, a picenyl group, a perylenyl group, a chloroperylenyl group, a pentaphenyl group, a pentacenyl group, a tetraphenylenyl group, a hexaphenyl group, a hexacenyl group, a rubicenyl group, a coroneryl group, a trinaphthylenyl group, a heptaphenyl group, a heptacenyl group, a pyranthrenyl group, and an ovalenyl group, wherein examples of the substituted $C_6$-$C_{60}$ aryl group may be referred to the substituents described above in connection with the unsubstituted $C_6$-$C_{60}$ aryl group and the substituted $C_1$-$C_{60}$ alkyl group. Examples of the substituted or unsubstituted arylene group may be referred to the substituents described above in connection with the unsubstituted $C_6$-$C_{60}$ aryl group.

As used herein, the unsubstituted $C_1$-$C_{60}$ heteroaryl group denotes a monovalent group including at least one heteroatom selected from N, O, P, and S, wherein all the other atoms in the ring are C, and and including an aromatic ring. The unsubstituted $C_2$-$C_{60}$ heteroarylene group denotes a divalent group having the same structure with the $C_2$-$C_{60}$ heteroaryl group. When the $C_2$-$C_{60}$ heteroaryl group and the $C_2$-$C_{60}$ heteroarylene group include at least two rings, the rings may be fused to each other. At least one hydrogen atom of the $C_2$-$C_{60}$ heteroaryl group and the $C_2$-$C_{60}$ heteroarylene group may be substituted with the substituents described above in connection with the substituted $C_1$-$C_{60}$ alkyl group.

Examples of the unsubstituted $C_2$-$C_{60}$ heteroaryl group may be a pyrazolyl group, an imidazolyl group, an oxazolyl group, a thiazolyl group, a triazolyl group, a tetrazolyl group, an oxadiazolyl group, a pyridinyl group, a pyridazinyl group, a pyrimidinyl group, a triazinyl group, a carbazolyl group, an indolyl group, a quinolinyl group, an isoquinolinyl group, a benzoimidazolyl group, an imidazopyridinyl group, and an imidazopyrimidinyl group. Examples of the unsubstituted $C_2$-$C_{60}$ heteroarylene group may be referred to the substituents described above in connection with the substituted or unsubstituted $C_2$-$C_{60}$ arylene group.

As used herein, the substituted or unsubstituted $C_6$-$C_{60}$ aryloxy group indicates —O$A_2$ (here, $A_2$ is the substituted or unsubstituted $C_6$-$C_{60}$ aryl group), and the $C_5$-$C_{60}$ arylthio group indicates —S$A_3$ (here, $A_3$ is the substituted or unsubstituted $C_6$-$C_{60}$ aryl group).

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLES

Synthesis Example 1

Synthesis of Compound 1

Compound 1 was synthesized according to Reaction Scheme 1:

<Reaction Scheme 1>

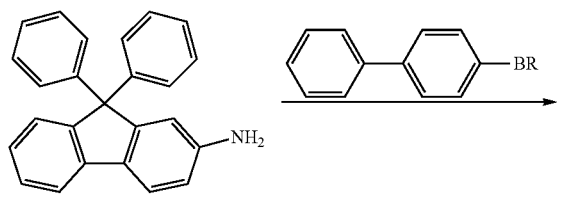

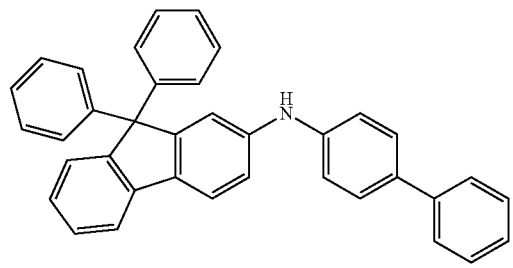

1-1

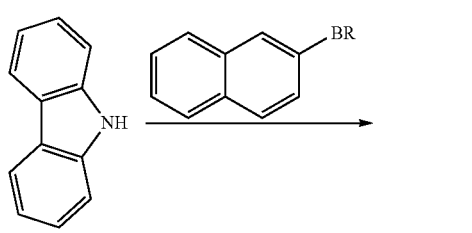

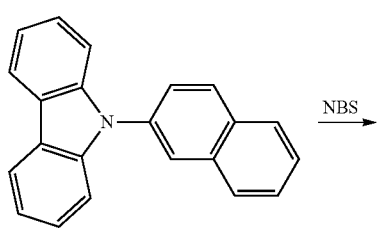

1-2

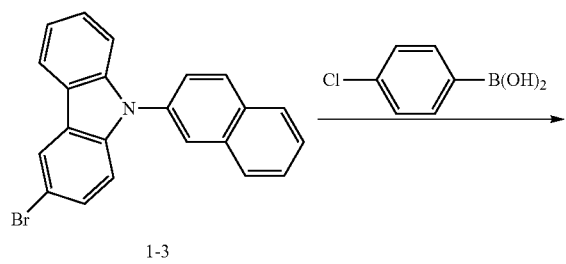

1-3

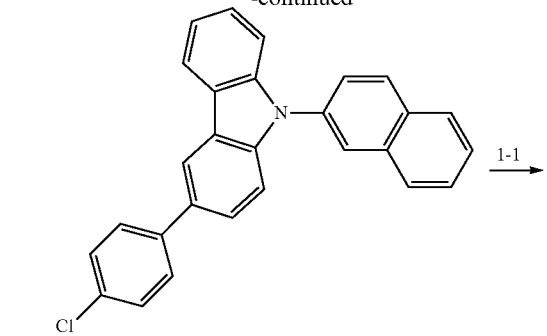

1-1

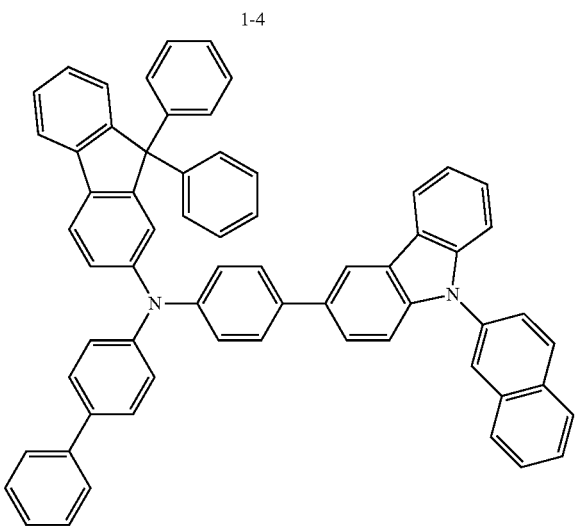

1

Synthesis of Intermediate 1-1

57 g of 9,9-diphenyl-9H-fluoren-2-amine, 40 g of 4-bromobiphenyl, 0.4 g of tris(dibenzylideneacetone)dipalladium(0), 0.35 g of tri-(t-butyl)phosphine (50% toluene solution), 19.7 g of sodium t-butoxide, and 450 mL of toluene were inserted in a 1000-mL 4-neck round-bottom flask under a nitrogen atmosphere. The reaction mixture was slowly heated and refluxed for 1 hour, and then cooled down to room temperature and diluted with 300 mL of acetone. The diluent was poured into methanol to precipitate a solid, and the solid was recrystallized using acetone and ethyl acetate. The resulting solid was filtered and vacuum-dried to obtain 80 g of Intermediate 1-1.

$^1$H NMR (CDCl3, 500 MHz, ppm): δ 7.67 (t, J=7.2 Hz, 2H), 7.55 (d, J=7.0 Hz, 2H), 7.46 (d, J=8.5 Hz, 2H), 7.41 (t, J=7.7 Hz, 2H), 7.36-7.27 (m, 3H), 7.23-7.18 (m, 7.16 (d, J=1.5 Hz, 1H), 7.11-7.09 (m, 1H), 7.05 (d, J=1.5 Hz, 2H), 5.84 (s, 1H)

Synthesis of Intermediate 1-2

100 g of carbazole, 130 g of bromonaphthalene, 0.34 g of palladium acetate(II), 1.3 g of tri-(5-butyl)phosphine (50% toluene solution), 69 g of sodium t-butoxide, and 800 mL of o-xylene were inserted in a 2000-mL 4-neck round-bottom flask under a nitrogen atmosphere. The reaction mixture was refluxed for 9 hours, and then cooled down to room temperature and diluted with 200 mL of acetone. The diluent was poured into methanol to precipitate a solid. The resulting solid was filtered and vacuum-dried to obtain 108 g of Intermediate 1-2.

$^1$H NMR (CDCl3, 500 MHz, ppm): δ 8.15 (d, J=7.5 Hz, 2H), 8.02 (d, J=8.5 Hz, 1H), 8.00 (d, J=1.5 Hz, 1H), 7.94-7.92 (m, 1H), 7.87-7.85 (m, 1H), 7.63 (dd, J=8.5, 2.0 Hz, 1H), 7.52-7.56 (m, 2H), 7.43 (d, J=8.5 Hz, 2H), 7.37-7.40 (m, 2H), 7.27-7.30 (m, 2H)

Synthesis of Intermediate 1-3

108 g of Intermediate 1-2 was added in a 5000-mL 4-neck round-bottom flask and diluted with 2200 mL of chloroform. 66 g of N-bromosuccinimide (NBS) was slowly added to the diluents at room temperature, and the mixture was refluxed for 12 hours. 2000 mL of distilled water was added to the reaction mixture, stirred for 30 minutes, and then an organic layer was separated. The separated organic layer was dried and concentrated, recrystallized using acetone and methanol, and then vacuum-dried to obtain 107 g of Intermediate 1-3.

$^1$H NMR (CDCl3, 500 MHz, ppm): δ 8.26 (d, J=2.0 Hz, 1H), 8.10 (d, J=8.0 Hz, 1H), 8.04 (d, J=9.0 Hz, 1H), 7.99 (d, J=1.5 Hz, 1H), 7.97-7.95 (m, 1H), 7.90-7.78 (m, 1H), 7.61-7.56 (m, 3H), 7.48 (dd, J=8.5, 2.0 Hz, 1H), 7.42 (d, J=4.0 Hz, 2H), 7.32-7.24 2H)

Synthesis of Intermediate 1-4

86 g of Intermediate 1-3 was added in a 3000-mL 4-neck round-bottom flask and diluted with 1700 mL of tetrahydrofuran. 43 g of 4-chlorophenylboronic acid, 230 mL of 3 M-potassium carbonate, and 10 g of tetrakis(triphenylphosphine)palladium(0) were added to the diluents, and then the reaction mixture was refluxed for 12 hours. The mixture was cooled down to room temperature, and then tetrahydrofuran was concentrated, and the resultant was diluted with acetone. The diluent was poured into methanol to precipitate a solid. The resulting solid was recrystallized using acetone and methanol to obtain 83 g of Intermediate 1-4.

$^1$H NMR (CDCl3, 500 MHz, ppm): δ 8.32 (d, J=1.5 Hz, 1H), 8.20 (d, J=7.5 Hz, 1H), 8.07 (d, J=8.5 Hz, 1H), 8.04 (d, J=2.0 Hz, 1H), 7.97-7.96 (m, 1H), 7.91-7.89 (m, 1H), 7.67-7.61 (m, 3H), 7.60-7.56 (m, 3H), 7.49-7.41 (m, 5H), 7.33-7.30 (m, 1H)

Synthesis of Compound 1

86 g of Intermediate 1-4, 114 g of Intermediate 1-1, 0.12 g of palladium acetate(II), 0.43 g of tri-(t-butyl)phosphine (50% toluene solution), 27 g of sodium t-butoxide, and 700 mL of o-xylene were inserted in a 2000-mL 4-neck round-bottom flask under a nitrogen atmosphere. The reaction mixture was refluxed for 3 hours, and an excessive amount of methanol was poured thereto to precipitate a solid. The resulting solid was filtered and recrystallized using dichloromethane and acetone to obtain 136 g of Compound 1.

$^1$H NMR (CDCl3, 500 MHz, ppm): δ 8.34 (s, 1H), 8.21 (d, J=7.5 Hz, 1H), 8.07-8.05 (m, 2H), 7.97-7.95 (m, 1H), 7.91-7.89 (m, 1H), 7.69-7.66 (m, 2H), 7.63 (d, J=8.5 Hz, 2H), 7.59-7.56 (m, 7H), 7.50-7.40 (m, 8H), 7.36-7.28 (m, 6H), 7.24-7.18 (m, 13H).

Synthesis Example 2

Synthesis of Compound 2

Compound 2 was synthesized in the same manner as in Synthesis Example 1, except that 1-bromonaphthalene was used instead of 4-bromobiphenyl in the synthesis of Intermediate 1-1.

Synthesis Example 3

Synthesis of Compound 4

Compound 4 was synthesized in the same manner as in Synthesis Example 1, except that 1-(4-bromophenyl) naphthalene was used instead of 4-bromobiphenyl in the synthesis of Intermediate 1-1.

Synthesis Example 4

Synthesis of Compound 6

Compound 6 was synthesized in the same manner as in Synthesis Example 1, except that 3-chlorophenylboronic acid was used instead of 4-chlorophenylboronic acid in the synthesis of Intermediate 1-4.

Synthesis Example 5

Synthesis of Compound 10

Compound 10 was synthesized in the same manner as in Synthesis Example 1, except that 2-bromonaphthalene was used instead of 4-bromobiphenyl in the synthesis of Intermediate 1-1, and 4-bromobiphenyl was used instead of 2-bromonaphthalene in the synthesis of Intermediate 1-2.

Example 1

A glass substrate of which ITO/Ag/ITO, as an anode, was deposited at a thickness of 70 Å/1000 Å/70 Å was cut into a size of 50 mm×50 mm×0.5 mm and washed with ultrasonic waves in isopropyl alcohol and pure water for 5 minutes each. Then, UV was irradiated on the substrate for 30 minutes, and the substrate was exposed to ozone to be cleaned. The glass substrate was mounted on a vacuum depositor.

2-TNATA was deposited on the anode to form a HIL having a thickness of 700 Å, and then Compound 1 was deposited thereon to form a HTL having a thickness of 500 Å. Thereafter, Compound 123A (host) and Compound D1 (dopant) were co-deposited on the HTL at a weight ratio of 200:3 to form an EML having a thickness of 200 Å. Then, Compound 201 and lithium quinolate (LiQ) were co-deposited on the EML to form an ETL having a thickness of 300 Å, and then LiQ was deposited on the ETL to form an EIL having a thickness of 10 Å. Thereafter, Mg and Ag were deposited on the EIL at a weight ratio of 90:10 to form a cathode having a thickness of 120 Å, thereby preparing an organic light-emitting device.

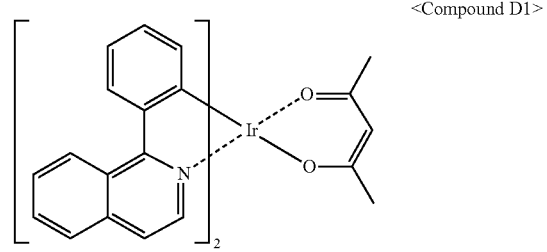

<Compound D1>

-continued

<Compound 201>

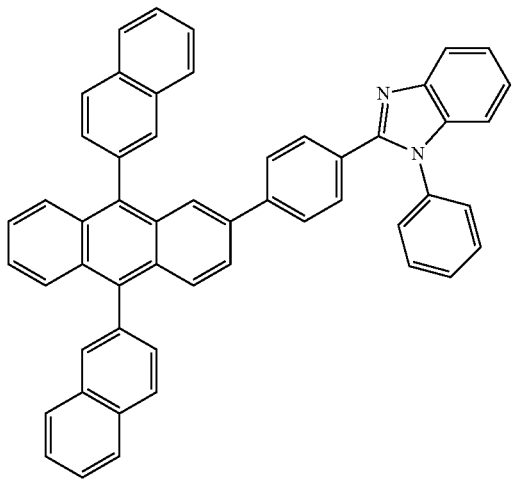

Example 2

An organic light-emitting device was manufactured in the same manner as in Example 1, except that Compound 2 was used instead of Compound 1 in the formation of the HTL, and Compound 130A was used as a host instead of Compound 123A in the formation of the EML.

Example 3

An organic light-emitting device was manufactured in the same manner as in Example 1, except that Compound 10 was used instead of Compound 1 in the formation of the HTL, and Compound 134A was used as a host instead of Compound 123A in the formation of the EML.

Example 4

An organic light-emitting device was manufactured in the same manner as in Example 1, except that Compound 4 was used instead of Compound 1 in the formation of the HTL, and Compound 153A was used as a host instead of Compound 123A in the formation of the EML.

Example 5

An organic light-emitting device was manufactured in the same manner as in Example 1, except that Compound 6 was used instead of Compound 1 in the formation of the HTL, and Compound 155A was used as a host instead of Compound 123A in the formation of the EML.

Comparative Example 1

An organic light-emitting device was manufactured in the same manner as in Example 1, except that Compound A was used instead of Compound 1 in the formation of the HTL.

<Compound A>

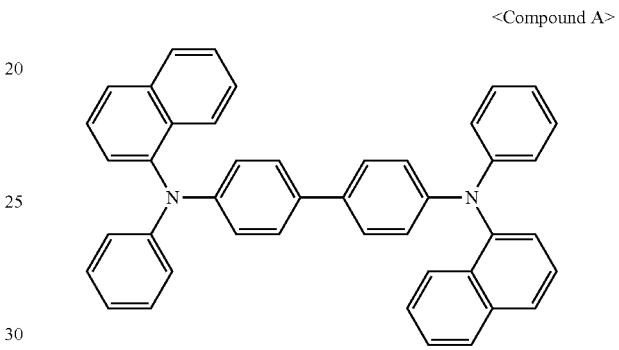

Evaluation Example 1

A driving voltage, a current density, a brightness, an emission color, an efficiency, and a half-lifetime (@10 mA/cm$^2$) of each of the organic light-emitting devices prepared in Examples 1 to 5 and Comparative Example 1 were evaluated by using a photometer, PR650 Spectroscan Source Measurement Unit (available from PhotoResearch), and the results are shown in Table 1. The lifetime (LT$_{97}$) was evaluated by measuring time spent for an initial brightness of 100% to be reduced to 97% after operating the organic light-emitting device under a condition of 10 mA/cm$^2$.

TABLE 1

| | HTL | Host | Driving Voltage (V) | Current Density (mA/cm$^2$) | Brightness (cd/A) | Power (lm/W) | CIE_x | CIE_y |
|---|---|---|---|---|---|---|---|---|
| Example 1 | Compound 1 | Compound 123A | 4.8 | 10.4 | 35.7 | 23.6 | 0.66 | 0.338 |
| Example 2 | Compound 2 | Compound 130A | 4.5 | 10.8 | 34.4 | 24.1 | 0.656 | 0.343 |
| Example 3 | Compound 10 | Compound 134A | 4.8 | 10.2 | 36.2 | 23.8 | 0.646 | 0.352 |
| Example 4 | Compound 4 | Compound 153A | 4.9 | 9.8 | 38 | 24.5 | 0.649 | 0.349 |
| Example 5 | Compound 6 | Compound 155A | 4.8 | 10.6 | 35.4 | 23.2 | 0.649 | 0.35 |
| Comparative Example 1 | Compound A | Compound 123A | 4.6 | 12.4 | 24.6 | 17.2 | 0.664 | 0.340 |

As shown in Table 1, according to embodiments, an organic light-emitting device exhibiting improved brightness, efficiency, color purity, and lifetime characteristics (e.g., lifespan) may be provided.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light-emitting device, comprising:
   a first electrode;
   a second electrode facing the first electrode;
   an emission layer (EML) disposed between the first electrode and the second electrode;
   a hole transporting region between the first electrode and the EML; and
   an electron transporting region between the EML and the second electrode,
   wherein:
   the hole transporting region includes an amine-based compound represented by one of Formulae 1A and 1C:

<Formula 1A>

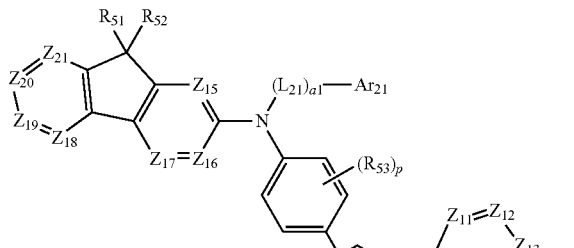

<Formula 1C>

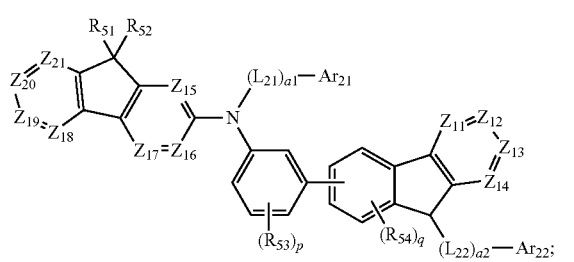

and
the EML includes a host and a dopant, the dopant includes an organic metal complex and the host includes a compound represented by one of Formulae Formula 2, 10A, and 10E:

<Formula 2>

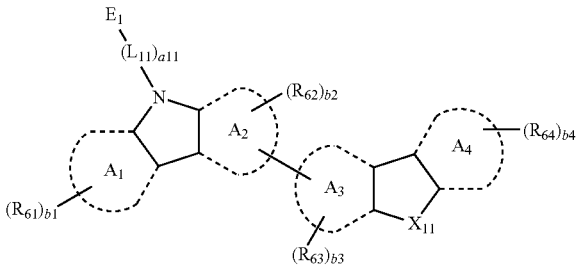

<Formula 10A>

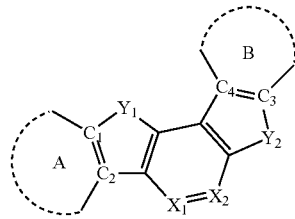

<Formula 10E>

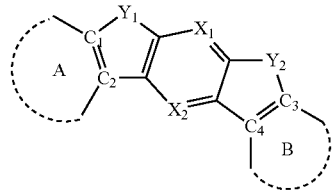

wherein $Z_{11}$ is N or $C(R_{11})$, $Z_{12}$ is N or $C(R_{12})$, $Z_{13}$ is N or $C(R_{13})$, $Z_{14}$ is N or $C(R_{14})$, $Z_{15}$ is N or $C(R_{15})$, $Z_{16}$ is N or $C(R_{16})$, $Z_{17}$ is N or $C(R_{17})$, $Z_{18}$ is N or $C(R_{18})$, $Z_{19}$ is N or $C(R_{19})$, $Z_{20}$ is N or $C(R_{20})$, and $Z_{21}$ is N or $C(R_{21})$;

$A_1$, $A_2$, $A_3$, and $A_4$ are each independently selected from benzene and naphthalene;

ring A and ring B are each independently selected from
i) a benzene or a naphthalene; and
ii) a benzene or a naphthalene, each substituted with at least one of a deuterium atom, a halogen atom, a $C_1$-$C_{60}$ alkyl group, a $C_6$-$C_{60}$ aryl group, and a $C_2$-$C_{60}$ heteroaryl group;

$C_1$ to $C_4$ each independently represent a carbon forming ring A or ring B;

$X_1$ is $CR_1$ or N;
$X_2$ is $CR_2$ or N;

$R_1$ and $R_2$ are each independently selected from a hydrogen, a deuterium, a halogen atom, a $C_1$-$C_{60}$ alkyl group, a $C_6$-$C_{60}$ aryl group, a $C_2$-$C_{60}$ heteroaryl group, and —N(Q$_1$)(Q$_2$), wherein $Q_1$ and $Q_2$ are each independently a $C_1$-$C_{60}$ alkyl group, a $C_6$-$C_{60}$ aryl group, or a $C_2$-$C_{60}$ heteroaryl group, wherein $R_1$ and $R_2$ are optionally linked to each other to form a saturated or unsaturated $C_6$-$C_{20}$ ring;

$Y_1$ is N-(L$_1$)$_{n1}$-Ar$_{11}$;
$Y_2$ is N-(L$_2$)$_{n2}$-Ar$_{12}$, O, S, C(R$_{31}$)(R$_{32}$), or Si(R$_{33}$)(R$_{34}$);
$X_{11}$ is O, S, C(R$_{41}$)(R$_{42}$), Si(R$_{41}$)(R$_{42}$), P(R$_{41}$), B(R$_{41}$), or P(=O)(R$_{41}$);

$E_1$ is a substituted or unsubstituted electron transporting-cyclic group including at least one N as a ring-forming atom;

$L_1$, $L_2$, $L_{11}$, $L_{21}$, and $L_{22}$ are each independently selected from
a $C_3$-$C_{10}$ cycloalkylene group, a $C_2$-$C_{10}$ heterocycloalkylene group, a $C_3$-$C_{10}$ cycloalkenylene group, a $C_2$-$C_{10}$ heterocycloalkenylene group, a $C_6$-$C_{60}$ arylene group, and a $C_2$-$C_{60}$ heteroarylene group; and a $C_3$-$C_{10}$ cycloalkylene group, a $C_2$-$C_{10}$ heterocycloalkylene group, a $C_3$-$C_{10}$ cycloalkenylene group, a $C_2$-$C_{10}$ heterocycloalkenylene group, a $C_6$-$C_{60}$ arylene group, and a $C_2$-$C_{60}$ heteroarylene group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group;

a1, a2, and a11 are each independently an integer selected from 0 to 5;

$Ar_{11}$, $Ar_{12}$, $Ar_{21}$, and $Ar_{22}$ are each independently selected from a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, and a $C_2$-$C_{60}$ heteroaryl group; and a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, and a $C_2$-$C_{60}$ heteroaryl group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group;

$R_{51}$ to $R_{54}$, $R_{11}$ to $R_{21}$, $R_{61}$ to $R_{64}$, $R_{41}$, $R_{42}$, and $R_{31}$ to $R_{34}$ are each independently selected from a hydrogen, a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, and a $C_2$-$C_{60}$ heteroaryl group;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, and a $C_2$-$C_{60}$ heteroaryl group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group; and —$N(Q_{11})(Q_{12})$, —$Si(Q_{13})(Q_{14})(Q_{15})$, and —$B(Q_{16})(Q_{17})$, wherein $Q_{11}$ to $Q_{17}$ are each independently a $C_1$-$C_{60}$ alkyl group, a $C_1$-$C_{60}$ alkoxy group, a $C_6$-$C_{60}$ aryl group, or a $C_2$-$C_{60}$ heteroaryl group;

p, b1, b2, b3, and b4 are each independently an integer selected from 1 to 4;

q is an integer of 1 or 2; and n1 and n2 are each independently an integer selected from 0 to 3, wherein the amount of the organic metal complex is selected from a range of about 0.01 to about 15 parts by weight based on 100 parts by weight of the host.

2. The organic light-emitting device as claimed in claim 1, wherein, in Formulae 1A and 1C, $Z_{11}$ is $C(R_{11})$, $Z_{12}$ is $C(R_{12})$, $Z_{13}$ is $C(R_{13})$, $Z_{14}$ is $C(R_{14})$, $Z_{15}$ is $C(R_{15})$, $Z_{16}$ is $C(R_{16})$, $Z_{17}$ is $C(R_{17})$, $Z_{18}$ is $C(R_{18})$, $Z_{19}$ is $C(R_{19})$, $Z_{20}$ is $C(R_{20})$, and $Z_{21}$ is $C(R_{21})$.

3. The organic light-emitting device as claimed in claim 1, wherein the host includes a compound represented by Formula 2:

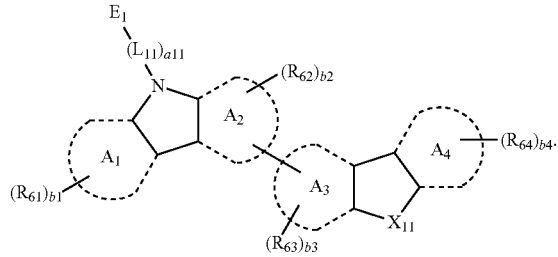

<Formula 2>

4. The organic light-emitting device as claimed in claim 1, wherein, in Formula 2, $A_1$ is naphthalene or benzene, and $A_2$, $A_3$, and $A_4$ are benzene.

5. The organic light-emitting device as claimed in claim 1, wherein, in Formula 2, $X_{11}$ is O, S, $C(R_{41})(R_{42})$, or $Si(R_{41})(R_{42})$, and $R_{41}$ and $R_{42}$ are optionally linked to each other to form a saturated or unsaturated ring.

6. The organic light-emitting device as claimed in claim 1, wherein, in Formula 2, $E_1$ is selected from a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzoimidazolyl group, a thiazolyl group, an isothiazolyl group, a benzothiazolyl group, an isoxazolyl group, an oxazolyl group, a triazolyl group, a tetrazolyl group, an oxadiazolyl group, and a triazinyl group; and a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzoimidazolyl group, a thiazolyl group, an isothiazolyl group, a benzothiazolyl group, an isoxazolyl group, an oxazolyl group, a triazolyl group, a tetrazolyl group, an oxadiazolyl group, and a triazinyl group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, —Si($Q_{21}$)($Q_{22}$)($Q_{23}$), and a $C_6$-$C_{60}$ aryl group substituted with at least one —Si($Q_{21}$)($Q_{22}$)($Q_{23}$), wherein $Q_{21}$ to $Q_{23}$ are each independently a hydrogen, a $C_1$-$C_{20}$ alkyl group, a $C_1$-$C_{20}$ alkoxy group, a $C_6$-$C_{20}$ aryl group, and a $C_2$-$C_{20}$ heteroaryl group.

7. The organic light-emitting device as claimed in claim 1, wherein, in Formula 2, $E_1$ is selected from Formulae 11-1 to 11-17:

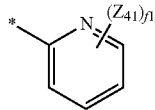

Formula 11-1

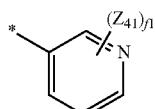

Formula 11-2

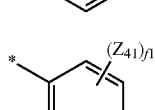

Formula 11-3

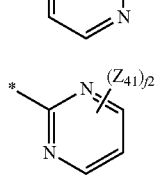

Formula 11-4

-continued

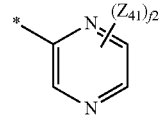

Formula 11-5

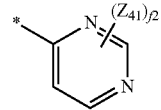

Formula 11-6

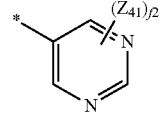

Formula 11-7

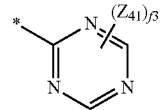

Formula 11-8

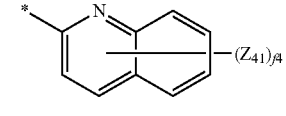

Formula 11-9

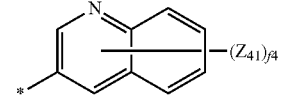

Formula 11-10

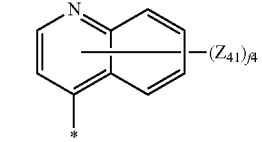

Formula 11-11

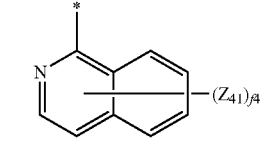

Formula 11-12

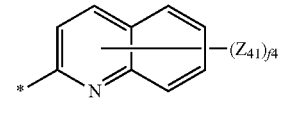

Formula 11-13

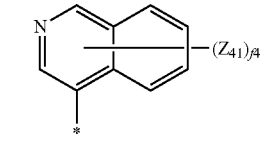

Formula 11-14

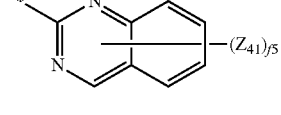

Formula 11-15

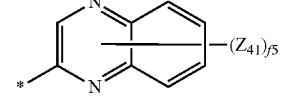

Formula 11-16

Formula 11-17

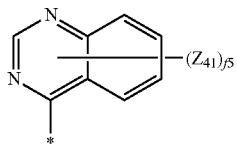

wherein $Z_{41}$ and $Z_{42}$ are each independently selected from a hydrogen, a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a phenyl group, a naphthyl group, an anthracenyl group, a pyrenyl group, a phenanthrenyl group, a fluorenyl group, a carbazolyl group, a benzocarbazolyl group, a dibenzocarbazolyl group, a pyridinyl group, a pyrimidinyl group, a pyrazinyl group, a pyridazinyl group, a triazinyl group, a quinolinyl group, an isoquinolinyl group, a quinoxalinyl group, a quinazolinyl group, a cinnolinyl group, a quinazolinyl group, —Si($Q_{21}$)($Q_{22}$)($Q_{23}$), and a phenyl group substituted with at least one —Si($Q_{21}$)($Q_{22}$)($Q_{23}$), wherein $Q_{21}$ to $Q_{23}$ are each independently a hydrogen, a $C_1$-$C_{20}$ alkyl group, a $C_1$-$C_{20}$ alkoxy group, a phenyl group, or a naphthyl group;

f1 is an integer of 1 to 4;
f2 is an integer of 1 to 3;
f3 is an integer of 1 or 2;
f4 is an integer of 1 to 6; and
f5 is an integer of 1 to 5.

8. The organic light-emitting device as claimed in claim 1, wherein ring A and ring B are each independently selected from
i) benzene and naphthalene; and
ii) benzene and naphthalene, each substituted with at least one of a deuterium atom, a methyl group, an ethyl group, a t-butyl group, an octyl group, a phenyl group, a naphthyl group, a pyridyl group, and a pyrimidyl group.

9. The organic light-emitting device as claimed in claim 1, wherein $Ar_{11}$ and $Ar_{12}$ are each independently represented by one selected from Formulae H1 to H81:

H1

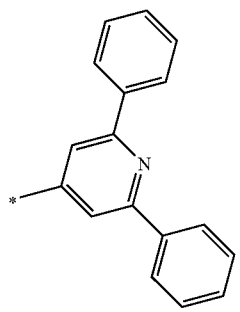

H2

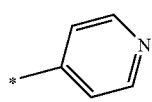

H3

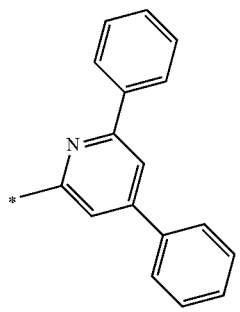

H4

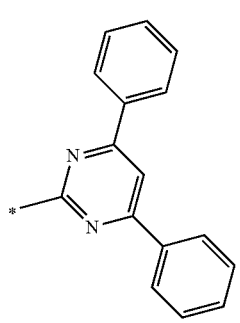

H5

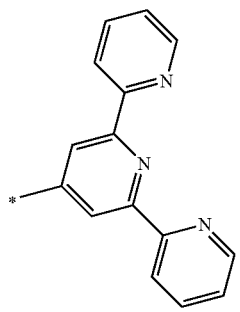

H6

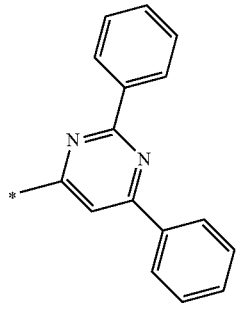

H7

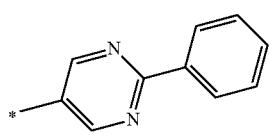

H8

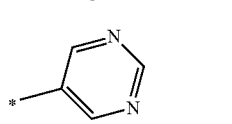

H9

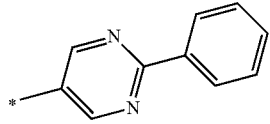

-continued
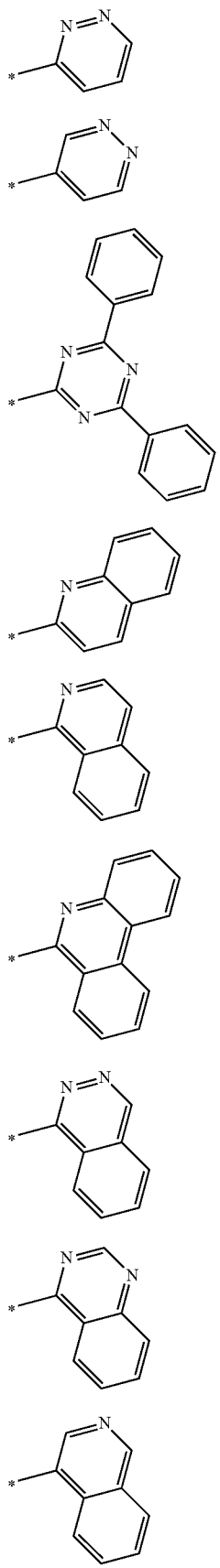
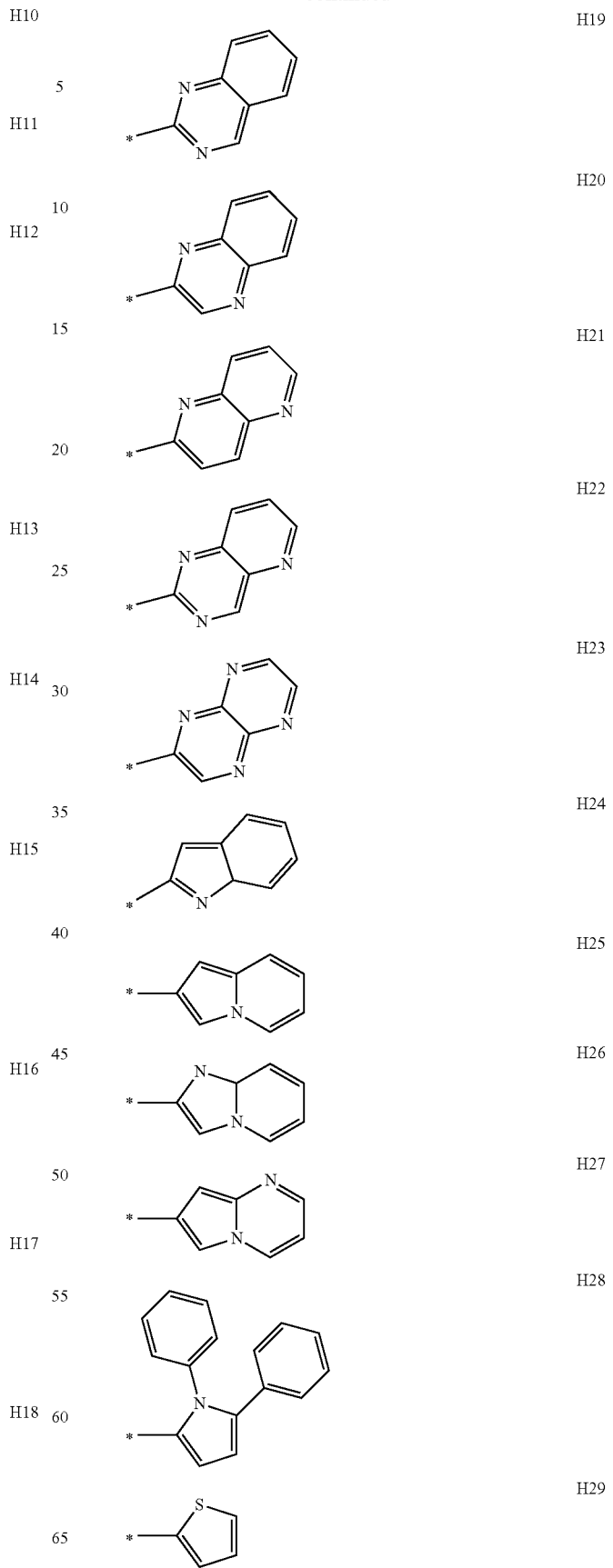

| | |
|---|---|
| 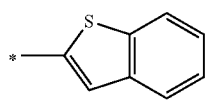 | H30 |
| 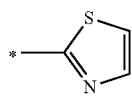 | H31 |
| 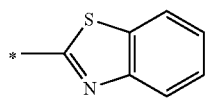 | H32 |
| 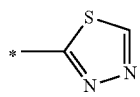 | H33 |
| 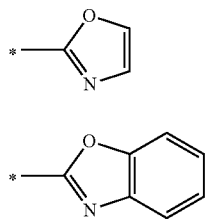 | H34 |
| 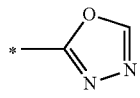 | H35 |
| 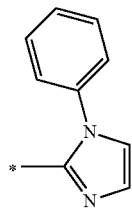 | H36 |
| 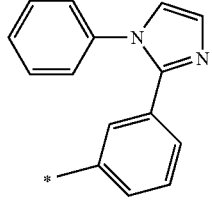 | H37 |
| 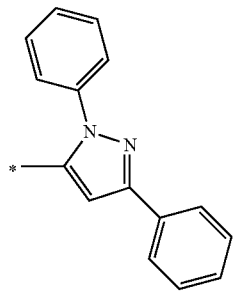 | H38 |
| | |
|---|---|
| 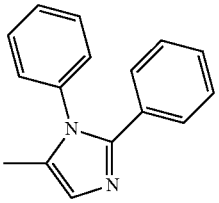 | H40 |
| 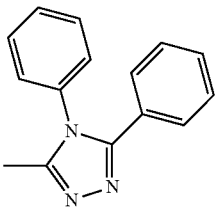 | H41 |
| 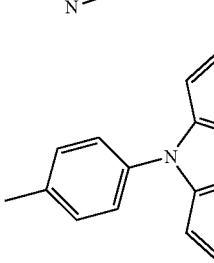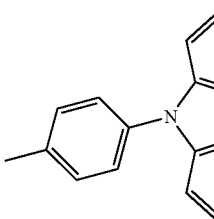 | H42 |
| 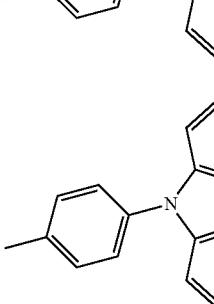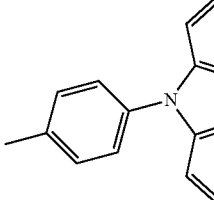 | H43 |
| 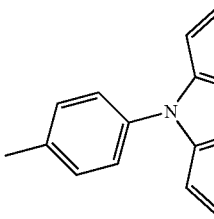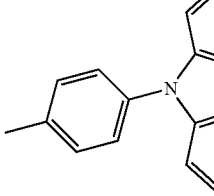 | H44 |
| 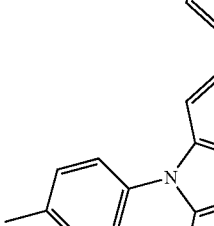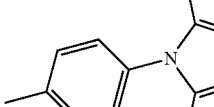 | H45 |
| 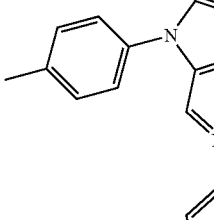 | H46 |

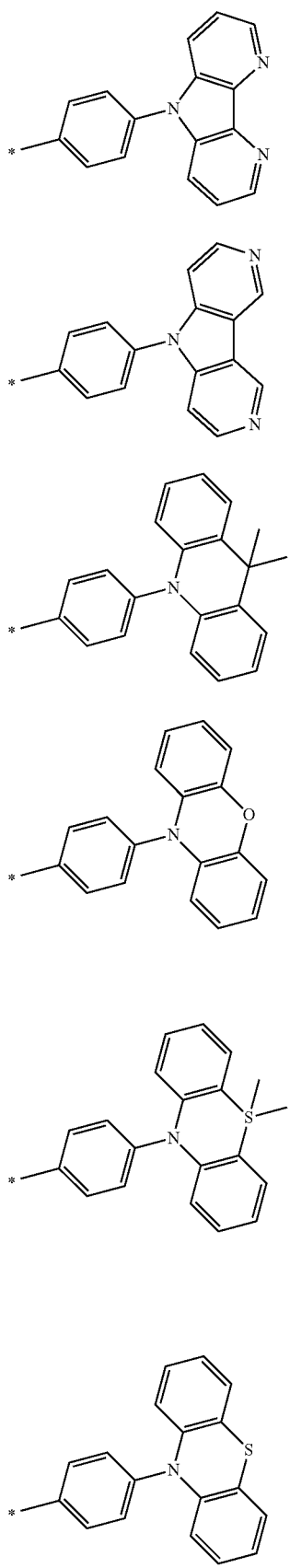
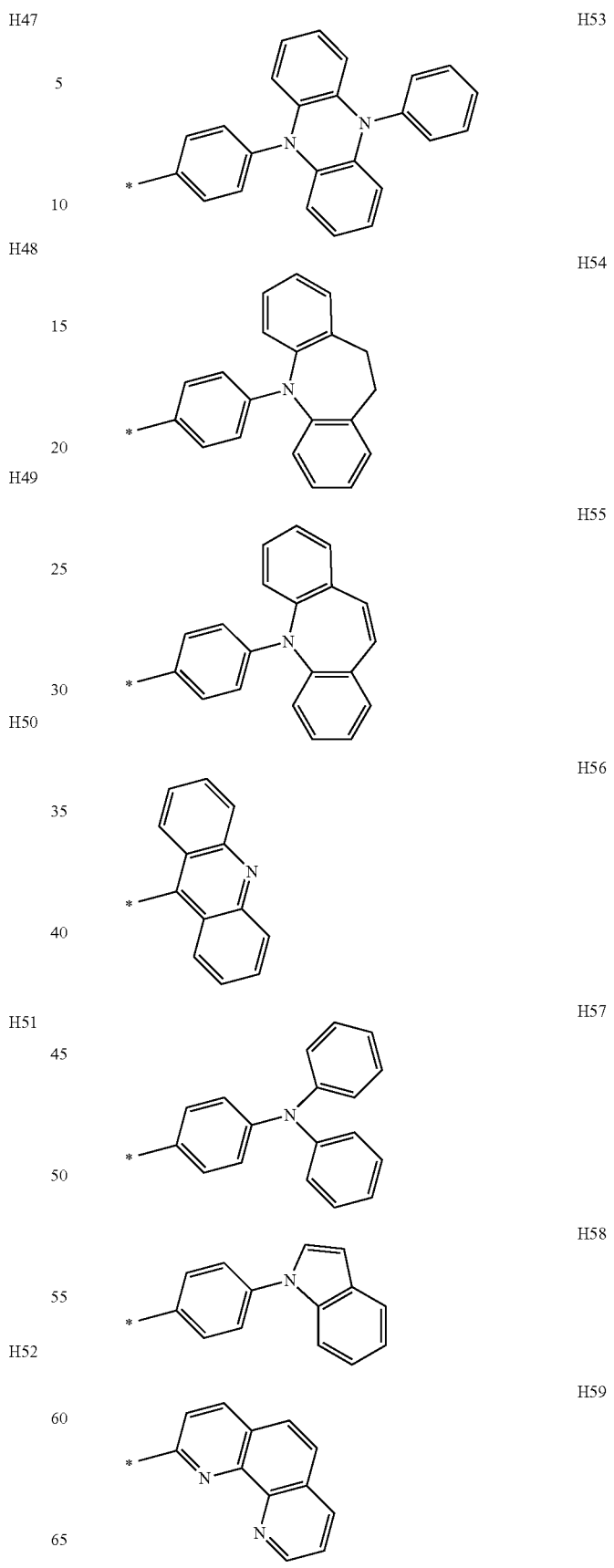

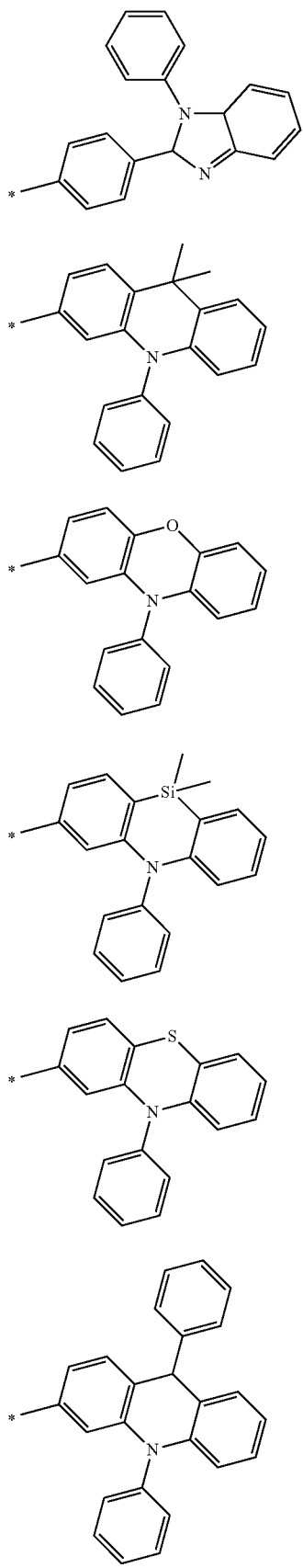
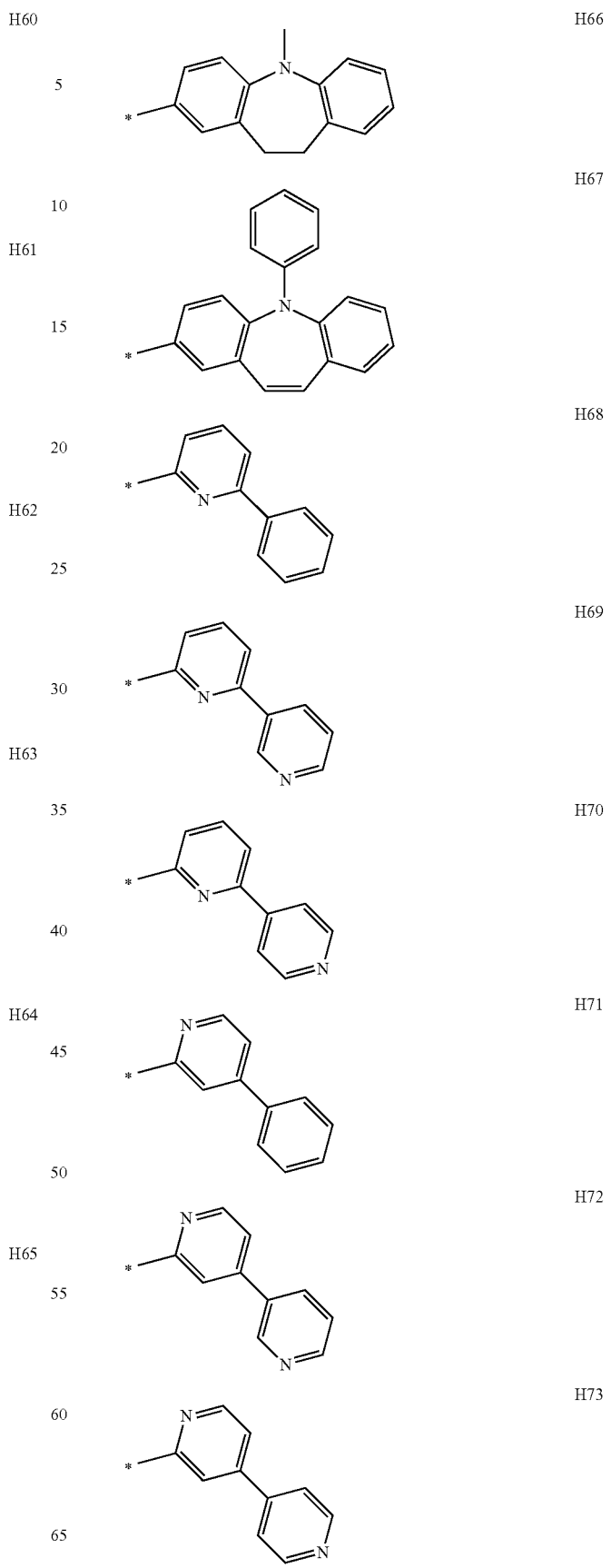

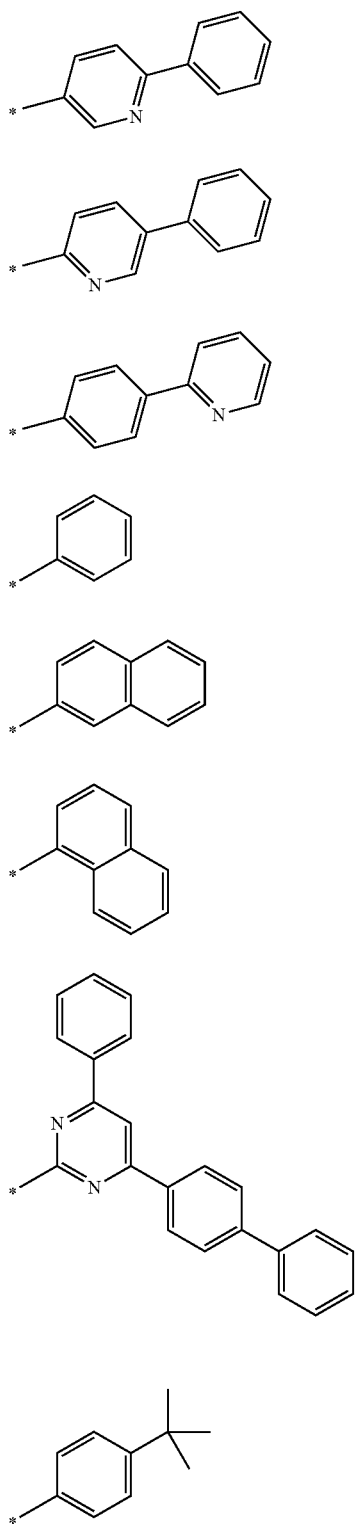
wherein * is a binding site with N, $L_1$ or $L_2$.
10. The organic light-emitting device as claimed in claim 1, wherein one of Formulae 10A, 10B, 10C, and 10E is represented by one selected from Formulae 1-1, 1-2, 1-4 to 1-12, and 1-16 to 1-28:
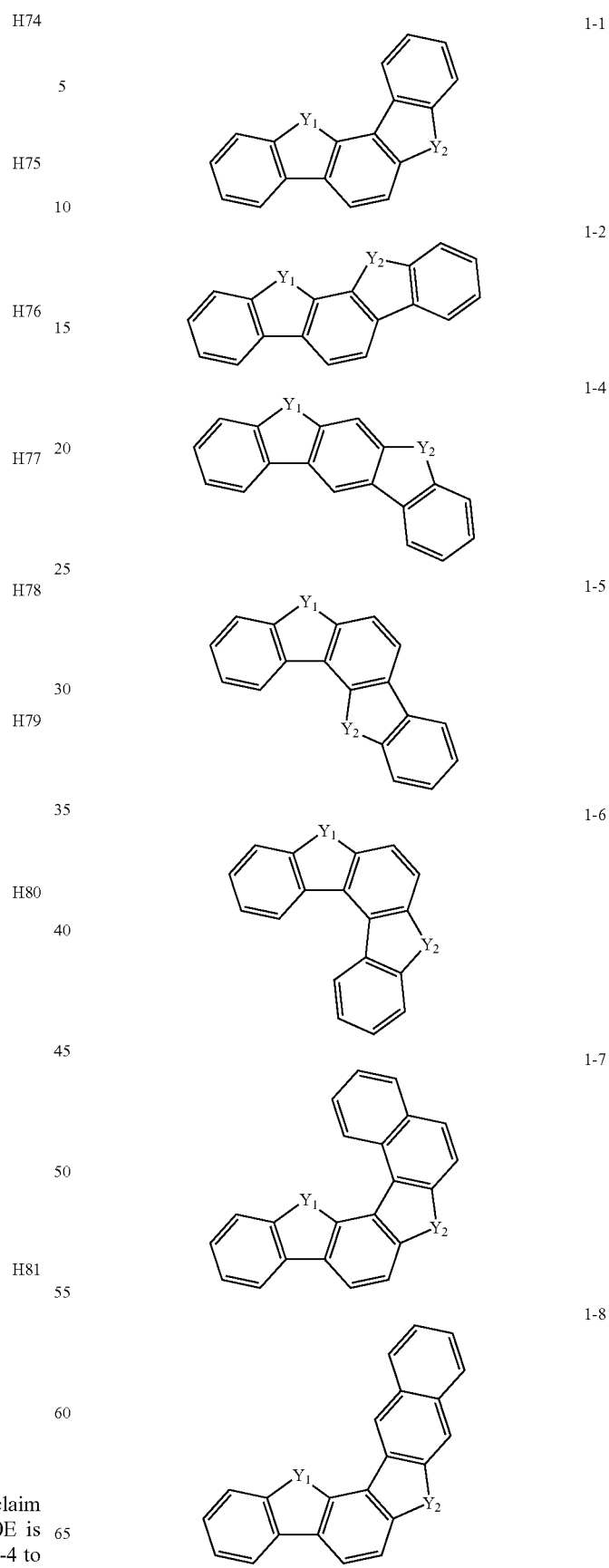

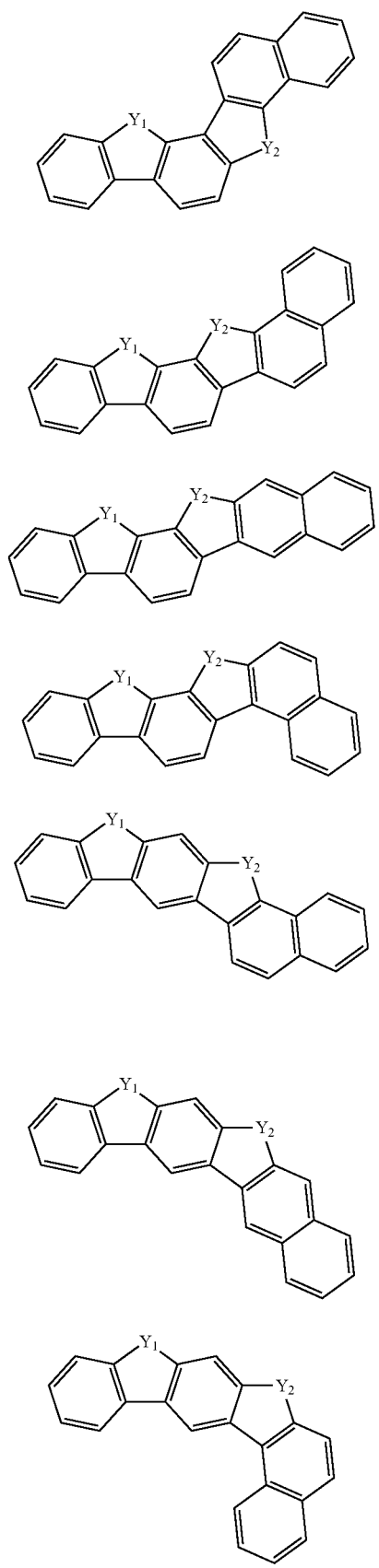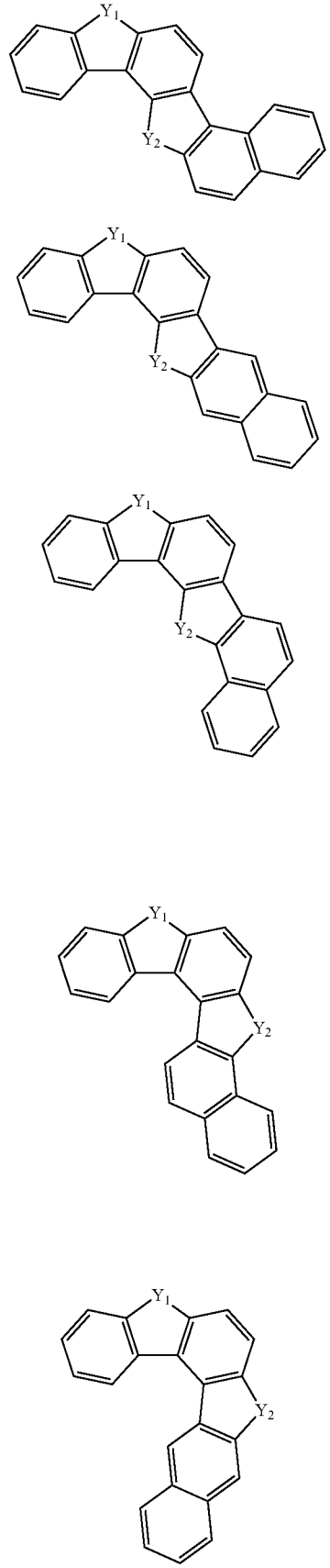

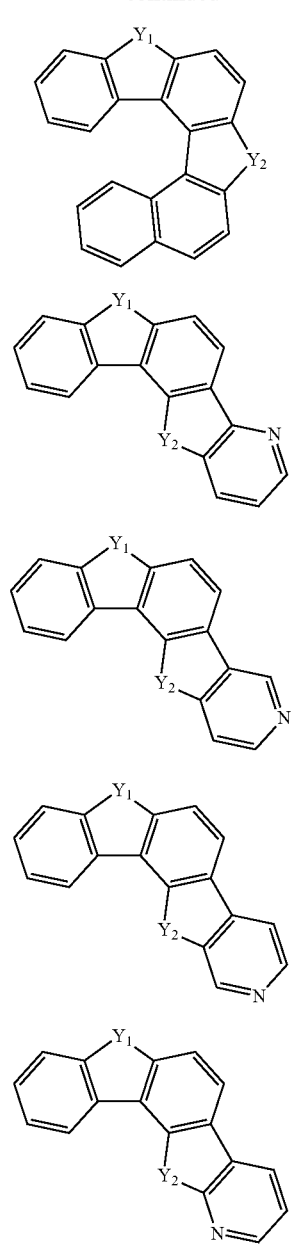

wherein $Y_1$ is $N-(L_1)_{n1}-Ar_{11}$;
$Y_2$ is $N-(L_2)_{n2}-Ar_{12}$, O, S, $C(R_{31})(R_{32})$, or $Si(R_{33})(R_{34})$;
$L_1$ and $L_2$ are each independently selected from a substituted or unsubstituted $C_3$-$C_{10}$ cycloalkylene group, a substituted or unsubstituted $C_3$-$C_{10}$ cycloalkenylene group, a substituted or unsubstituted $C_6$-$C_{60}$ arylene group, a substituted or unsubstituted $C_2$-$C_{10}$ heterocycloalkylene group, a substituted or unsubstituted $C_2$-$C_{10}$ heterocycloalkenylene group, and a substituted or unsubstituted $C_2$-$C_{60}$ heteroarylene group;
n1 and n2 are each independently an integer of 0 to 3;
$Ar_1$ and $Ar_{12}$ are each independently selected from
i) a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, and a $C_2$-$C_{60}$ heteroaryl group; and
ii) a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, and a $C_2$-$C_{60}$ heteroaryl group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group;

$R_{31}$ to $R_{34}$ are each independently selected from
i) a $C_1$-$C_{60}$ alkyl group, a $C_2$-$C_{60}$ alkenyl group, a $C_2$-$C_{60}$ alkynyl group, and a $C_1$-$C_{60}$ alkoxy group;
ii) a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group;
iii) a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, and a $C_2$-$C_{60}$ heteroaryl group; and
iv) a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, and a $C_2$-$C_{60}$ heteroaryl group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group.

11. The organic light-emitting device as claimed in claim 1, wherein $L_1$, $L_2$, $L_{11}$, $L_{21}$, and $L_{22}$ are each independently selected from
a phenylene group, a pentalenylene group, an indenylene group, a naphthylene group, an azulenylene group, a heptalenylene group, an indacenylene group, an acenaphthylene group, a fluorenylene group, a spiro-fluorenylene group, a phenalenylene group, a phenanthrenylene group, an anthracenylene group, a fluoranthrenylene group, a triphenylenylene group, a pyrenylene group, a chrysenylene group, a naphthacenylene group, a picenylene group, a perylenylene group, a pentaphenylene group, a hexacenylene group, a pyrrolylene group, an imidazolylene group, a pyrazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzooxazolylene group, a benzoimidazolylene group, a furanylene group, a benzofuranylene group, a thiophenylene group, a benzothiophenylene group, a thiazolylene group, an isothiazolylene group, a benzothiazolylene group, an isoxazolylene group, an oxazolylene group, a triazolylene group, a tetrazolylene group, an oxadiazolylene group, a triazinylene group, a dibenzofuranylene group, a dibenzothiophenylene group, a benzocarbazolylene group, and a dibenzocarbazolylene group; and a phenylene group, a pentalenylene group, an indenylene group, a naphthylene group, an azulenylene group, a heptalenylene group, an indacenylene group, an acenaphthylene group, a fluorenylene group, a Spirofluorenylene group, a phenalenylene group, a phenanthrenylene group, an anthracenylene group, a fluoranthrenylene group, a triphenylenylene group, a pyrenylene group, a chrysenylene group, a naphthacenylene group, a picenylene group, a perylenylene group, a pentaphenylene group, a hexacenylene group, a pyrrolylene group, an imidazolylene group, a pyrazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzooxazolylene group, a benzoimidazolylene group, a furanylene group, a benzofuranylene group, a thiophenylene group, a benzothiophenylene group, a thiazolylene group, an isothiazolylene group, a benzothiazolylene group, an isoxazolylene group, an oxazolylene group, a triazolylene group, a tetrazolylene group, an oxadiazolylene group, a triazinylene group, a dibenzofuranylene group, a dibenzothiophenylene group, a benzocarbazolylene group, and a dibenzocarbazolylene group, each substituted with at least one of a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a phenyl group, a naphthyl group, an anthracenyl group, a pyrenyl group, a phenanthrenyl group, a fluorenyl group, a carbazolyl group, a benzocarbazolyl group, a dibenzocarbazolyl group, a pyridinyl group, a pyrimidinyl group, a pyrazinyl group, a pyridazinyl group, a triazinyl group, a quinolinyl group, an isoquinolinyl group, a quinoxalinyl group, a quinazolinyl group, a cinnolinyl group, and a quinazolinyl group.

12. The organic light-emitting device as claimed in claim 1, wherein $L_1$, $L_2$, $L_{11}$, $L_{21}$, and $L_{22}$ are each independently selected from Formulae 3-1 to 3-32:

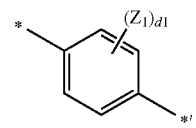

Formula 3-1

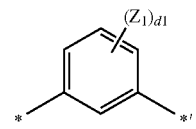

Formula 3-2

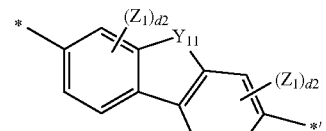

Formula 3-3

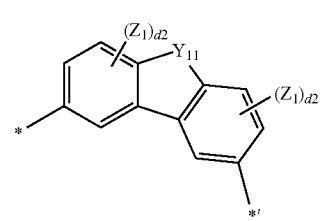

Formula 3-4

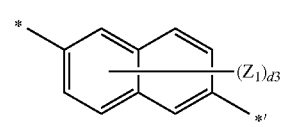

Formula 3-5

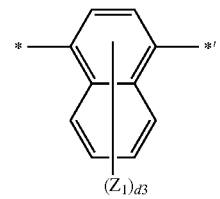

Formula 3-6

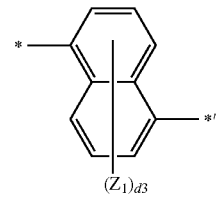

Formula 3-7

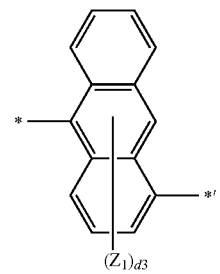

Formula 3-8

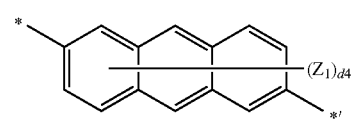

Formula 3-9

-continued
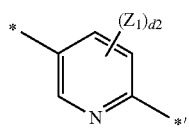
Formula 3-10
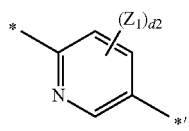
Formula 3-11
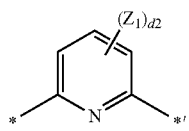
Formula 3-12
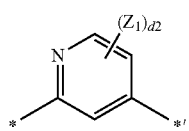
Formula 3-13
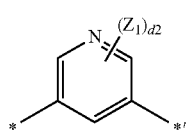
Formula 3-14
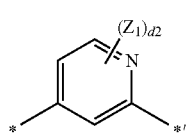
Formula 3-15
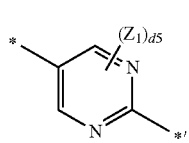
Formula 3-16
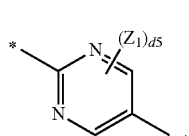
Formula 3-17
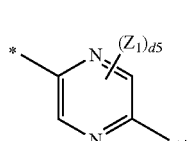
Formula 3-18
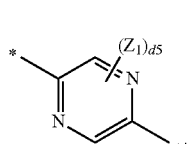
Formula 3-19
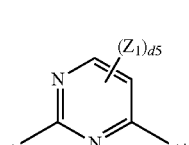
Formula 3-20
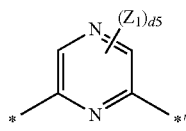
Formula 3-21
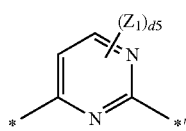
Formula 3-22
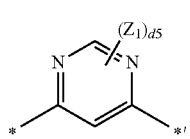
Formula 3-23
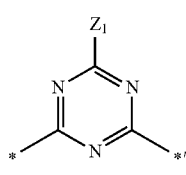
Formula 3-24
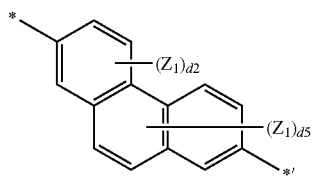
Formula 3-25
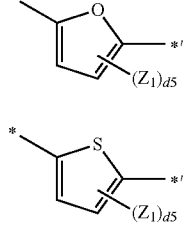
Formula 3-26
Formula 3-27
Formula 3-28
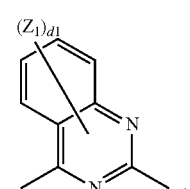
Formula 3-29
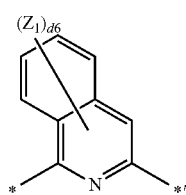

-continued

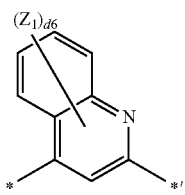
Formula 3-30

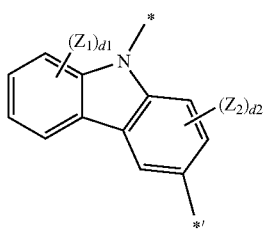
Formula 3-31

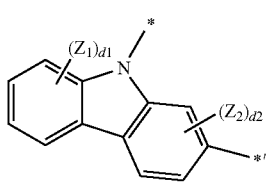
Formula 3-32 wherein $Y_{11}$ is O, S, S(=O), S(=O)$_2$, C(Z$_3$)(Z$_4$), N(Z$_5$), or Si(Z$_6$)(Z$_7$);

$Z_1$ to $Z_7$ are each independently selected from a hydrogen, a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a phenyl group, a naphthyl group, an anthracenyl group, a pyrenyl group, a phenanthrenyl group, a fluorenyl group, a carbazolyl group, a benzocarbazolyl group, a dibenzocarbazolyl group, a pyridinyl group, a pyrimidinyl group, a triazinyl group, a quinolinyl group, an isoquinolinyl group, and a quinazolinyl group d1 is an integer of 1 to 4;
d2 is an integer of 1 to 3;
d3 is an integer of 1 to 6;
d4 is an integer of 1 to 8;
d5 is an integer of 1 to 2;
d6 is an integer of 1 to 5; and
* is a binding site with a neighboring atom.

13. The organic light-emitting device as claimed in claim 1, wherein, in Formulae 1A and 1C, Ar$_{21}$ and Ar$_{22}$ are each independently selected from a phenyl group, a naphthyl group, a fluorenyl group, a spiro-fluorenyl group, a phenanthrenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group; and a phenyl group, a naphthyl group, a fluorenyl group, a spiro-fluorenyl group, a phenanthrenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinylene group, a carbazolyl group, and a triazinyl group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a phenanthrenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinylene group, a carbazolyl group, and a triazinyl group.

14. The organic light-emitting device as claimed in claim 1, wherein, in Formulae 1A and 1C, Ar$_{21}$ and Ar$_{22}$ are each independently represented by one of Formulae 5-1 to 5-20:

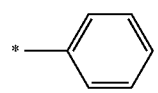
Formula 5-1

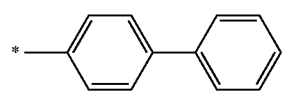
Formula 5-2

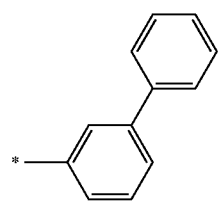
Formula 5-3

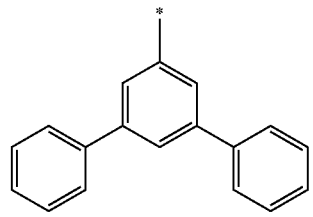
Formula 5-4

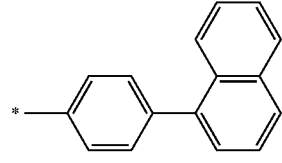
Formula 5-5

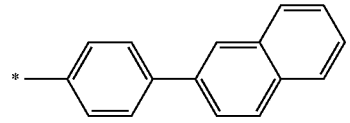
Formula 5-6

165
-continued
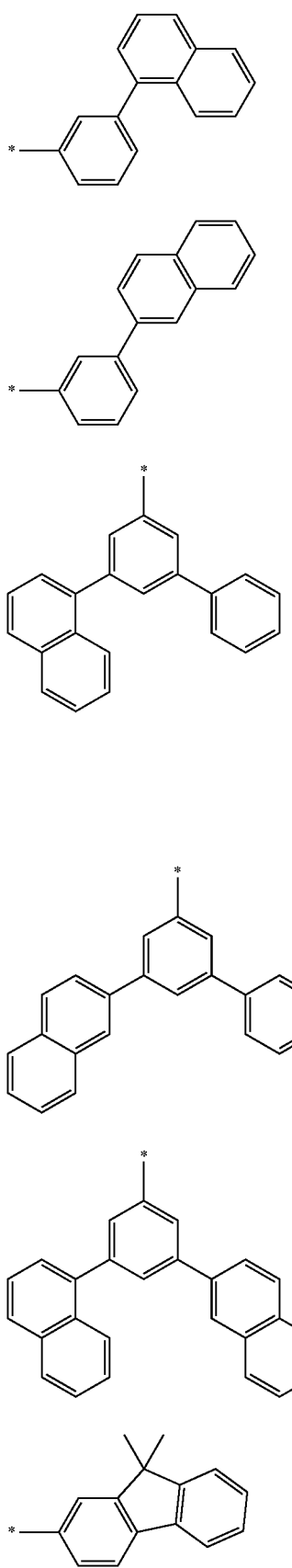
166
-continued
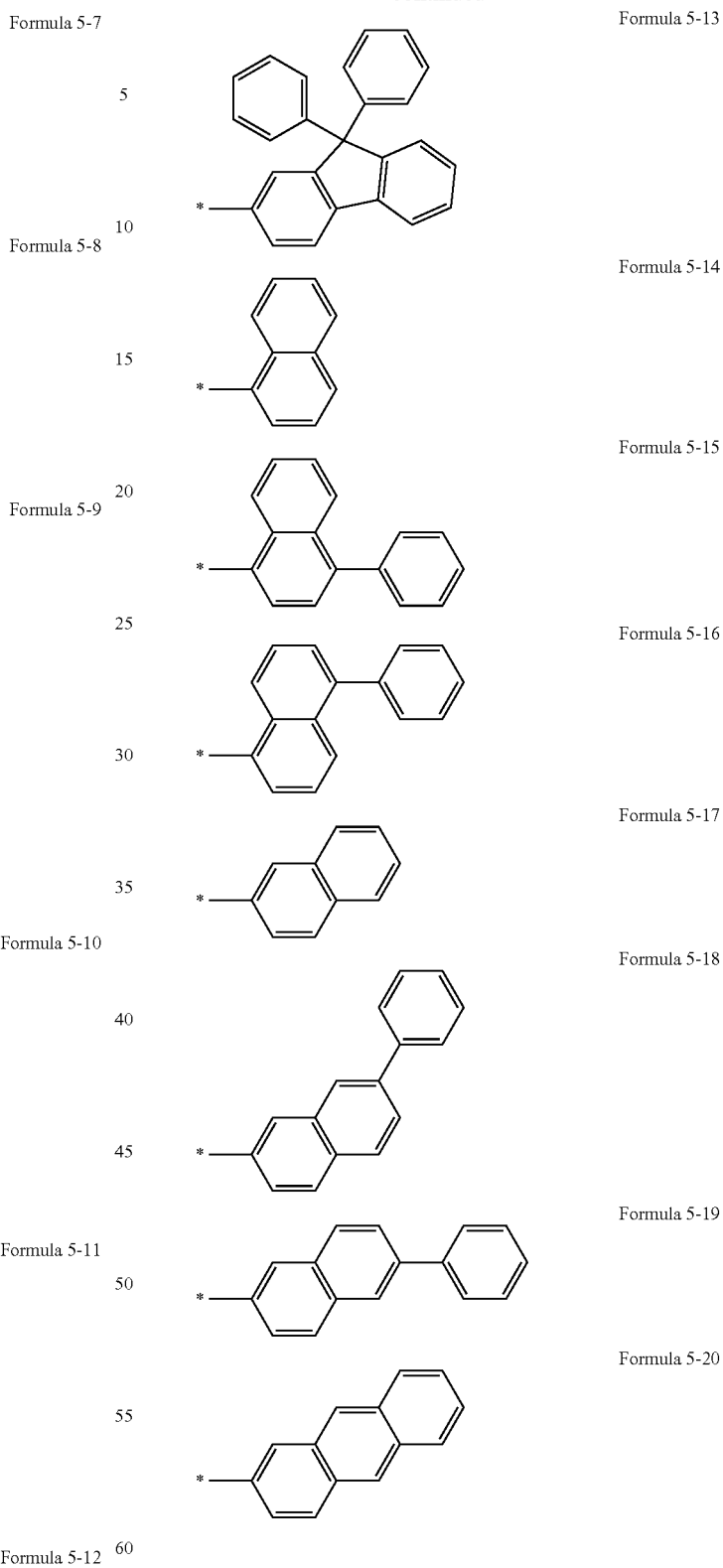
wherein * in Formulae 5-1 to 5-20 is a binding site with nitrogen (N), a binding site with $L_{21}$, or a binding site with $L_{22}$.
15. The organic light-emitting device as claimed in claim 1, wherein, in Formula 1A and 1C, at least one of $Ar_{21}$ and $Ar_{22}$ is selected from a naphthyl group; and a naphthyl group substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a phenanthrenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinylene group, a carbazolyl group, and a triazinyl group.

16. The organic light-emitting device as claimed in claim 1, wherein, in Formulae 1A and 1C, $R_{51}$ and $R_{52}$ are each independently selected from
    a $C_1$-$C_{20}$ alkyl group;
    a $C_1$-$C_{20}$ alkyl group substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a spiro-fluorenyl group, a phenanthrenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinylene group, a carbazolyl group, and a triazinyl group;
    a phenyl group, a naphthyl group, a fluorenyl group, a spiro-fluorenyl group, a phenanthrenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinylene group, a carbazolyl group, and a triazinyl group; and
    a phenyl group, a naphthyl group, a fluorenyl group, a spiro-fluorenyl group, a phenanthrenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinylene group, a carbazolyl group, and a triazinyl group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a phenanthrenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinylene group, a carbazolyl group, and a triazinyl group.

17. The organic light-emitting device as claimed in claim 1, wherein, in Formulae 1A, 1C, and 2, $R_{53}$, $R_{54}$, $R_{11}$ to $R_{21}$, $R_{61}$ to $R_{64}$, $R_{41}$, and $R_{42}$ are each independently selected from a hydrogen, a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, $C_1$-$C_{20}$ alkyl group, $C_1$-$C_{20}$ alkoxy group, and groups represented by Formulae 5-1 to 5-20:

Formula 5-1

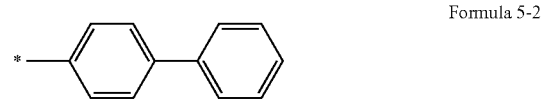

Formula 5-2

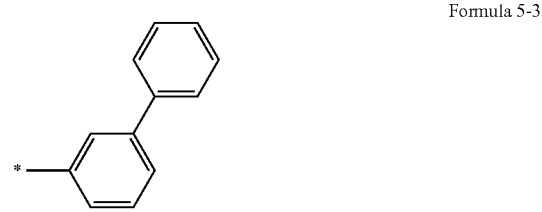

Formula 5-3

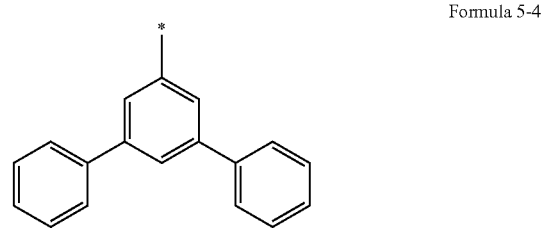

Formula 5-4

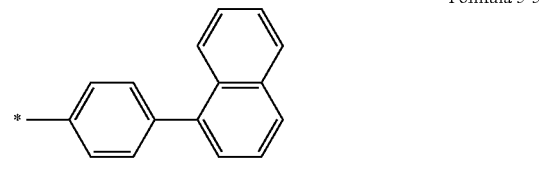

Formula 5-5

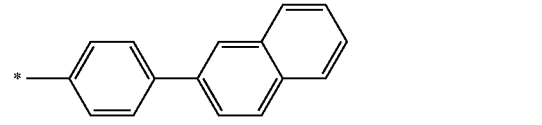

Formula 5-6

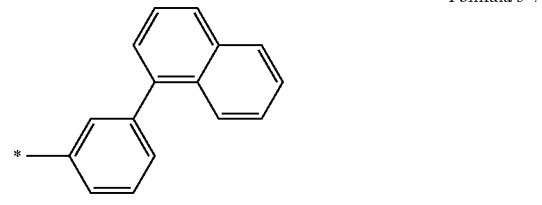

Formula 5-7

169
-continued
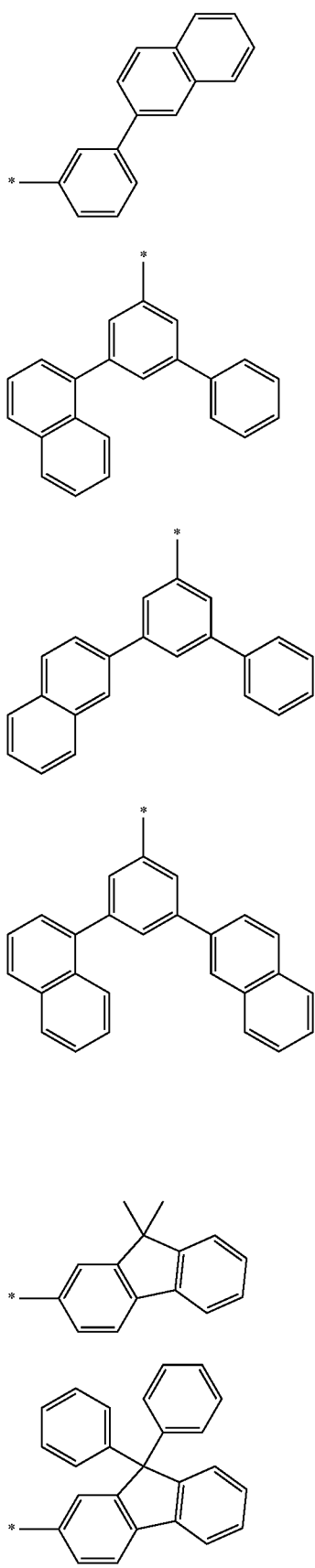
170
-continued
Formula 5-8
Formula 5-9
Formula 5-10
Formula 5-11
Formula 5-12
Formula 5-13
Formula 5-14
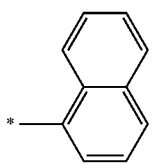
Formula 5-15
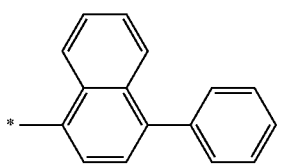
Formula 5-16
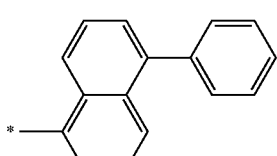
Formula 5-17
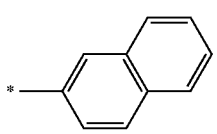
Formula 5-18
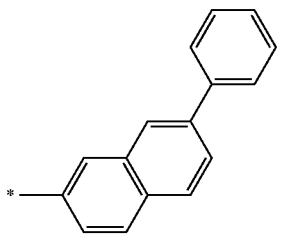
Formula 5-19
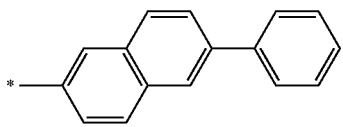
Formula 5-20
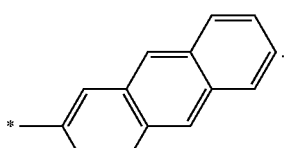
18. The organic light-emitting device as claimed in claim 1, wherein, the amine-based compound is represented by one of Formulae 1A-1 and 1C-1:

<Formula 1A-1>
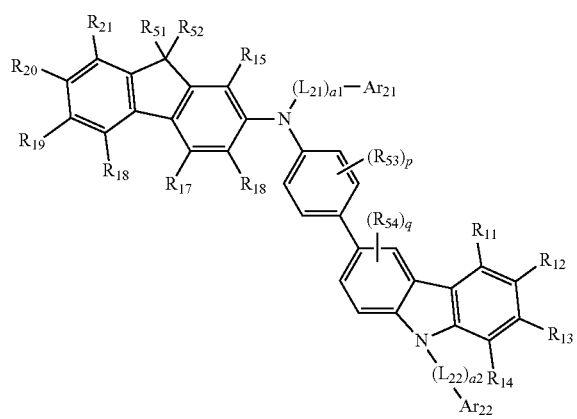
<Formula 1C-1>
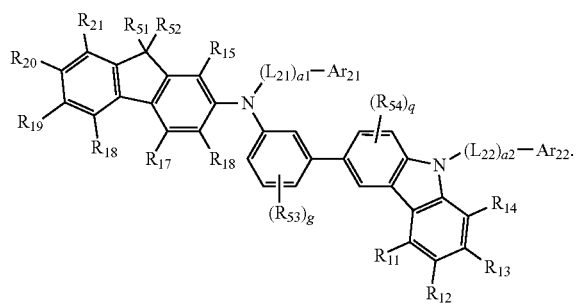
19. The organic light-emitting device as claimed in claim 1, wherein the amine-based compound is selected from Compounds 1 to 10:
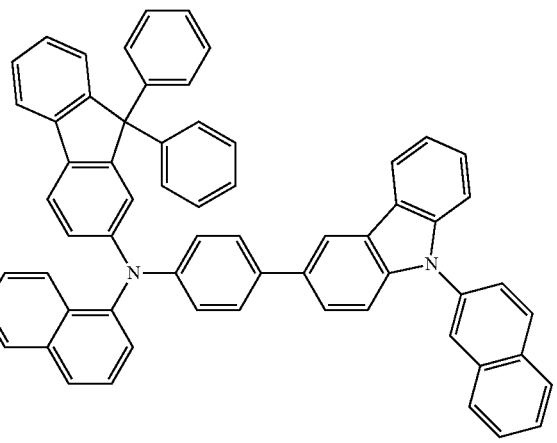
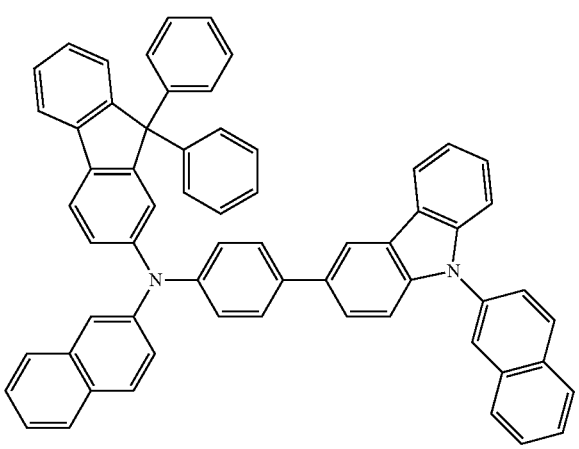
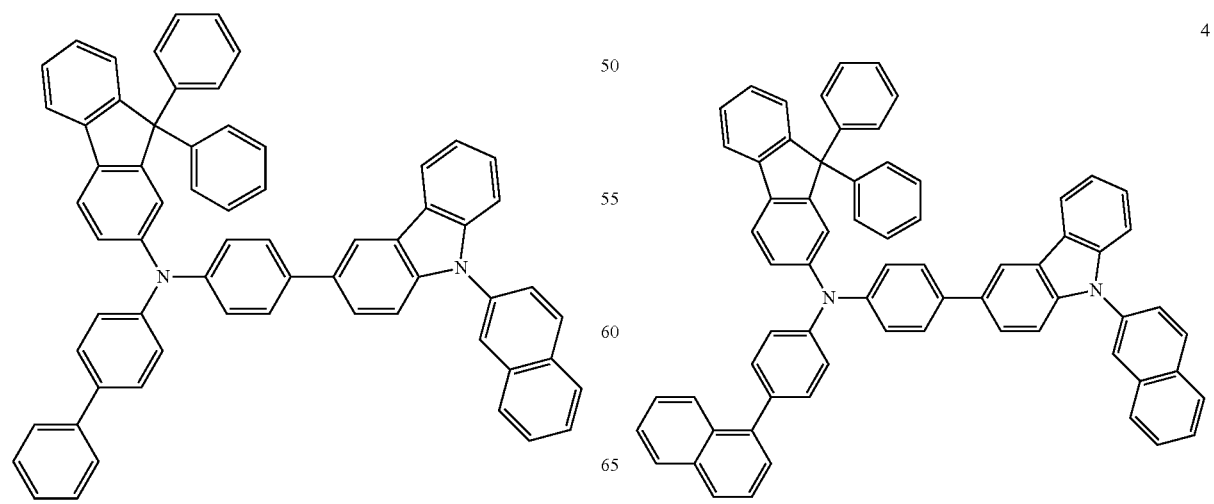

173
-continued
5
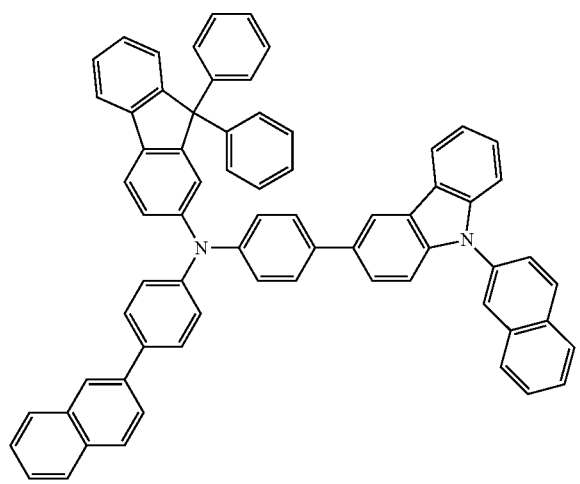
6
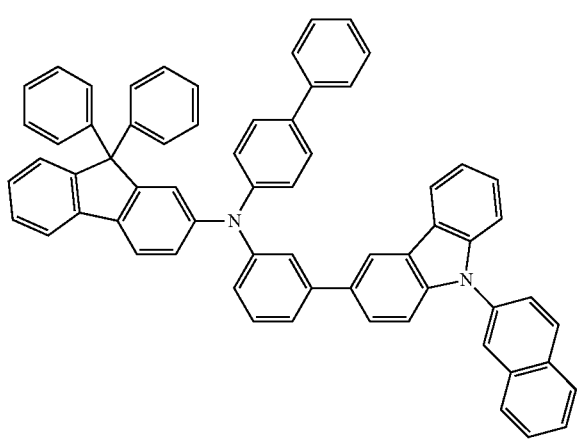
7
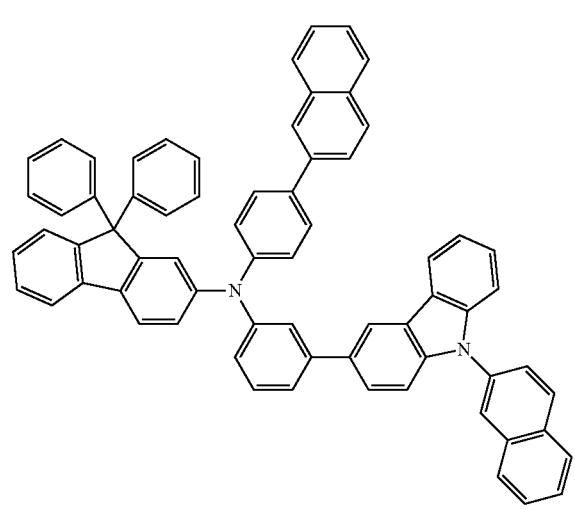
174
-continued
8
9
10
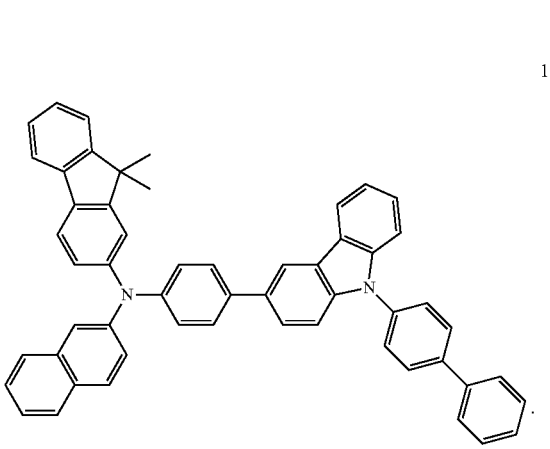
20. The organic light-emitting device as claimed in claim 1, wherein the host includes a compound selected from one of the following Compounds:

-continued
101A
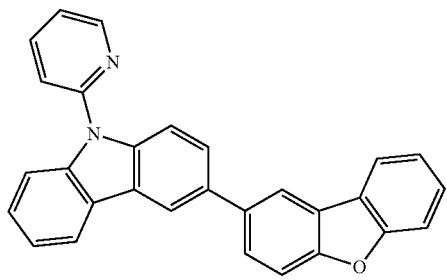
102A
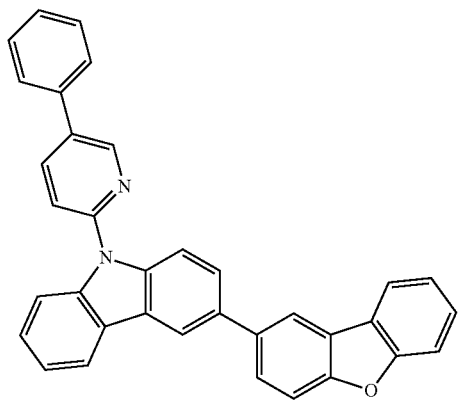
103A
104A
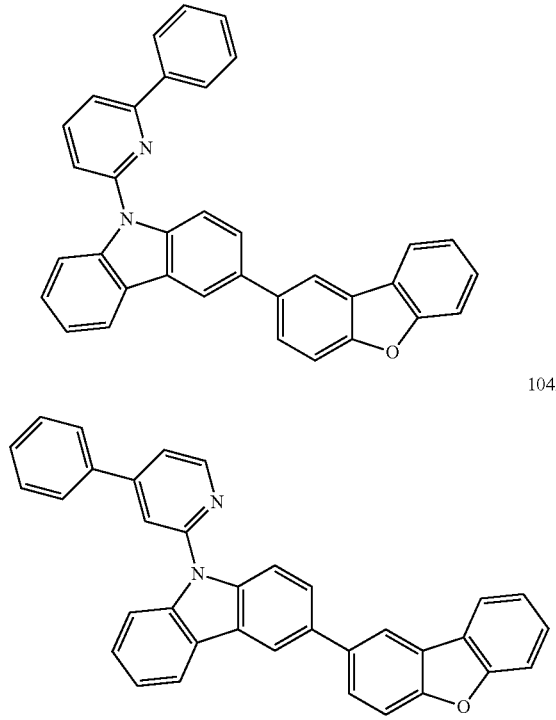
105A
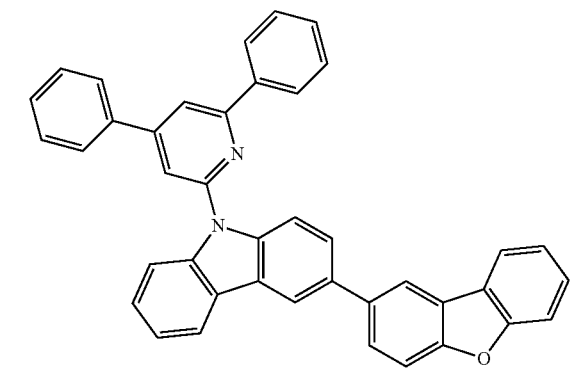
106A
107A
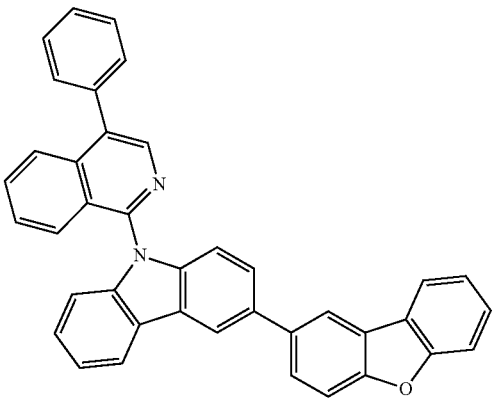

108A
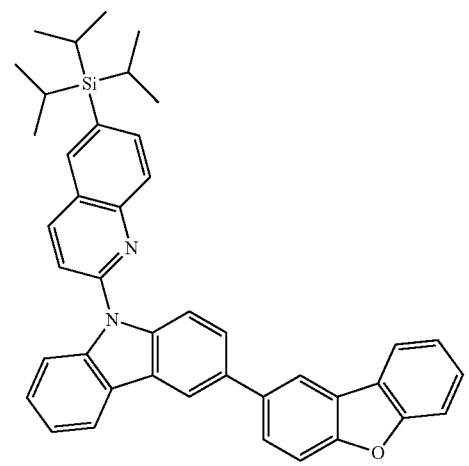
109A
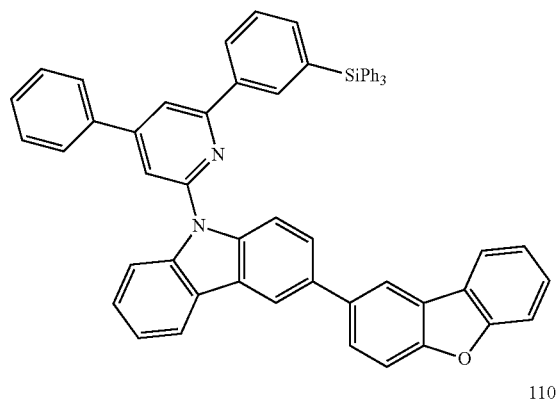
110A
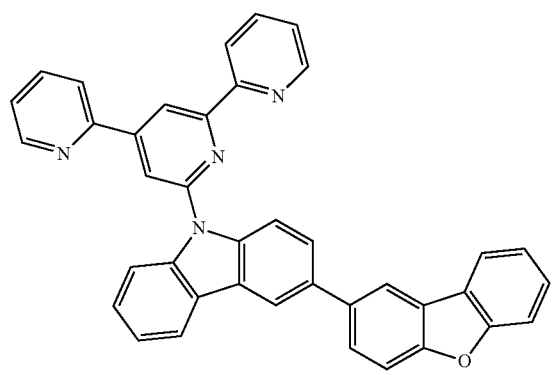
111A
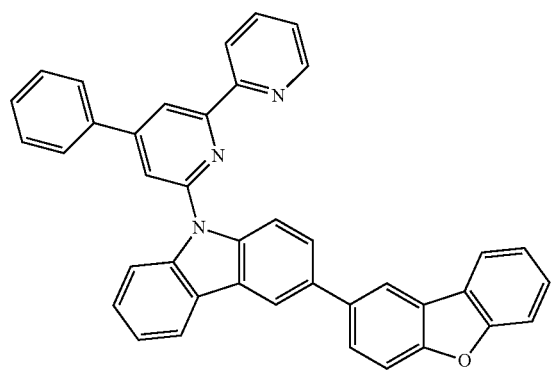
112A
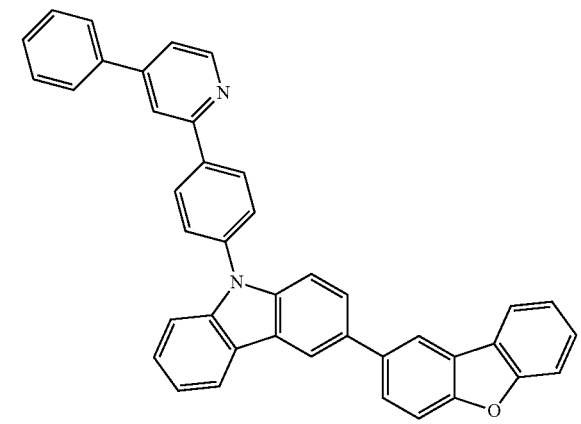
113A
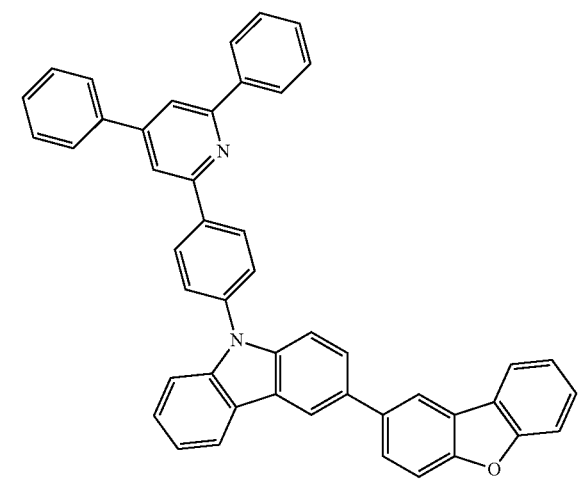
114A
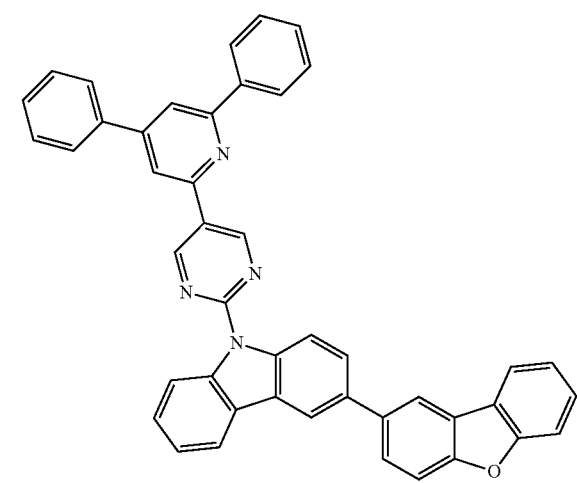

115A
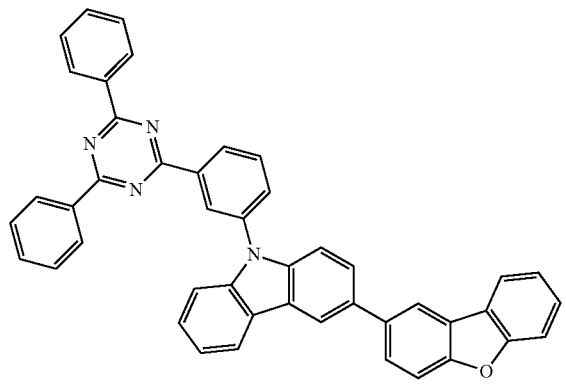
116A
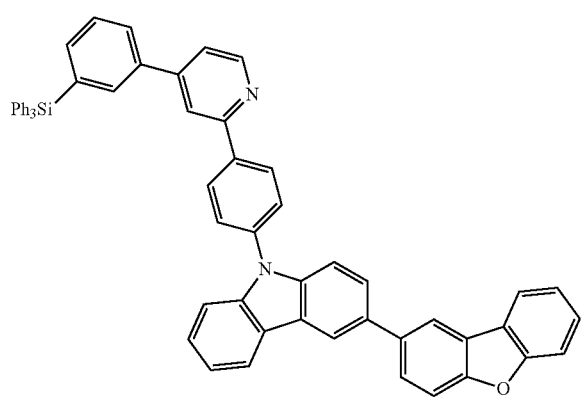
117A
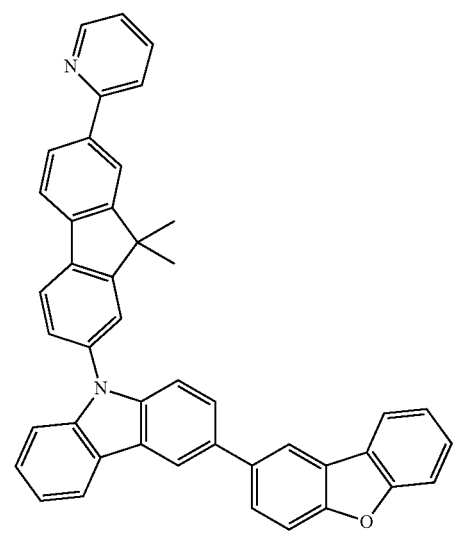
118A
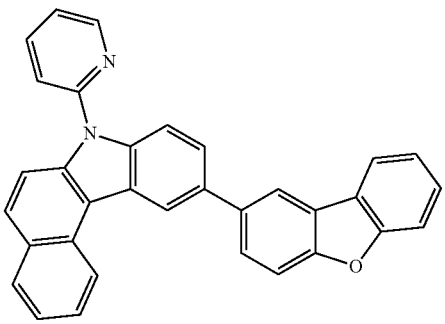
119A
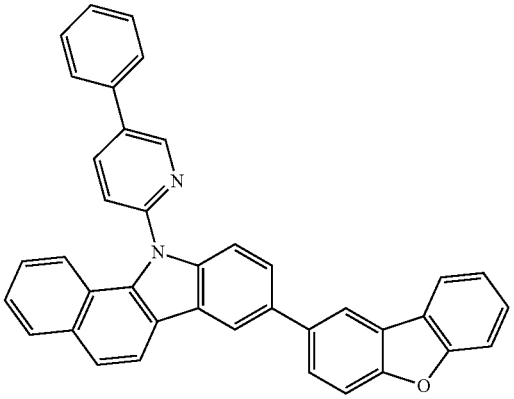
120A
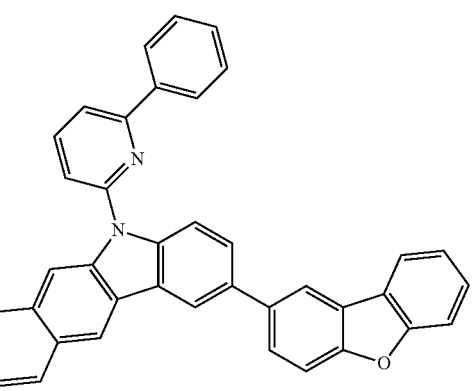
121A
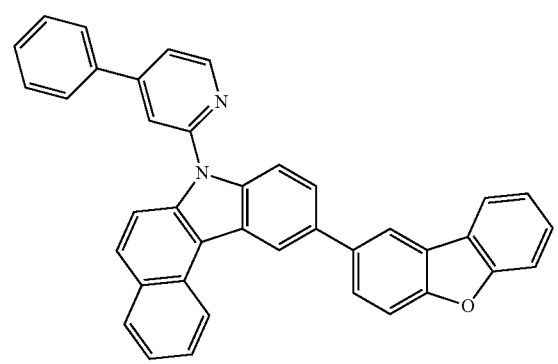

122A
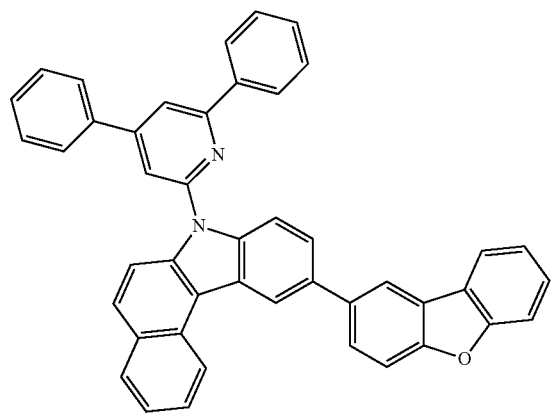
123A
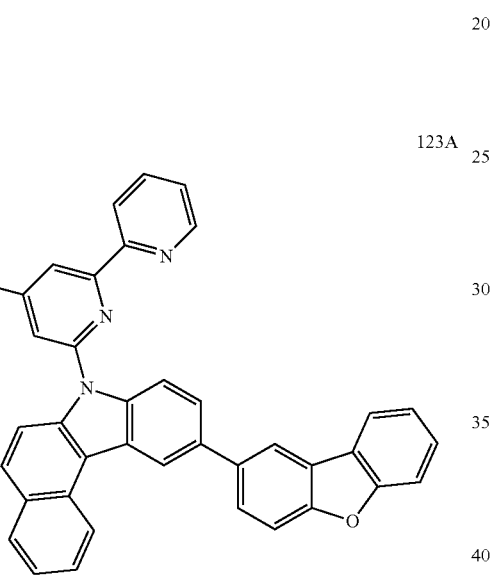
124A
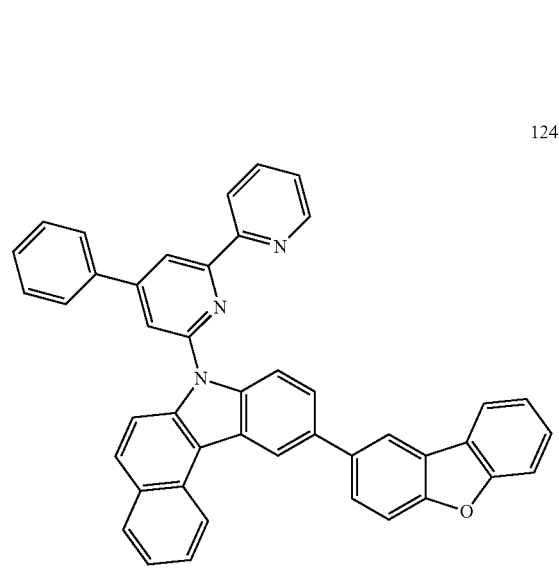
125A
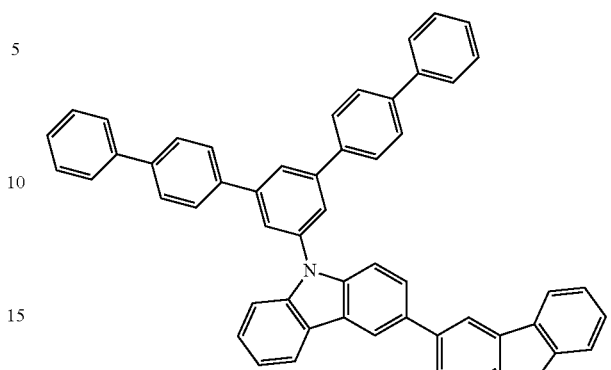
126A
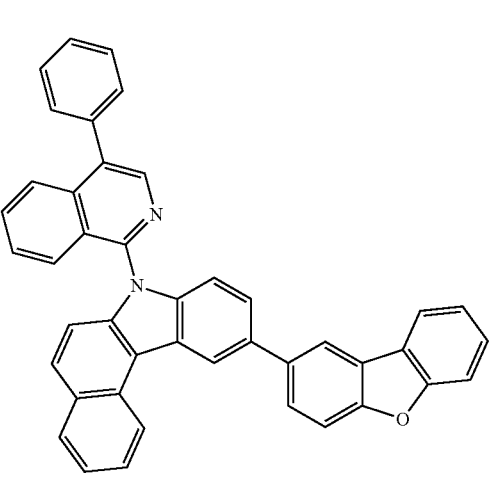
127A
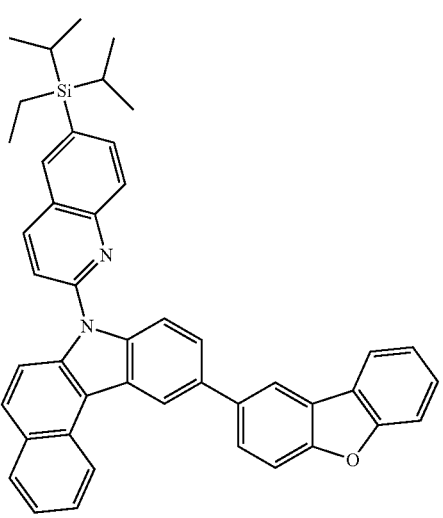

-continued
128A
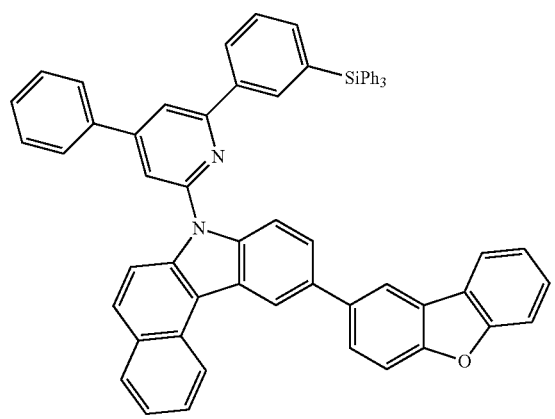
129A
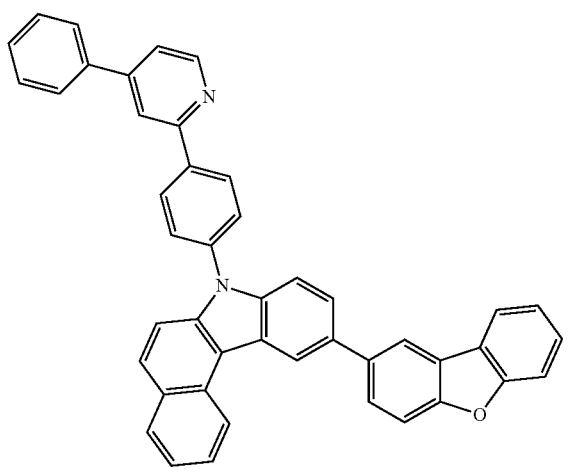
130A
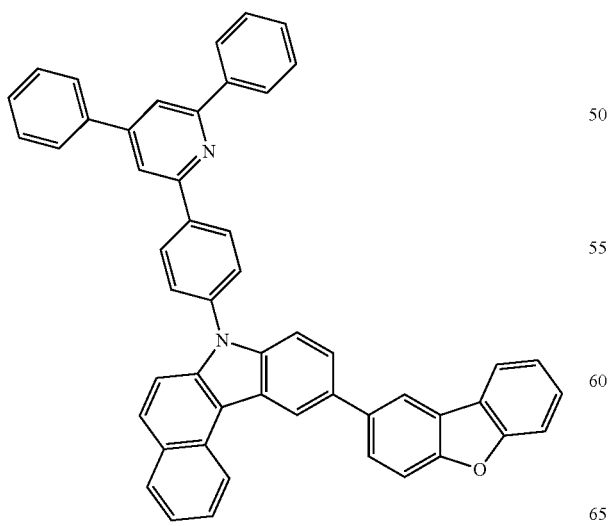
-continued
131A
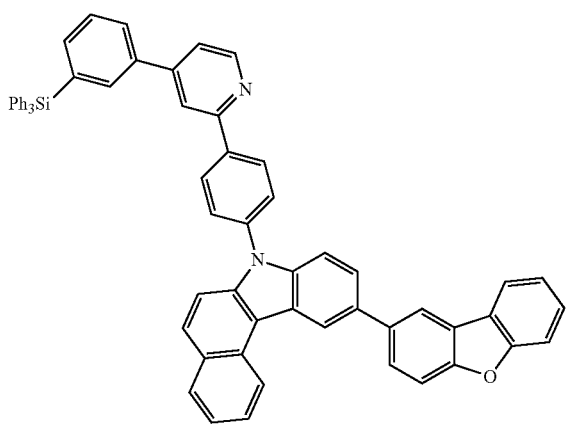
132A
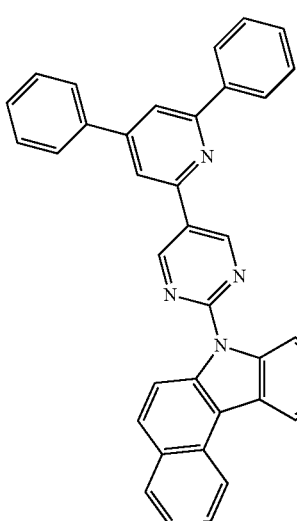
133A
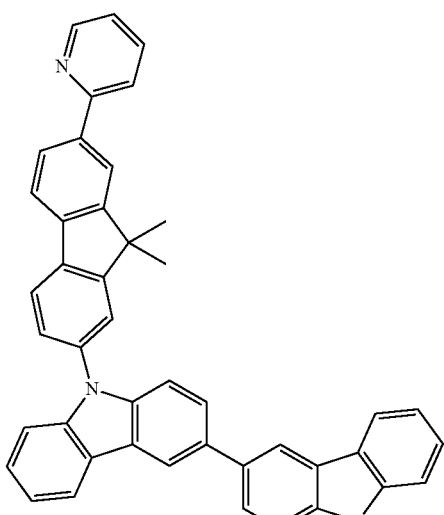

134A
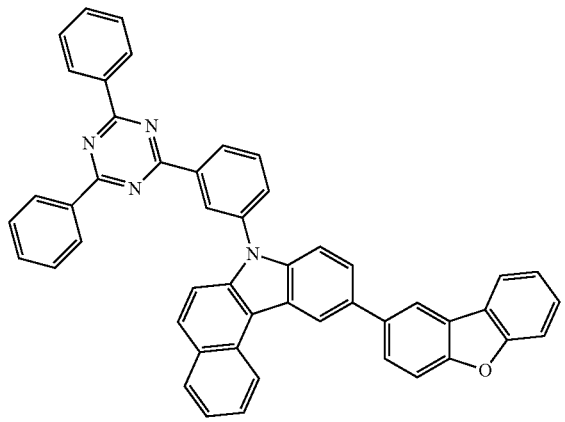
135A
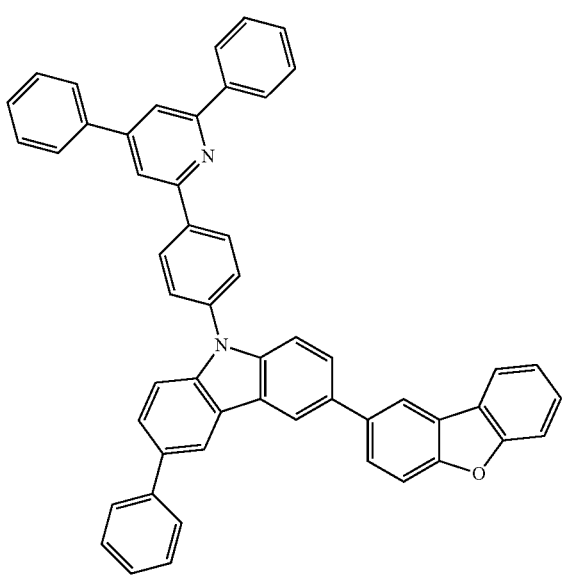
136A
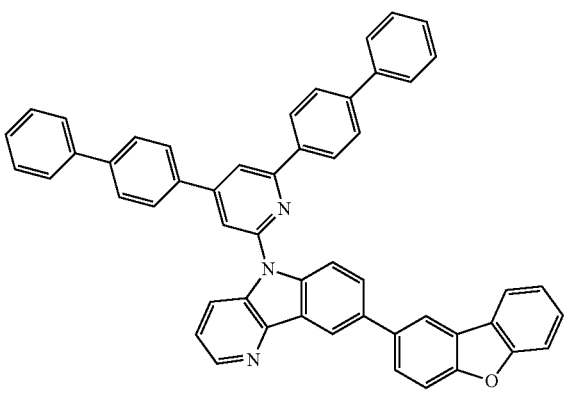
137A
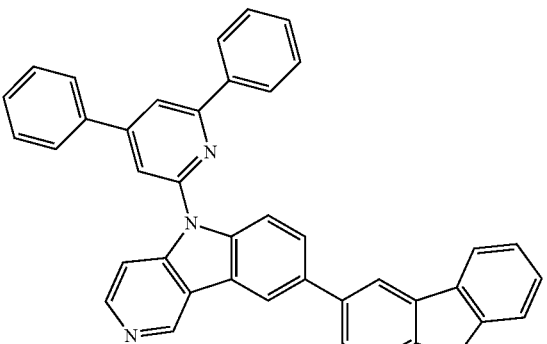
138A
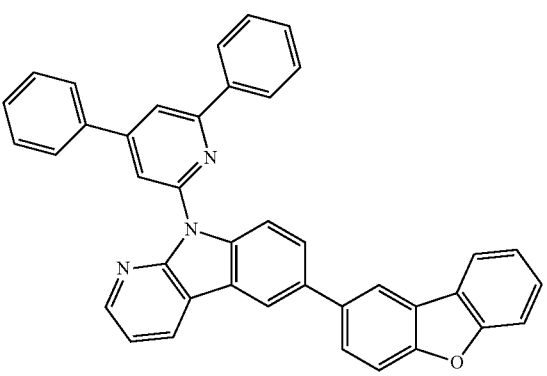
139A
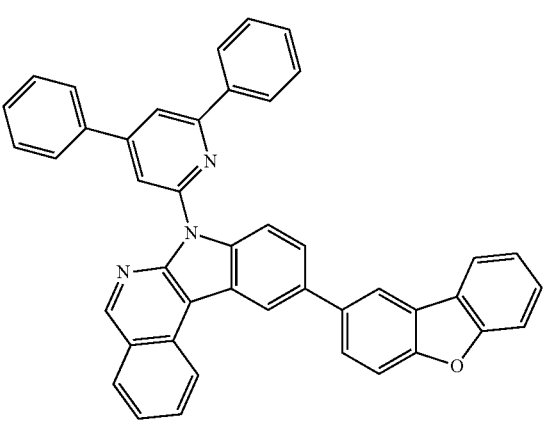
140A
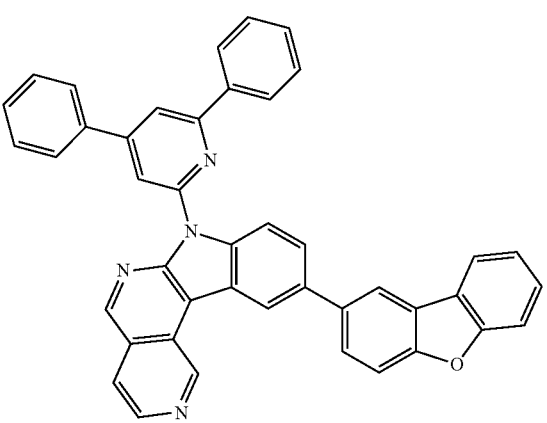

-continued
141A
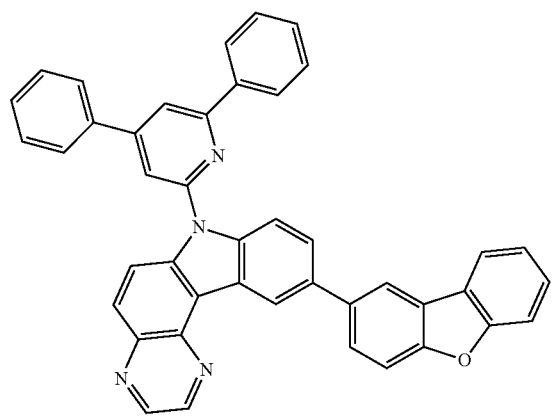
142A
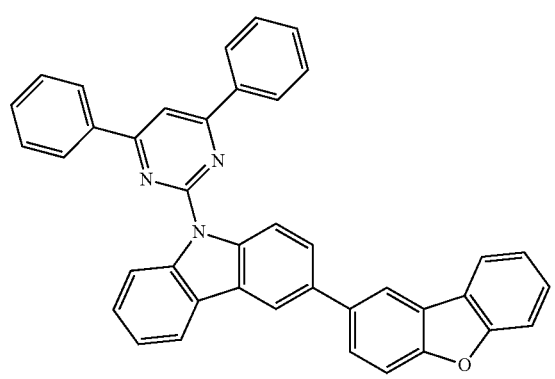
143A
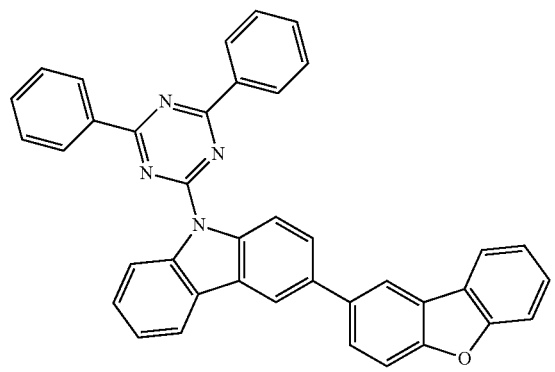
144A
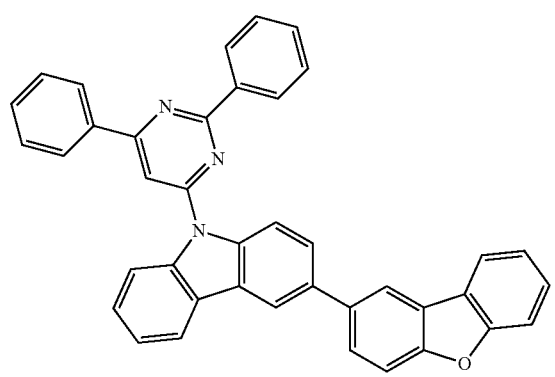
-continued
145A
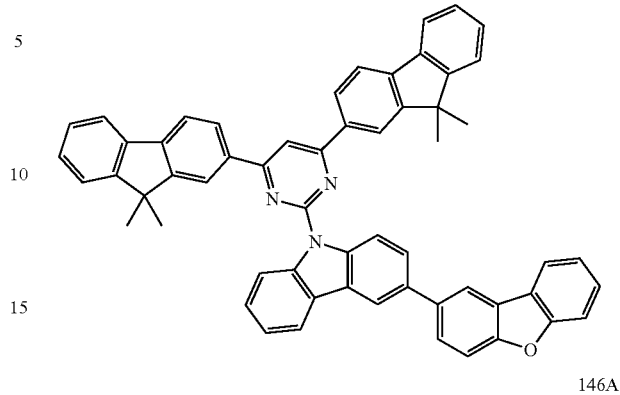
146A
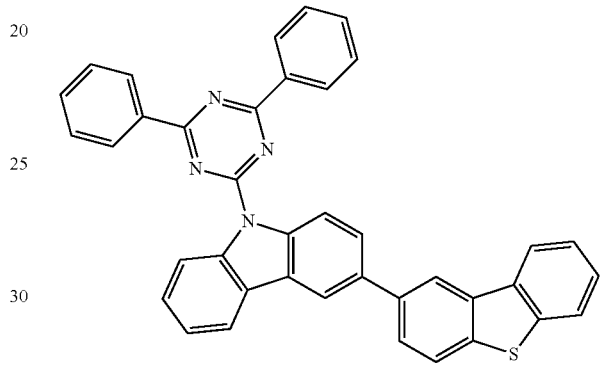
147A
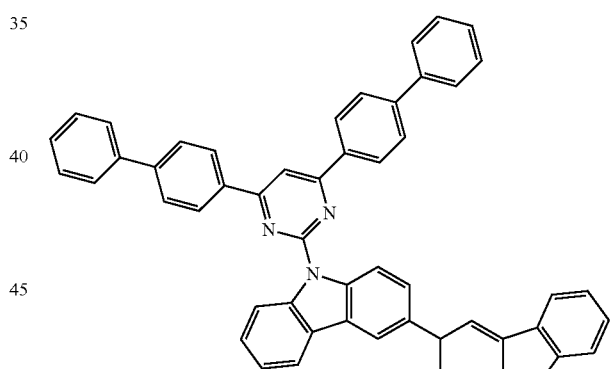
148A
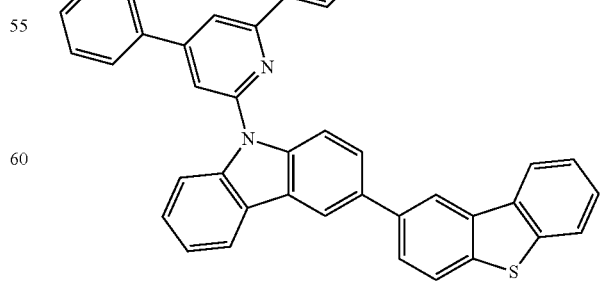

-continued
149A
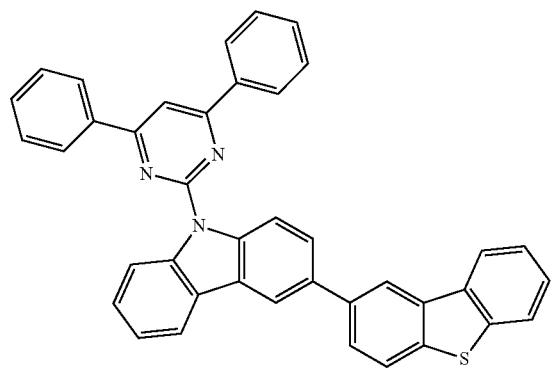
150A
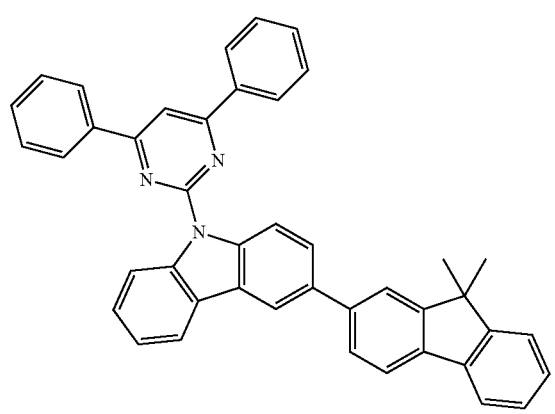
151A
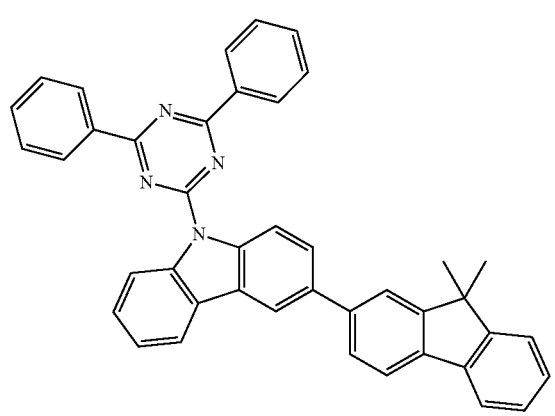
-continued
152A
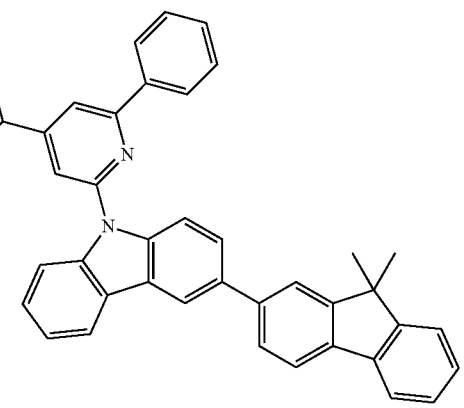
153A
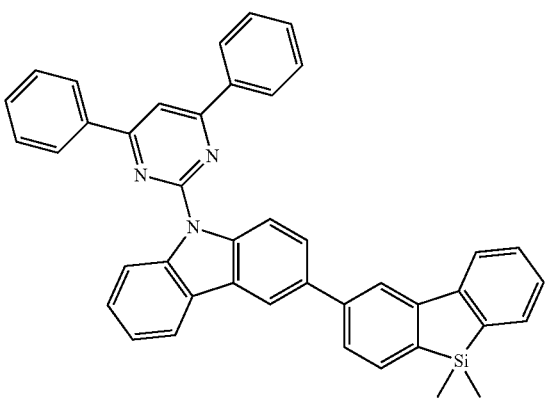
154A 155A
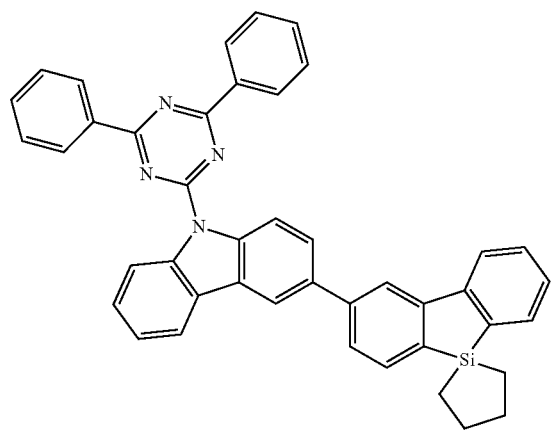
156A
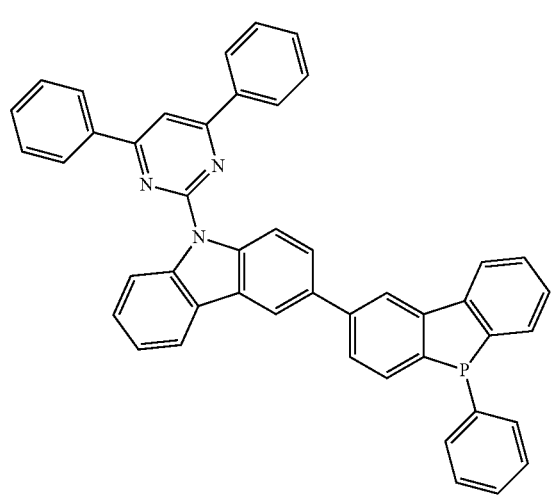
157A
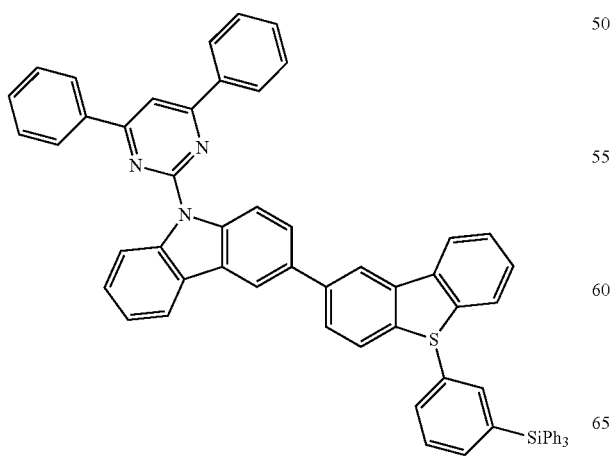
158A
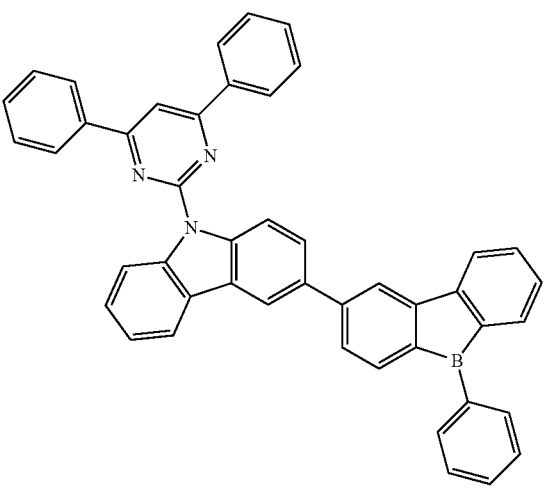
159A
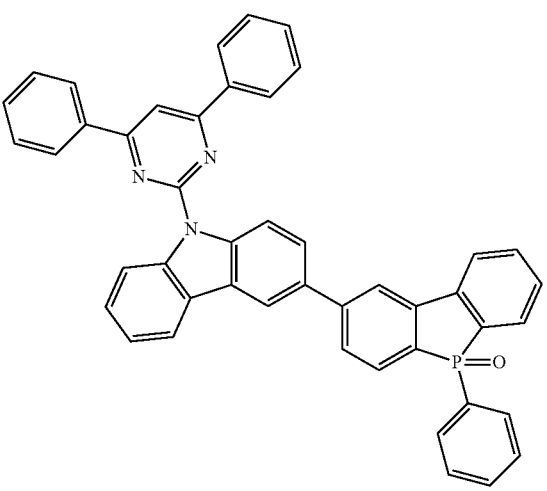
160A
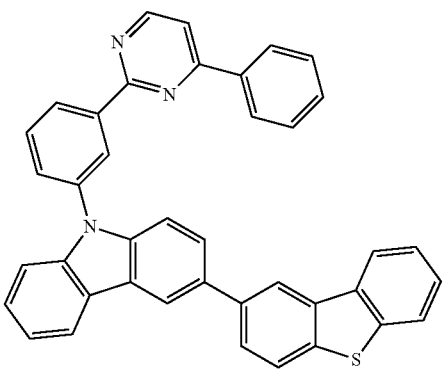

193
-continued
112
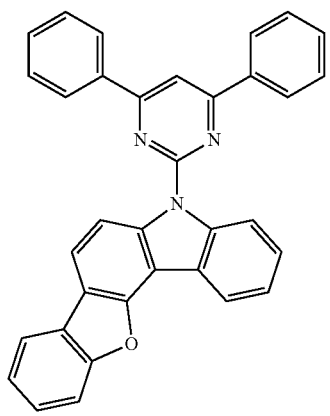
113
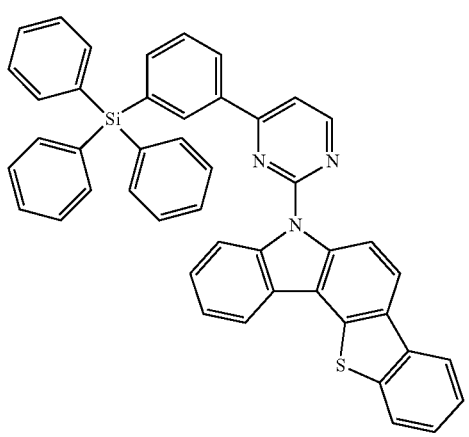
119
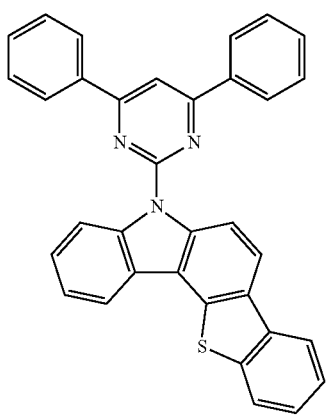
194
-continued
122
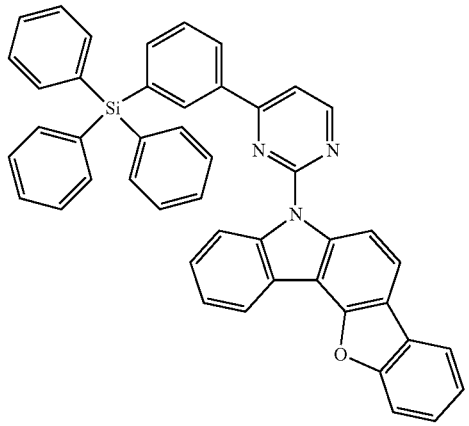
123
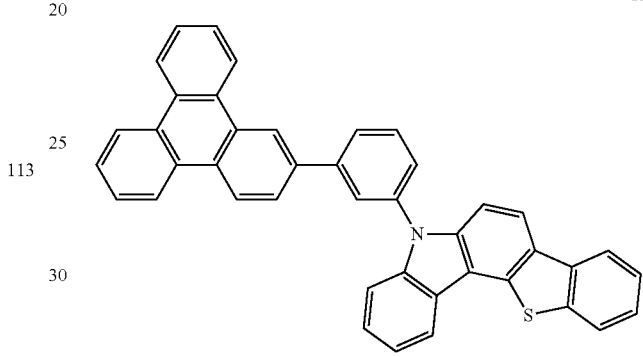
124
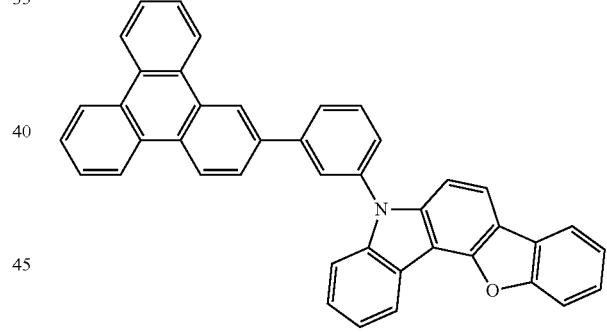
125
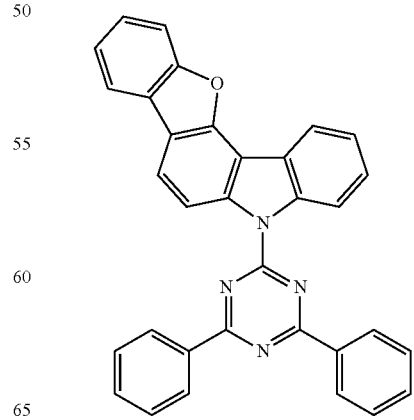

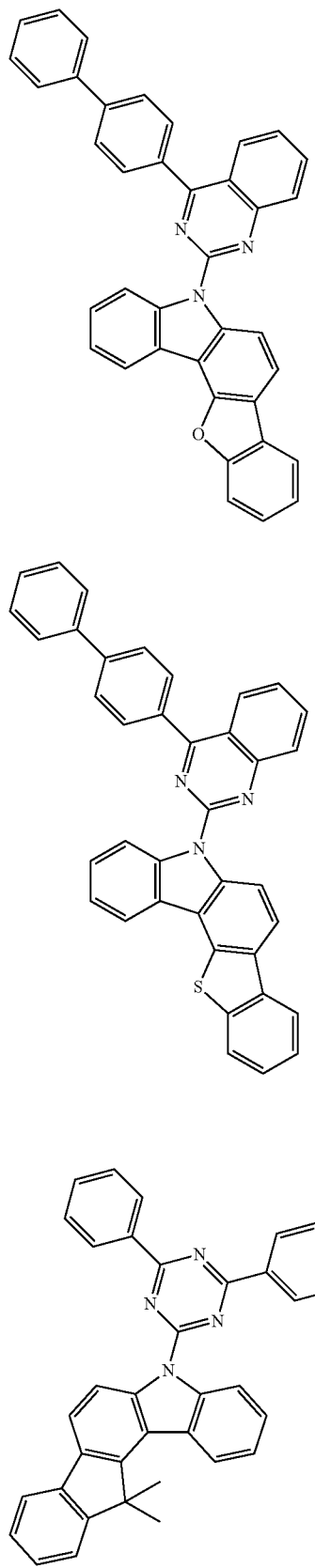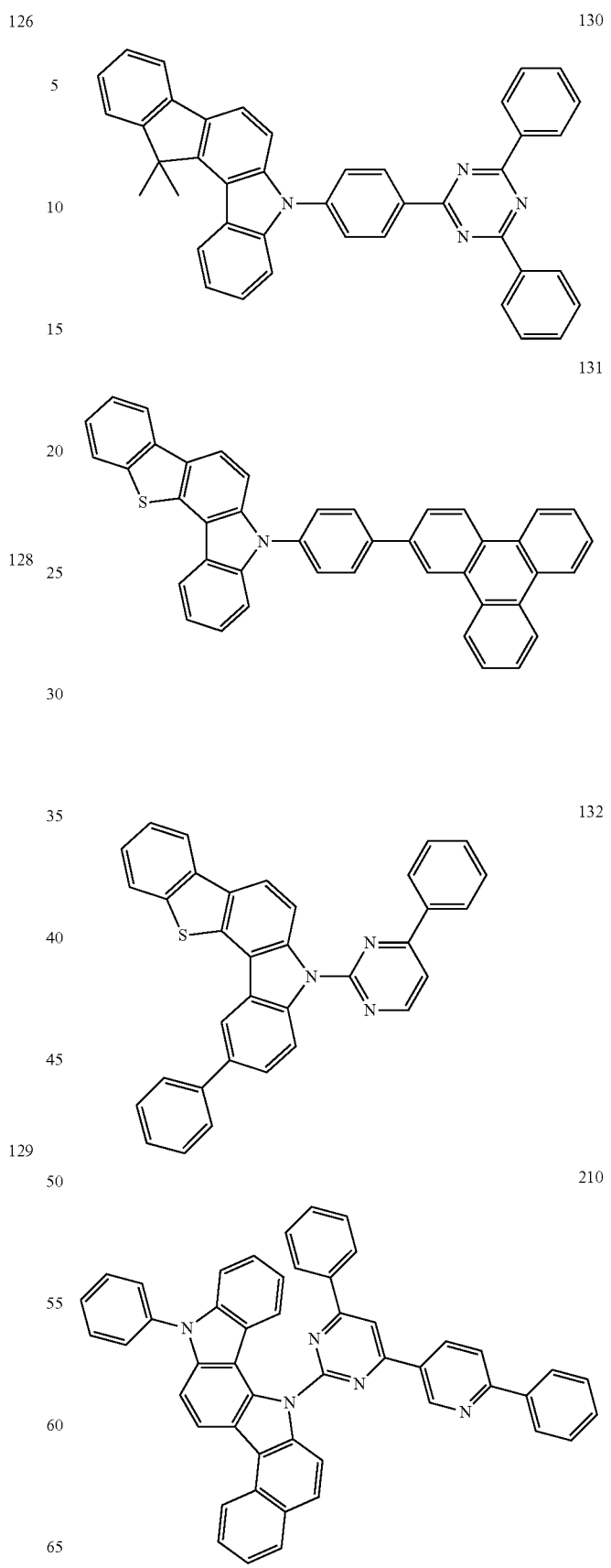

211
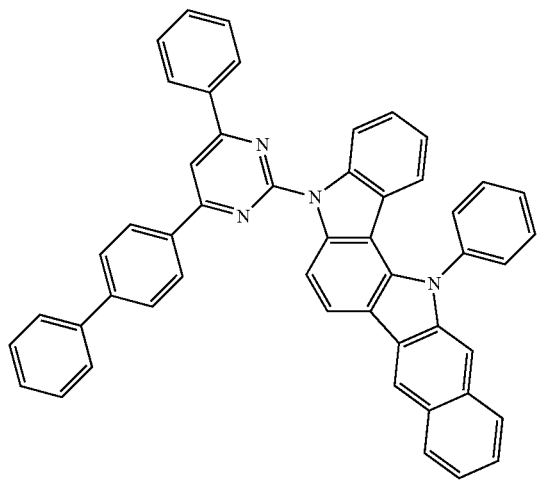
212
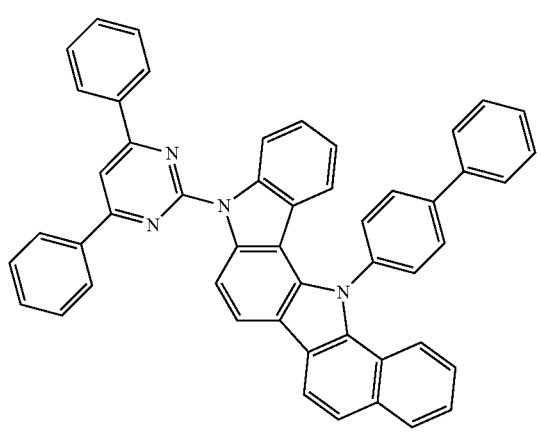
213
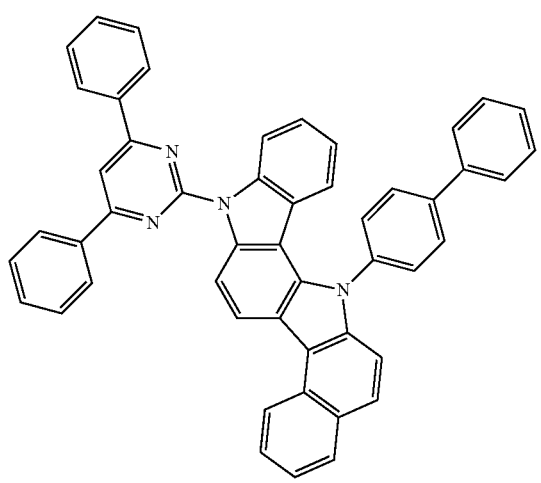
214
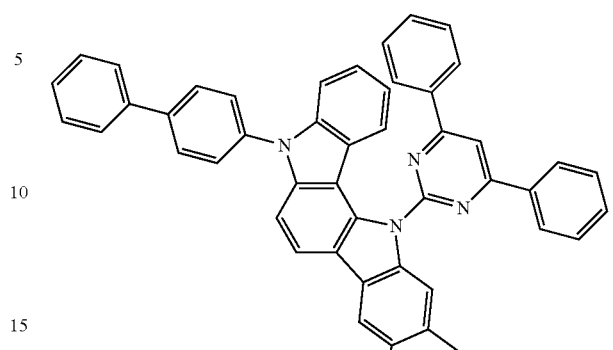
215
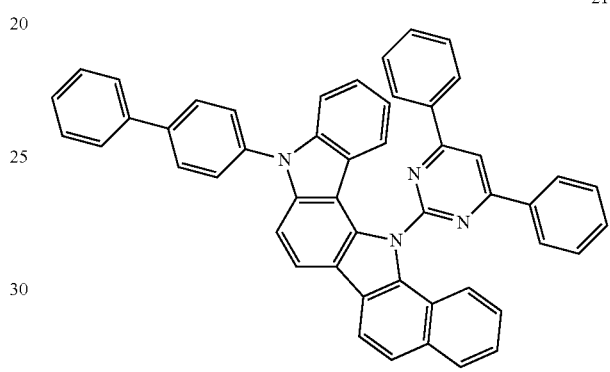
219
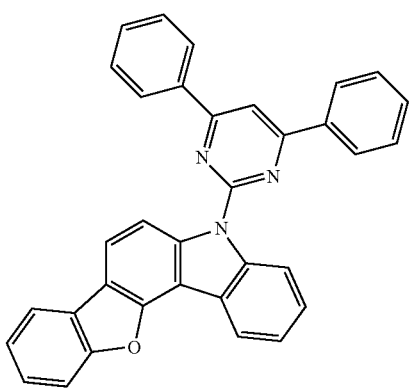
220
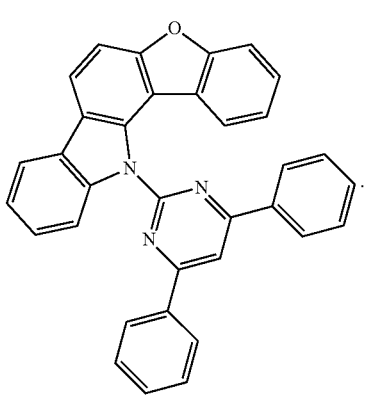
* * * * *